United States Patent [19]

Dries et al.

[11] Patent Number: 5,986,670

[45] Date of Patent: Nov. 16, 1999

[54] METHOD AND APPARATUS FOR PRODUCING A COMPUTER GENERATED DISPLAY THAT PERMITS VISUALIZATION OF CHANGES TO THE INTERIOR OR EXTERIOR OF A BUILDING STRUCTURE SHOWN IN ITS ACTUAL ENVIRONMENT

[76] Inventors: Roberta L. Dries, 4912 N. Sherwood Dr., Kansas City, Mo. 64119; Ricardo Salas, 1508 NE. 85th Ter., Kansas City, Mo. 64155

[21] Appl. No.: 08/713,994

[22] Filed: Sep. 13, 1996

[51] Int. Cl.⁶ .................................................. G06T 11/00
[52] U.S. Cl. .................................................... 345/435
[58] Field of Search ................................. 395/133–135, 395/138, 139, 123, 326, 333, 349–351; 345/433–435, 438, 439, 423, 326, 333, 349–351

[56] References Cited

U.S. PATENT DOCUMENTS

| | | |
|---|---|---|
| 2,301,274 | 11/1942 | Geiser . |
| 3,683,779 | 8/1972 | Lifton . |
| 4,261,012 | 4/1981 | Maloomian . |
| 4,297,724 | 10/1981 | Masuda et al. . |
| 4,321,037 | 3/1982 | Miller . |
| 4,467,349 | 8/1984 | Maloomian . |
| 4,486,774 | 12/1984 | Maloomian . |
| 4,539,585 | 9/1985 | Spackova et al. . |
| 4,663,675 | 5/1987 | Jones, Jr. et al. . |
| 4,730,260 | 3/1988 | Mori et al. . |
| 4,731,743 | 3/1988 | Blancato . |
| 4,823,285 | 4/1989 | Blancato . |
| 4,910,661 | 3/1990 | Barth et al. . |
| 4,970,666 | 11/1990 | Welsh et al. ............................ 395/123 |
| 5,060,171 | 10/1991 | Steir et al. . |
| 5,280,570 | 1/1994 | Jordan . |
| 5,544,354 | 8/1996 | May et al. . |

OTHER PUBLICATIONS

Grotta et al. "Digital Imaging For Visual Artists" pp. 153, 428–439, 442–465, 494–495, 1994.

*Primary Examiner*—Almis R. Jankus
*Attorney, Agent, or Firm*—Lathrop & Gage, L.C.

[57] ABSTRACT

A computer system for producing computer generated displays, including window-format displays permitting visualization of changes to a building or structure in an actual environment. The system provides a background display of digital images originating from either an image capture device or from other sources to which changes are to be made for visualization purposes; a product catalog in the form of a database of objects, together with features in the computer system operable to record and store digital images of the objects as well as detailed information related to the objects within the database; and a mechanism to copy and removably place the object over the background.

30 Claims, 59 Drawing Sheets

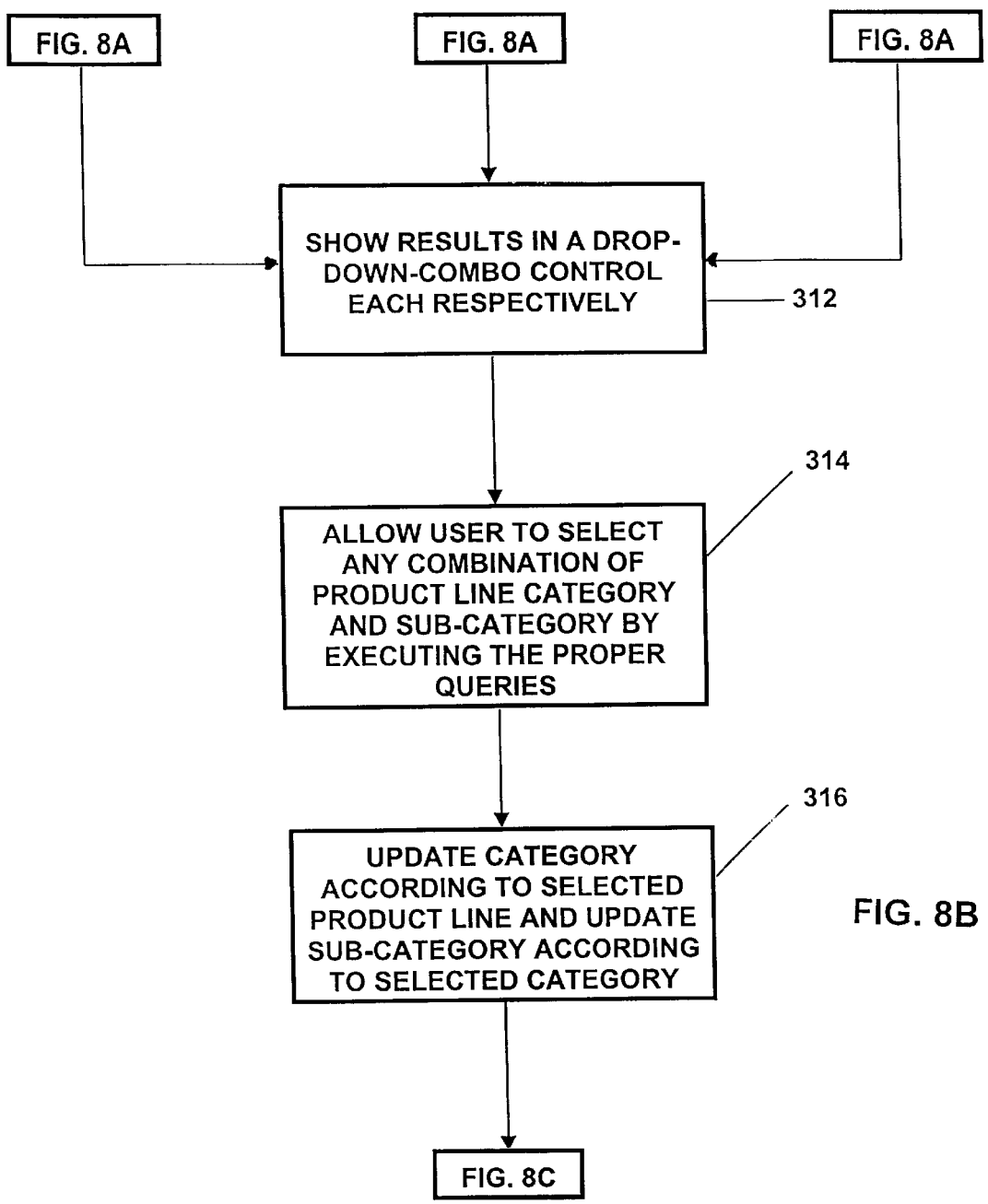

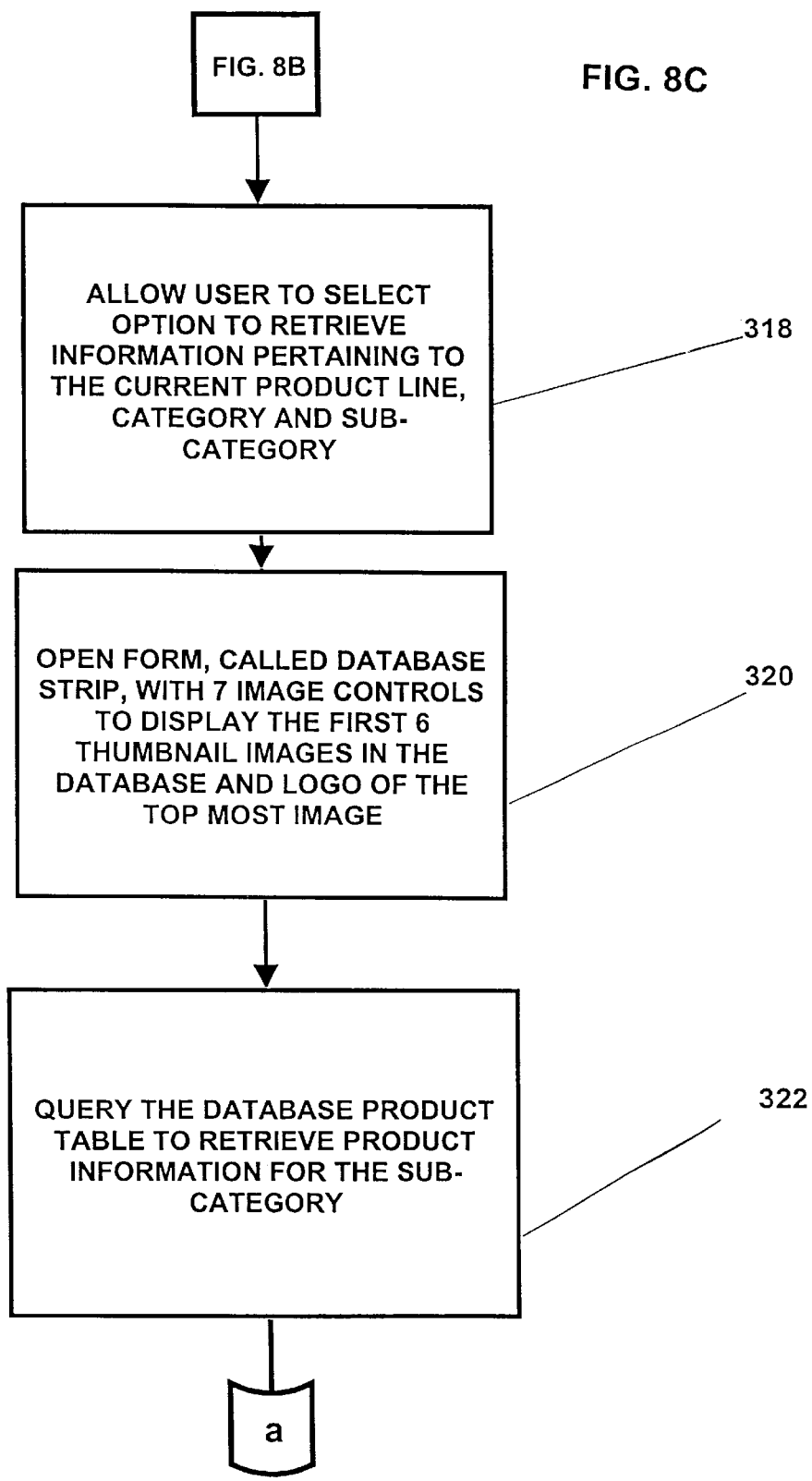

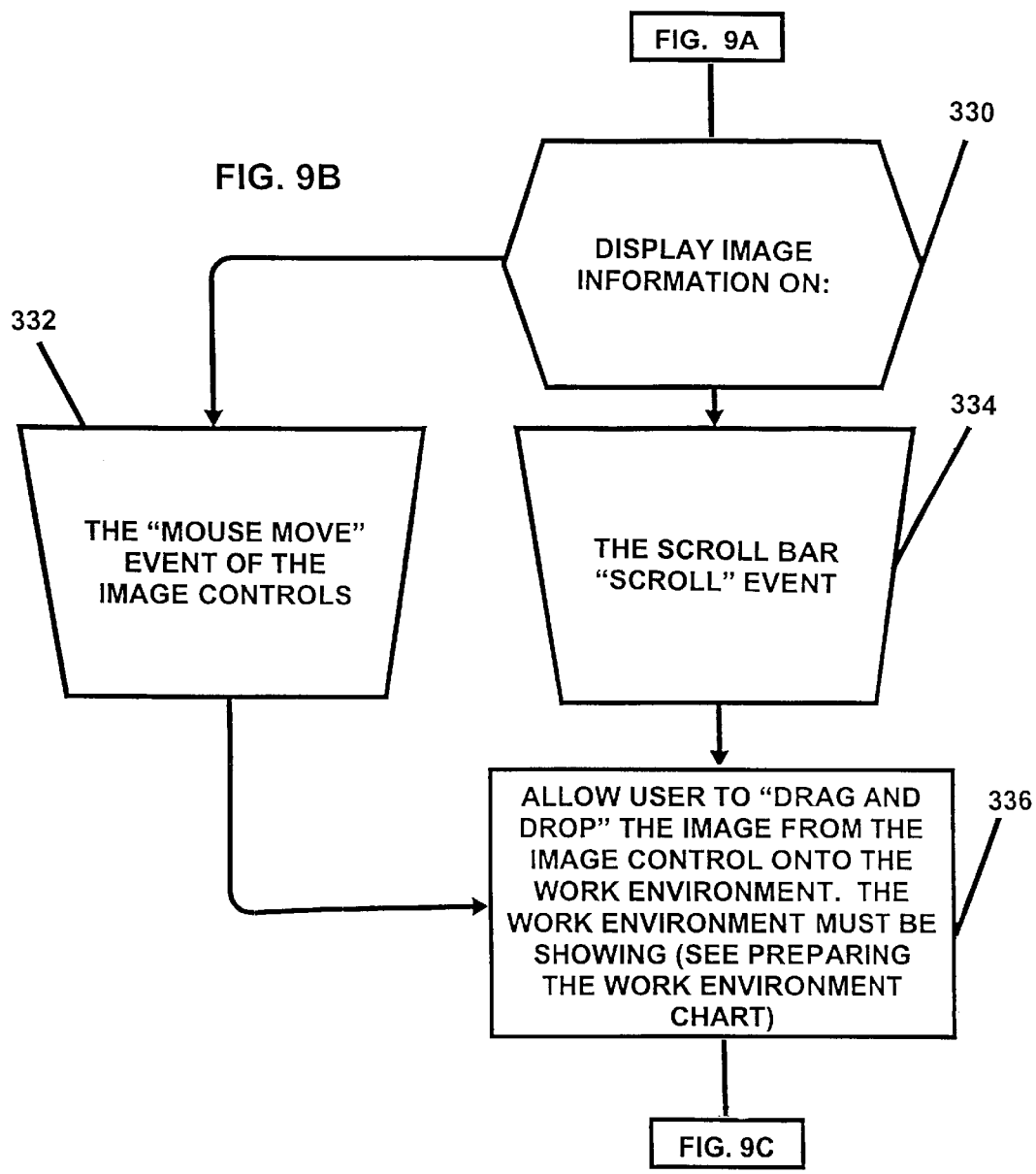

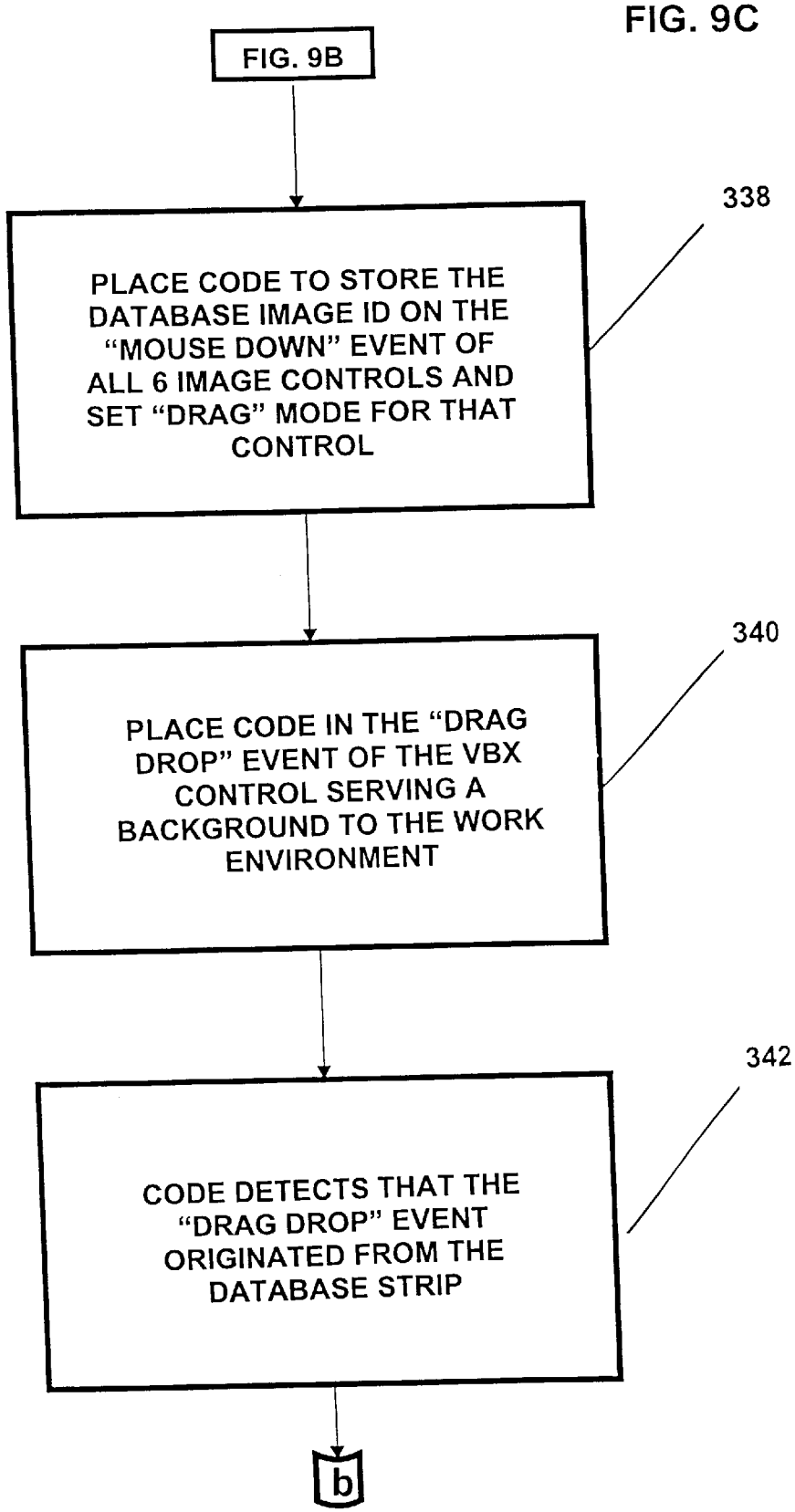

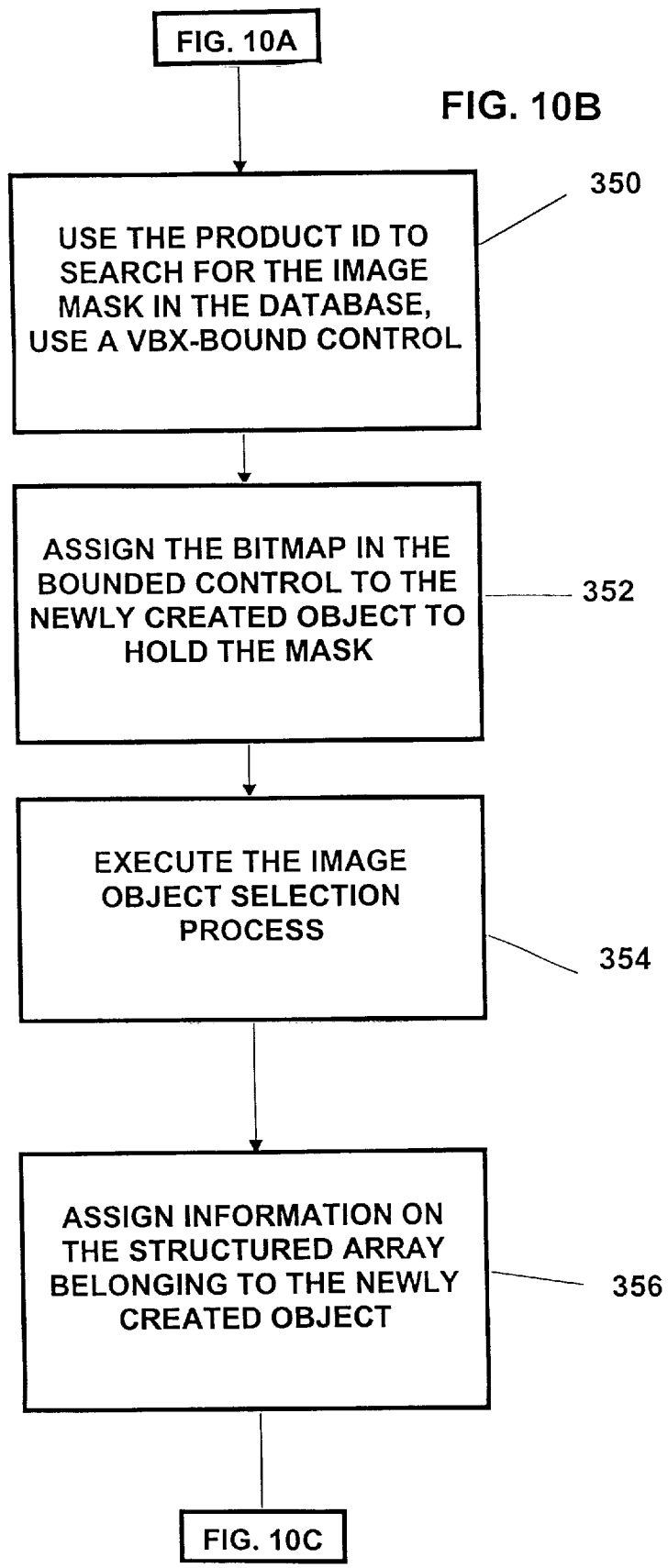

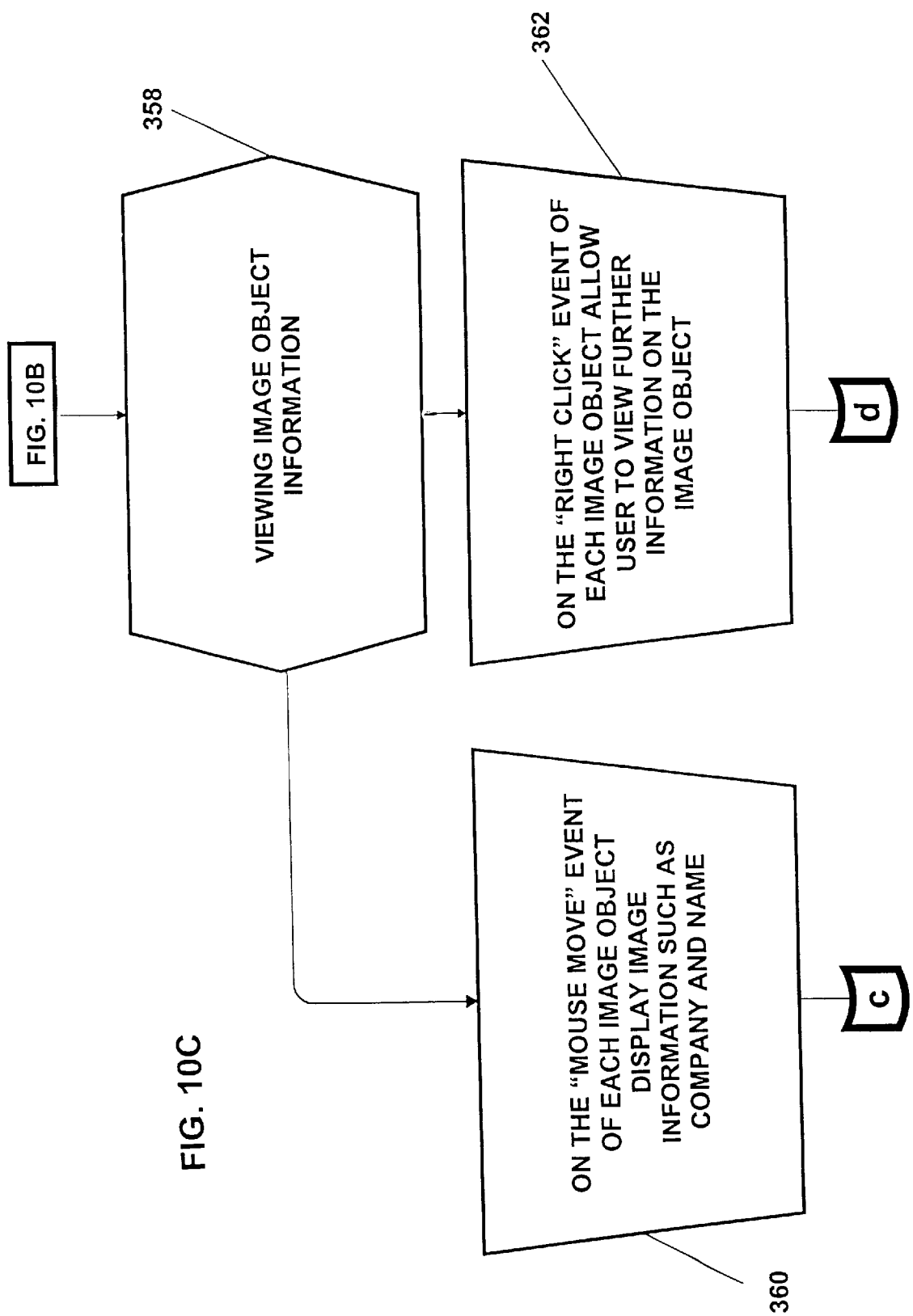

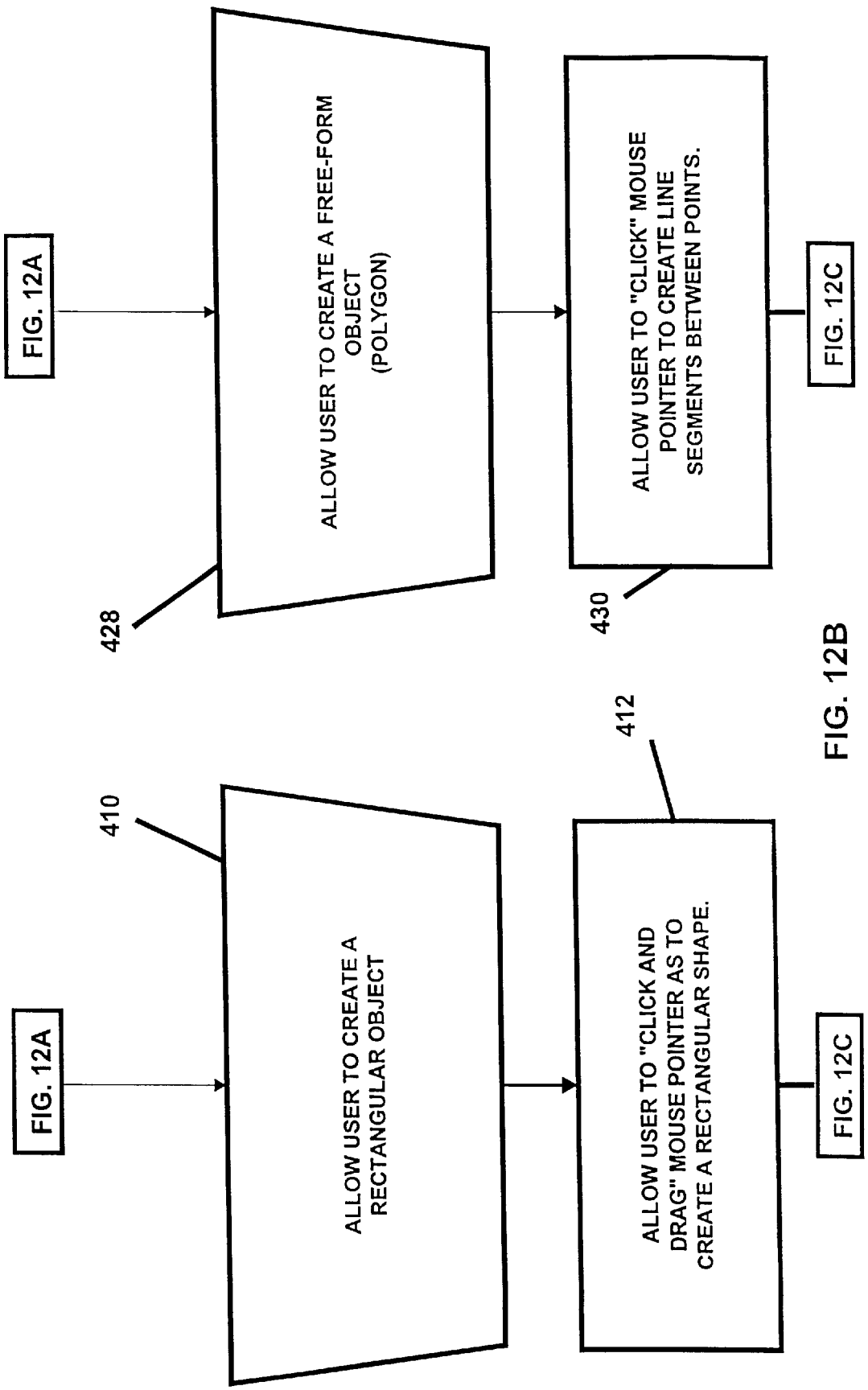

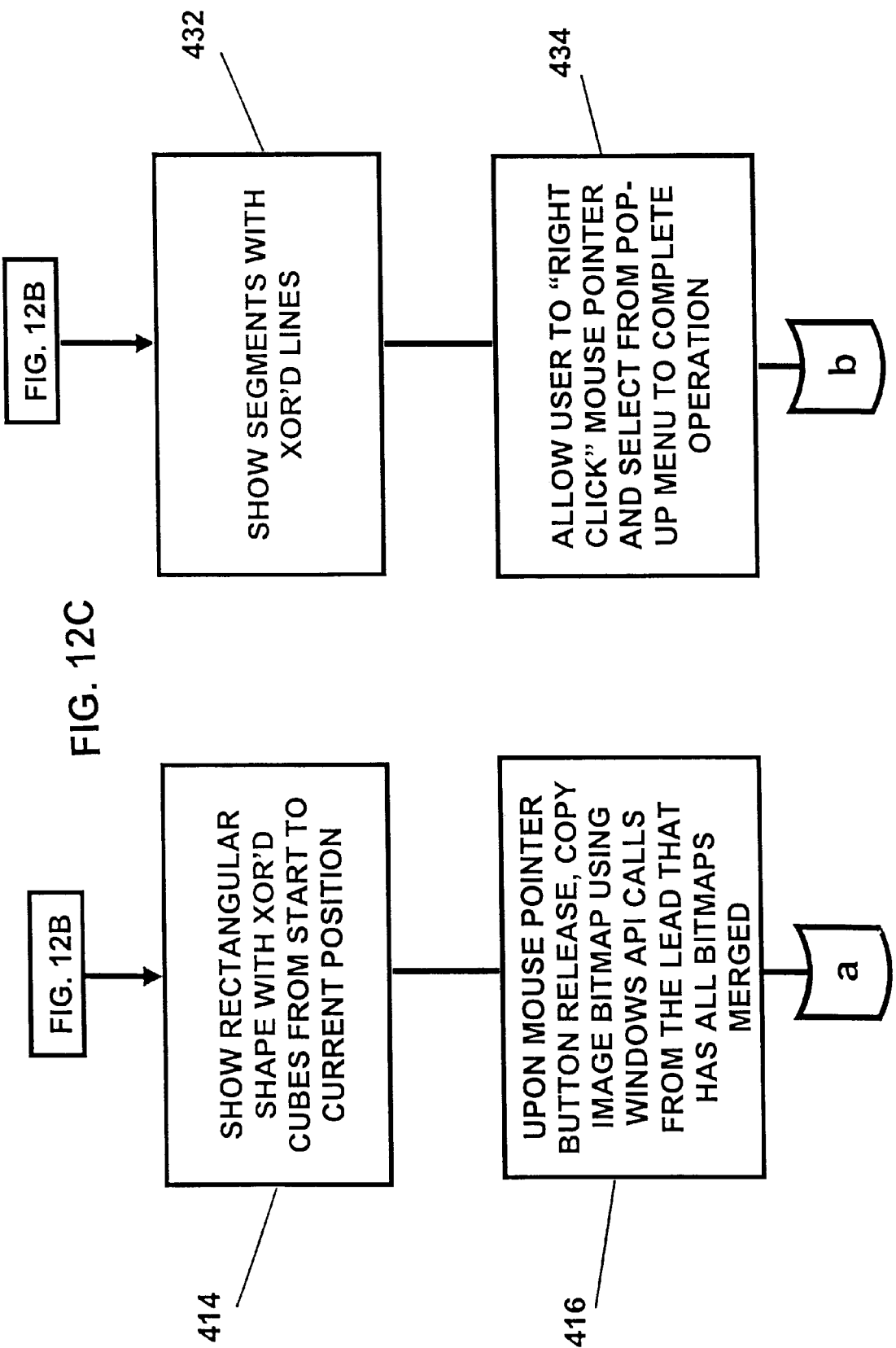

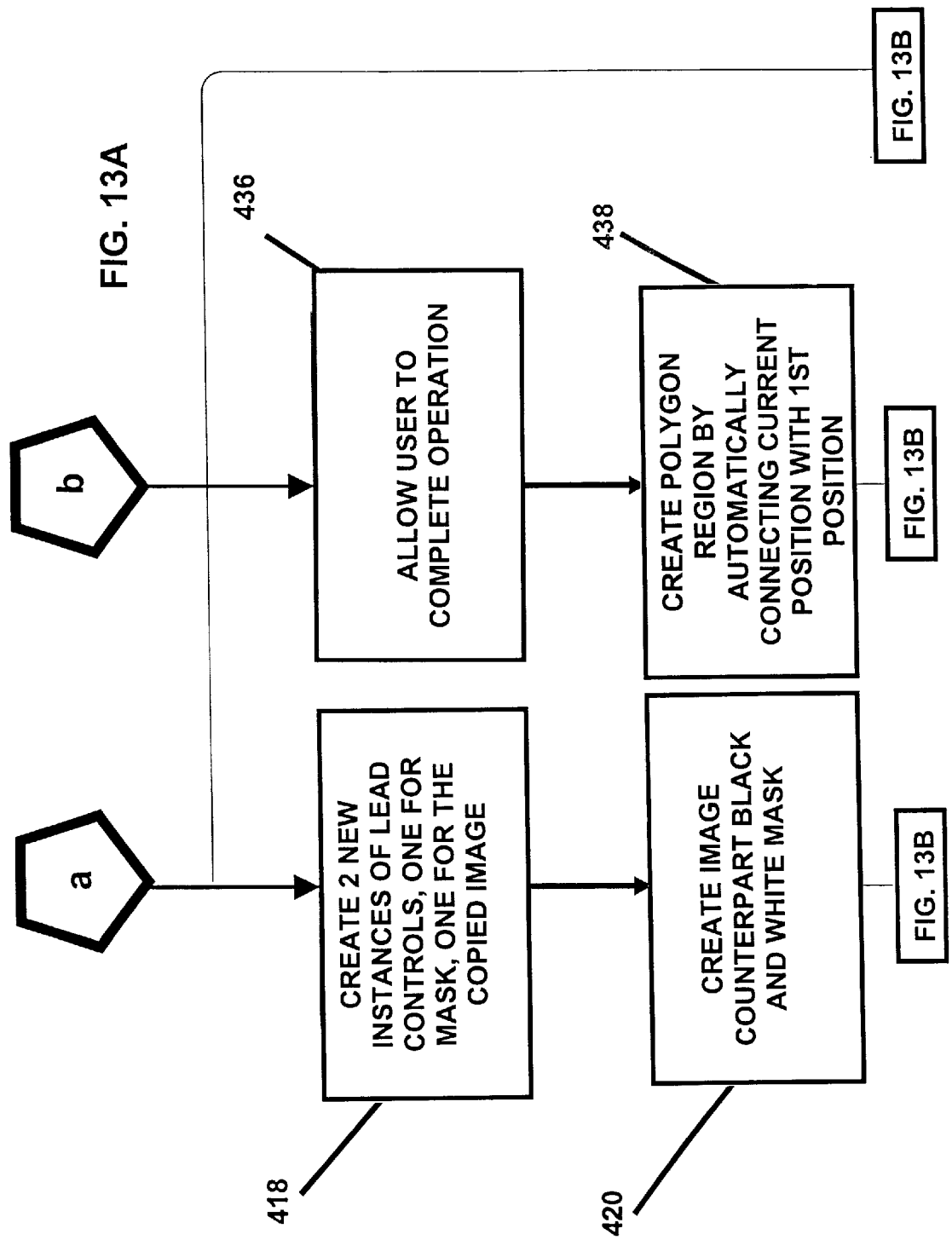

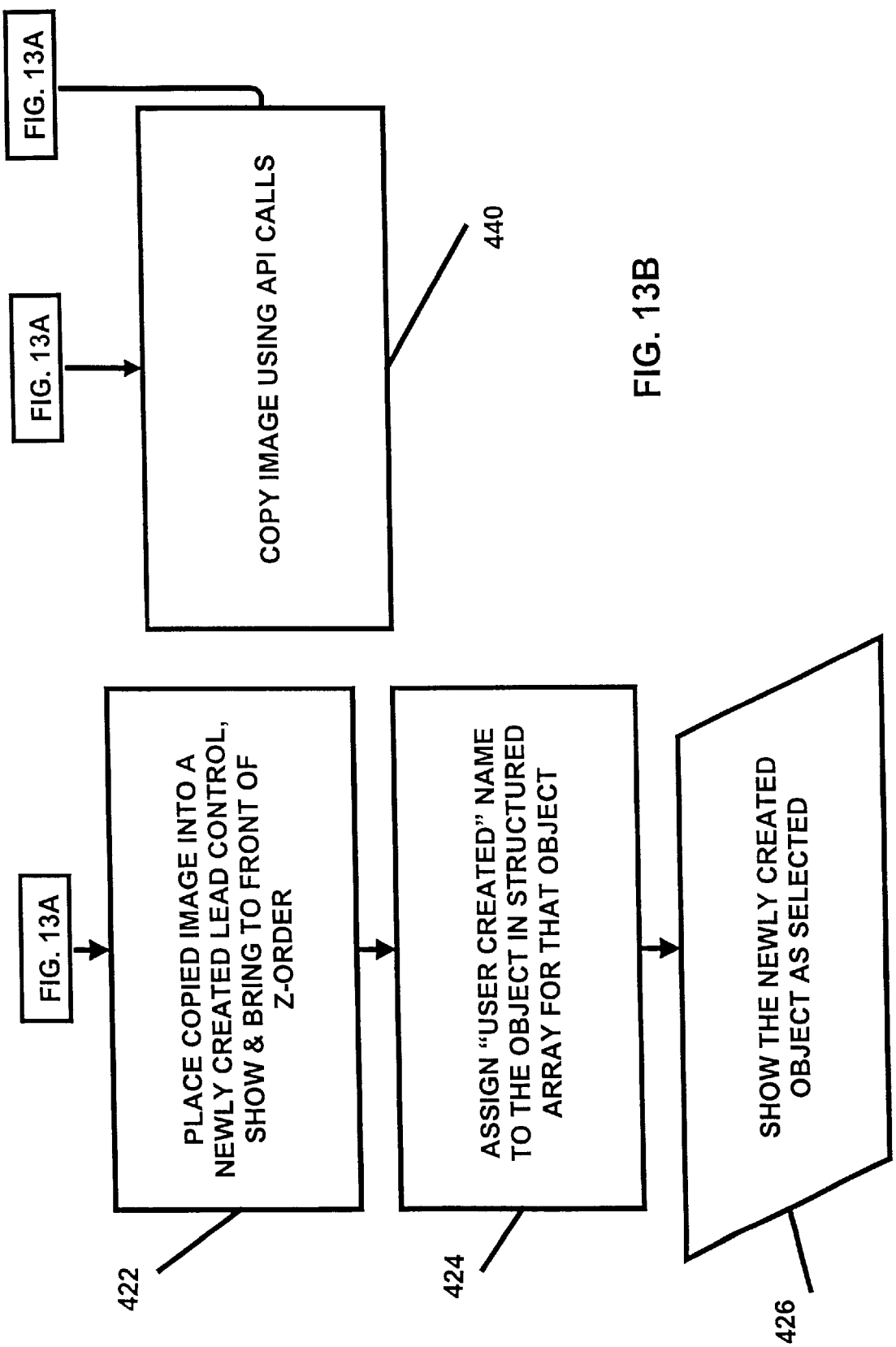

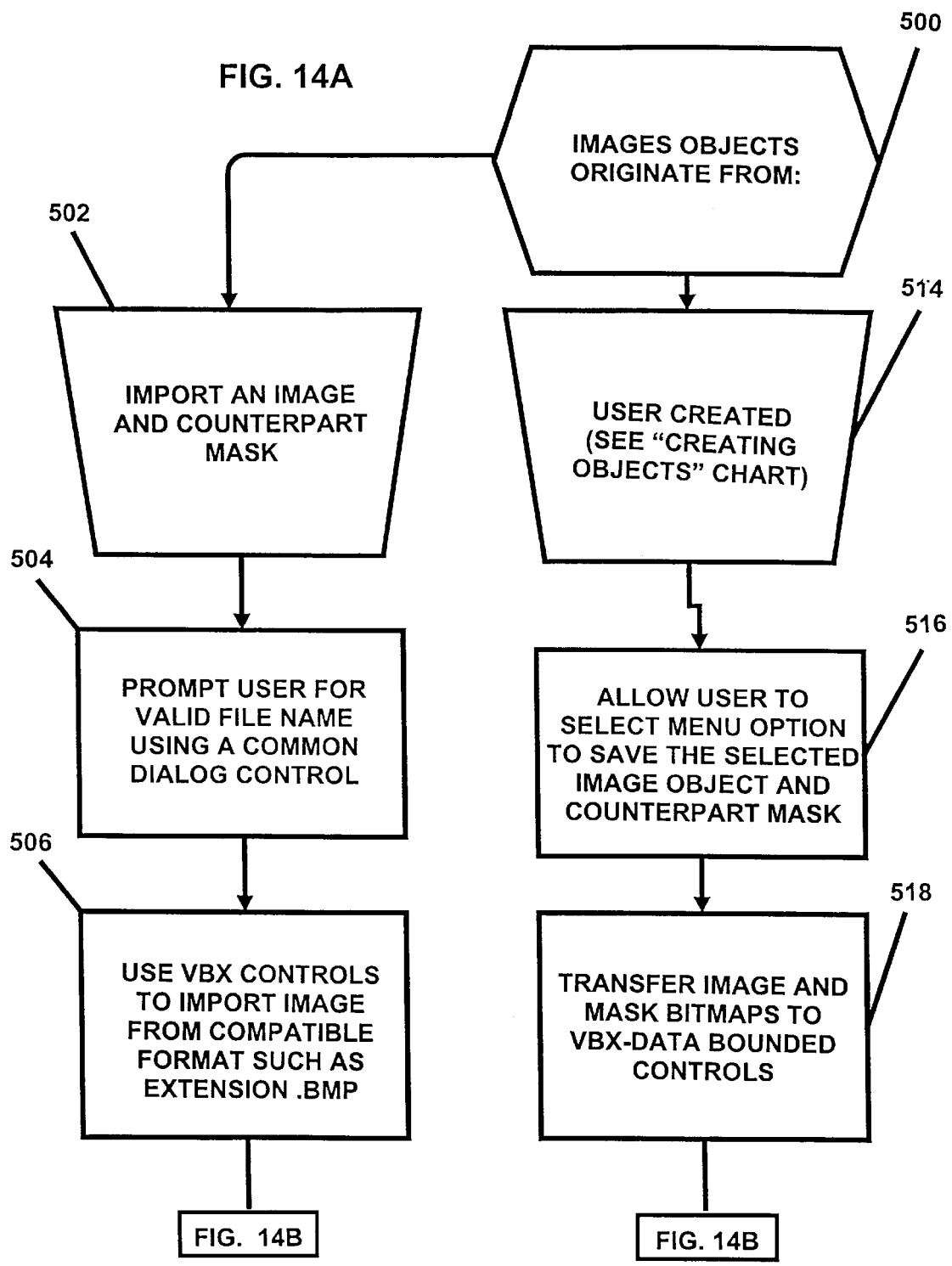

508
ALLOW USER TO ENTER TEXTUAL INFORMATION ON SCREEN RELEVANT TO THAT IMAGE OBJECT

FIG. 14B

510
USE VBX-DATA BOUND CONTROLS TO UPDATE TO A MICROSOFT ACCESS DATABASE

512
USE DATA CONTROLS TO UPDATE THE TEXTUAL INFORMATION ON THE SAME RECORD WHERE THE IMAGE AND MASK RESIDE

FIG. 37

METHOD AND APPARATUS FOR PRODUCING A COMPUTER GENERATED DISPLAY THAT PERMITS VISUALIZATION OF CHANGES TO THE INTERIOR OR EXTERIOR OF A BUILDING STRUCTURE SHOWN IN ITS ACTUAL ENVIRONMENT

1. BACKGROUND OF THE INVENTION

1.1. Field of the Invention

The invention generally relates to digital image processing, more particularly, the invention relates to a method and apparatus for producing a computer generated display that permits visualization of changes to the exterior or interior of any building structures.

1.2. Problems in the Art

Product catalogs have existed for years in printed form allowing customers to browse through illustrations, photographs and information about the products listed in the catalog. With the advent of computers, there have been product catalogs created in the digital media. Some of these digital catalogs have combined photographic and video images with audio in order to present the products being sold and provide information about those products. However, by and large, these product catalogs created in the digital media have retained the static look and feel of their predecessors in the print media. These digital catalog programs are not known to allow the user to manipulate, experiment and apply the catalog products in a dynamic fashion to create a realistic photographic rendering of the products in actual use, with pertinent information about the product staying bundled with the digitized image of the product as it is manipulated or moved over a fixed composition background.

Computer aided design ("CAD") programs also are known in the art. These programs allow for the design of proposed projects and structures, as well as the creation of three-dimensional models of those structures. However, traditional CAD programs do not allow a user to utilize a digitized photographic image of the user's actual home, yard or interior room as a fixed composition background against which it is possible to manipulate digitized photographic images of building, home improvement and landscaping products from real manufacturers to create a realistic photographic rendering of the products in actual use.

Various graphics and drawing programs are also known in the art. Programs such as Corel Draw, Adobe Photoshop and similar programs allow users to "cut and paste" images onto a composite background image and to fill a particular area with a pattern. Some of these graphics and drawing programs also allow the pasted images to remain as objects over the composite background image. Programs have been proposed which allow a user to preview a few selected images of certain home improvement products against a predefined digitized background image of an interior room or other portion of a house that is not that of the user. U.S. Patent No. 4,970,666, to Welsh, et al., teaches a system for producing video images which depict the appearance of a simulated structure in a video-derived image of the actual environment. The system disclosed in the '666 patent does not, however, provide for access to information about the image elements from a database by means of linking the information with the images of the products as they are manipulated or moved over the background image of the actual environment. Further, the '666 patent does not provide for access to information related to the image elements placed over or merged with a background by means of an interface associated with a computer generated screen display. Yet further, the system in the '666 patent lacks the ability to manipulate image objects (e.g., object resizing, distorting, edge smoothing, etc.) of actual products (in the form of digital images) over the background image.

Graphics or drawing programs are not known to allow a user to manipulate digitized photographic object images from a database of building, home improvement and landscaping products from real manufacturers and other venders. Further, such programs are not known to be operable to place digital images of objects over a digitized photographic image of the user's actual home, yard or interior room as a fixed composition background so as to create a realistic photographic rendering of how the products would look in actual use, while at the same time allowing unique information about each product from the database to stay bundled or linked with the product images being manipulated.

1.3. Objects, Features, and Advantages of the Invention

Therefore, a primary advantage of the present invention is the provision of an apparatus and method for producing a computer generated display that permits on-line visualization of changes to the interior or exterior of a building structure which improves over the problems and deficiencies, and which satisfies a long felt need, in the art.

Further exemplary objects, features, and advantages of the present invention include the provision of an apparatus and method of producing computer generated displays which:

1. permits the system user to visualize how various actual products would look when applied to a fixed digital photographic image of the interior or exterior of a real home or other building.

2. permits the system user to input the fixed digital photographic image of the interior or exterior of a real home or other building through a plurality of image capture and transfer means.

3. provides the system user with access to thousands of images of interior and exterior home products from actual manufacturers, as well as landscaping and horticultural products, in a huge interactive CD-ROM database.

4. provides the system user with pertinent information about all of the products in the CD-ROM database.

5. provides the system user with easy access to the pertinent information about any product in the CD-ROM database through a simple click of the mouse, by creating a "link" from the image of the product to the information about that product stored in the CD-ROM database.

6. allows the system user to select a specific area of the fixed background image of the interior or exterior of a home or other building and to visualize changes to only that specific area by dragging or otherwise placing image objects of products in the CD-ROM database over that specific area chosen.

7. allows the system user to arrange, rotate, position, resize, orient and otherwise manipulate the product image objects that are placed on the fixed background image to create a realistic composite image.

8. allows the system user to save the composite image created with all image objects in place, and to later reopen that saved file with all image objects remaining active and manipulatable.

9. allows the system user to generate a list of all products and other materials in a composite image, which list may be printed, saved as a text file and exported to estimator software applications.

10. permits the system user to erase any part of an image object, thereby making a "hole" in the object, allowing the system user to see the fixed background image beneath.

11. permits the system user to make the composite image more realistic by adding shadowing, making the image look more or less sunny, "night lighting" and changing the scenery behind the main object in the composite image.

12. permits the system user to resize a selected image object so that it will fit exactly into a selected rectangular area, or alternatively, so that it will fit proportionally into a selected rectangular area and such a feature permits the system user to resize the rectangular image or an irregular shaped image.

These and other objects, features, and advantages of the present invention will become apparent with reference to the accompanying specification and claims.

2. SUMMARY OF THE INVENTION

The present invention includes a computer system for producing computer generated displays, including window-format displays, that permit visualization of changes to a building or structure, particularly to the exterior and interior of a residential home, in an actual environment. The system provides a background display of digital images, originating from either an image capture device or from other sources, to which changes are to be made for visualization purposes. The image capture device may be a digital camera, a video camera, a scanner, or the like. The system further provides a product catalog in the form of a database of objects, together with features in the computer system operable to record and store digital images of the objects as well as detailed information related to the objects within the database. The computer system provides a means to access the information related to the objects through a display interface, and in the preferred embodiment in the form of a windows-pull down interface or in the form of a moveable mouse-click function. The system further provides means for copying and moving an object selected from the catalog and such means is operable to removably place the object over the background to permit realistic visualization of the object on the background. The realistic visualization is facilitated by means of a number of tools associated with the system that permit resizing of objects, fitting objects into user designated areas, perspective orientation, and other tools useful by the system user to obtain this objective.

The means to access the object data is operably connected with the object database and the means for copying and moving the object so that after an object is placed over the background in the display the data information access means is operable by the system user through the display interface to retrieve desired information about the object from the database.

In one embodiment of the invention, the creation of a background, and the placement of a desired object in the form of a digital image over the background is performed within a "windows" operating environment, which provides numerous tools and associated features in a user-friendly presentation in the form of tool bars appearing in the computer generated display operable by means of a mouse-click functionality.

In a broader aspect of the invention, the inventive apparatus and method can be used to visualize changes to anything that can be digitally recreated and upon which objects can be digitally super imposed for visualizing changes in the appearance.

The method utilizing the inventive system results in the elimination of time-consuming operations otherwise previously associated with the manipulation and modification of digital images placed over a background display.

3. BRIEF DESCRIPTION OF THE DRAWINGS

FIGS. 12–13 are flowcharts illustrating the process by which digital images of objects are created and selected.

FIG. 14 is a flowchart illustrating the process by which digital images of objects are created.

FIGS. 18–48 are screen displays generated by the preferred embodiment of the invention in the Examples.

4. DETAILED DESCRIPTION OF THE PREFERRED EMBODIMENT(S)

4.1. Overview

Figure 1:
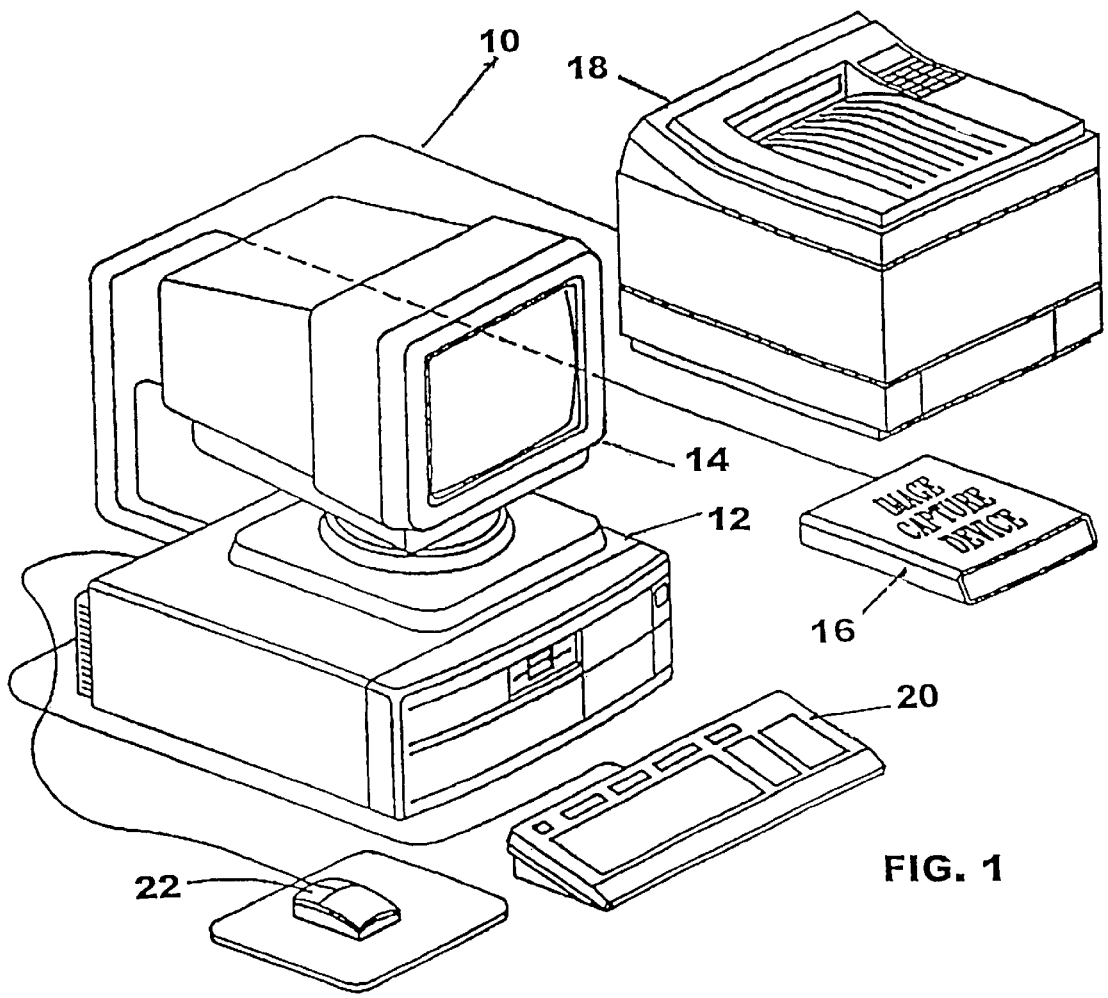
FIG. 1 is a schematic of the host computer and peripherals associated with the invention.
Figure 2:
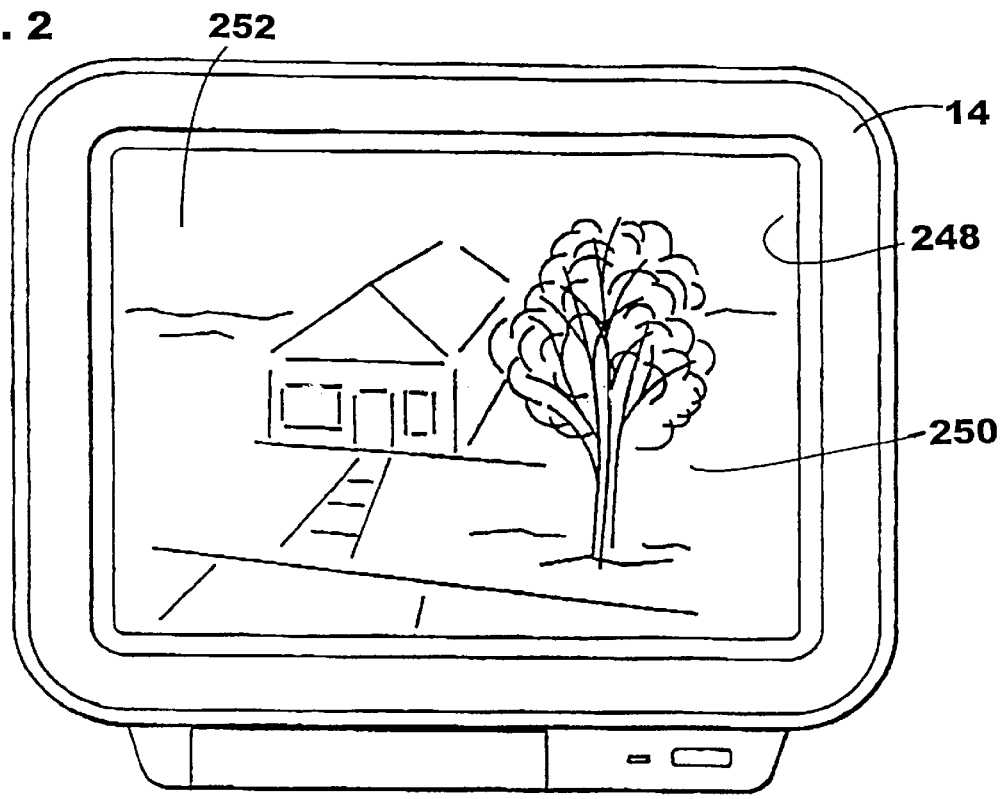
FIG. 2 is a schematic of screen display showing a background.

To achieve a better understanding of the invention, a preferred embodiment will now be described in detail. Frequent reference will be taken to the drawings which have been identified immediately above.

Reference numerals will be used to identify certain parts and locations in the drawings. The same reference numerals will be used to identify the same parts and locations throughout the drawings unless otherwise stated.

The preferred embodiment will be discussed in the context of a residential home remodeling project. In this example, a display of the home, in this case the home exterior, appears in a computer generated display in the form of a digital image. The home featured in the digital image may be placed in a construction environment or may be placed within a typical yard landscape environment. The system disclosed below allows a system user to move objects from a database, for example a door, and place the object over the background, and with manipulation tools merge the object into the appropriate location in the background, to permit visualization of a change to the background. It is to be understood, however, that the invention is useful to visualize changes to other types of backgrounds, including backgrounds in which no building structure appears.

Furthermore, the preferred embodiment will be discussed in the context of a computer program operated by a system user on a mini-computer. It is to be understood that the invention may be practiced on any host computer that is operable to perform the functions described below.

4.2. The Apparatus

Turning now to the drawing figures, FIG. 1 illustrates the preferred apparatus 10 of the present invention. The following description of the apparatus 10 is provided for disclosing a preferred embodiment and best mode of the invention. Those skilled in the art will appreciate the preferred components of the visualization apparatus 10 may be replaced with equivalent components without parting from the scope of the present invention.

The visualization apparatus 10 broadly includes a host computer 12, one or more monitors 14 coupled to the host computer 12, an image capture means in the form of an image capture device 16, coupled host computer 12, one or more printers 18, coupled to host computer 12, one or more information input devices in the form of keyboards 20, also coupled to host computer 12 and a mouse 22.

In more detail, the host computer 12 is provided for receiving, storing, processing and generating information relating to displays useful to visualize changes to buildings, or any other structure in the actual environment. Host computer 12 may be any type of mini-computer, micro-computer or mainframe, but is preferably a 486 or faster CPU with at least a 50 Mb hard disk space, CD-ROM drive, 8 MB RAM or greater, Win95:12 MB or more, Windows for Workgroups 3.11 or Windows 95. By way of example, host computer 12 may be of the type available from Micron Computer Inc., 900 East Karcher Road, Nampa, Id. 83687 (Micron Model No. P133 PCI-Penti Tower Computer, 133 MHz, CD, 1.6 Gb hard drive, 16 Mb Ram 1.44 Mb Floppy drive). Those skilled in the art will appreciate that the host computer 12 may be any type of computer including a mini-computer, micro-computer or mainframe.

The image capture device 16 coupled with host computer 12 may be any conventional image capture device that is operable to capture and generate a digital image of an environment that is intended for digital recording. Image capture device 16 may include a scanner (such as flat bed or hand held scanners available from Umax Data Systems, Inc. No. 1.1, RND Road, Science Based Industrial Park, Hsinchu, Taiwan, R.O.C. (Umax Vista—S6); and Altima International, 3358 Gateway Blvd., Fremont, Calif. 94538 (Model ViewScan/A 2000 D, 24 Bit True Color, 1600 D pi)), a digital camera (available from Apple Computer, Inc. 20525 Mariani Ave., Cupertino, Calif. 95014 (Apple Quick Take 100 Digital Camera for Windows: Takes 32 320×240 pixel images or 8-640×480 pixel images)); conventional video cameras having a frame grabber type video interface (such as that available from Play Incorporated, Video Capture, 2890 Kilgora Road, Rancho Cordova, Calif. 95670 (Model Name "Snappy"; single frame video digitizer captures images in 16.8 million colors at resolutions up to 1500× 1125)) operably coupled to the video camera. Image capture device 16 may be provided in the form of hardware or software (including a database) capable of supplying an input to host computer 12 which can be used to generate a digital image. Image capture device 16 may also include hardware for receiving information transmitted via satellite or other telecommunication networks.

File formats that are supportable by host computer 12 to achieve its various objectives may include:

Monitor 14 provides a computer generated display useful to visualize changes to building structures in the environment. Monitor 14 is of conventional design such as that available from Micron Computer Inc., 900 East Karcher, Nampa, Id. 88367 (Micron Model No. 15FGx, 15 inch super VGA compatible).

Printer 18 is a conventional printer also coupled to the host computer and is of conventional design such as that available from Canon Computer Systems, Inc., 2995 Redhill Ave., Costa Mesa, Calif. 92626 (Canon Model BJC-610; near photographic output at 720×720 Dpi in color or black).

Keypad 20 is coupled to host computer 12 and is of conventional design such as that available from NMB Technologies, Inc., Chatsworth, Calif. (NMB Model No. RT 6656 TW). Keypad 20 provides a means to input and record data and operate apparatus 10. Mouse 22 is coupled to host and is of conventional design such as that available from Microsoft Corporation, Redmond, Wash. 98052 (Mouse Port Compatible Mouse 2.0 A Part//58 269).

4.3. The Method—Overview

The method of the present invention provides a changeable computer-generated display that permits visualization of changes to an exterior or interior of a building structure in an actual environment.

The visualization method of the present invention is implemented with the aid of a computer program for operating the visualization apparatus 10 described above. The computer program is preferably written in Visual Basic 4.0 language, but may also be written in other conventional program languages. The computer program is preferably stored in the read-only memory (ROM) of the host computer 12, but may also be stored in the host computer's hard drive for run time or in an external disk, tape or other format for transfer to the memory of host computer 12. The on-line catalog database is kept in the CD-ROM.

The source code for the computer program is reproduced in the attached Appendix. The flow diagrams in the drawing figures provide a high-level overview of the computer program.

Many of the method steps described and illustrated herein require an operator to enter or scan in information concerning an actual environment or objects to be placed over or be merged with the actual environment. These scanning or entering steps can be performed at any suitable location with the appropriate components as described above, including in an office or at a construction work site. This allows the visualization of changes to an actual environment to be made by the computer system user in any location which is convenient to the user and which permits the set-up of the equipment associated with the visualization apparatus 10.

Figure 4A:
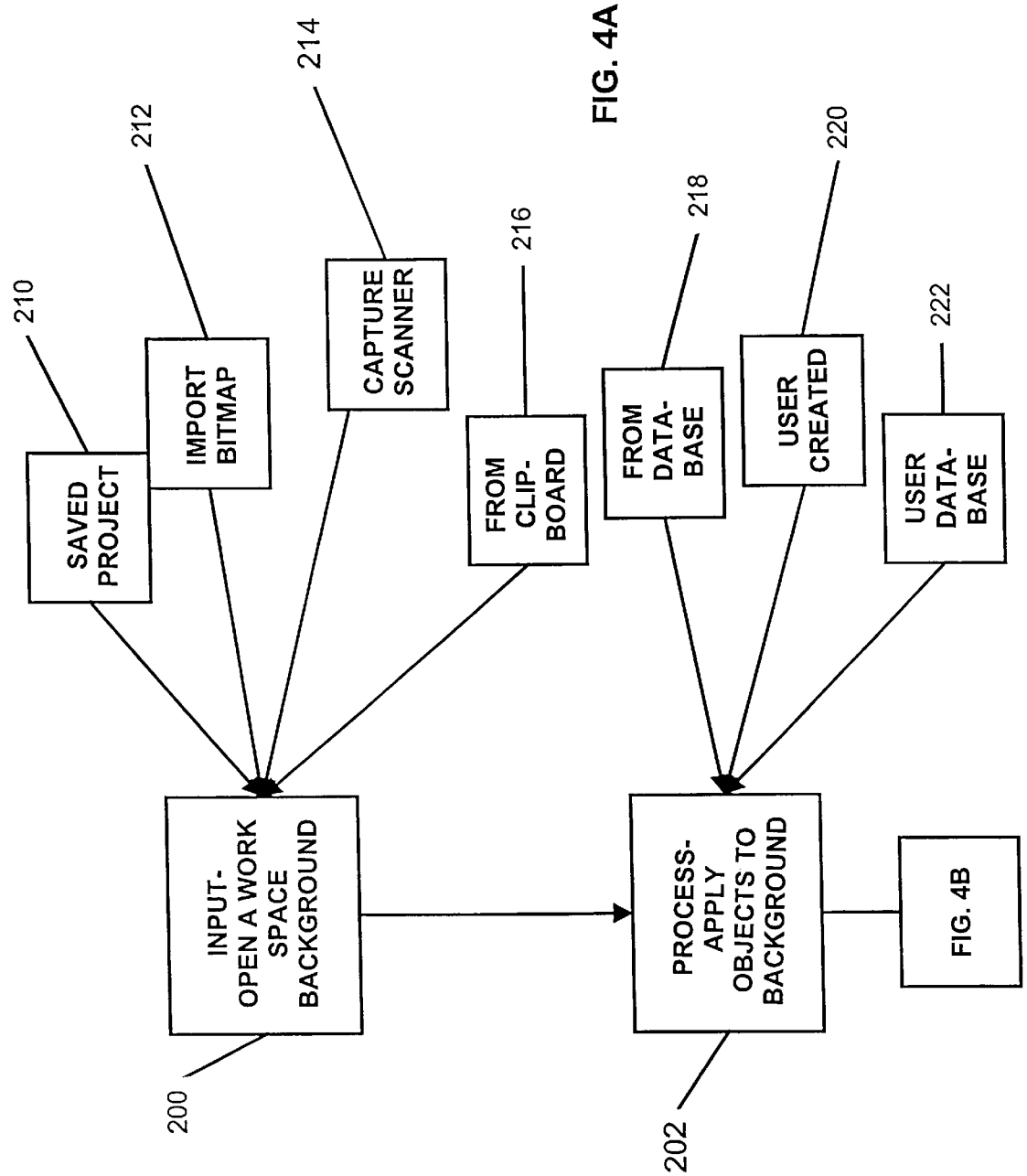
FIG. 4 is a flowchart illustrating an overview of the invention.
Figure 4B:
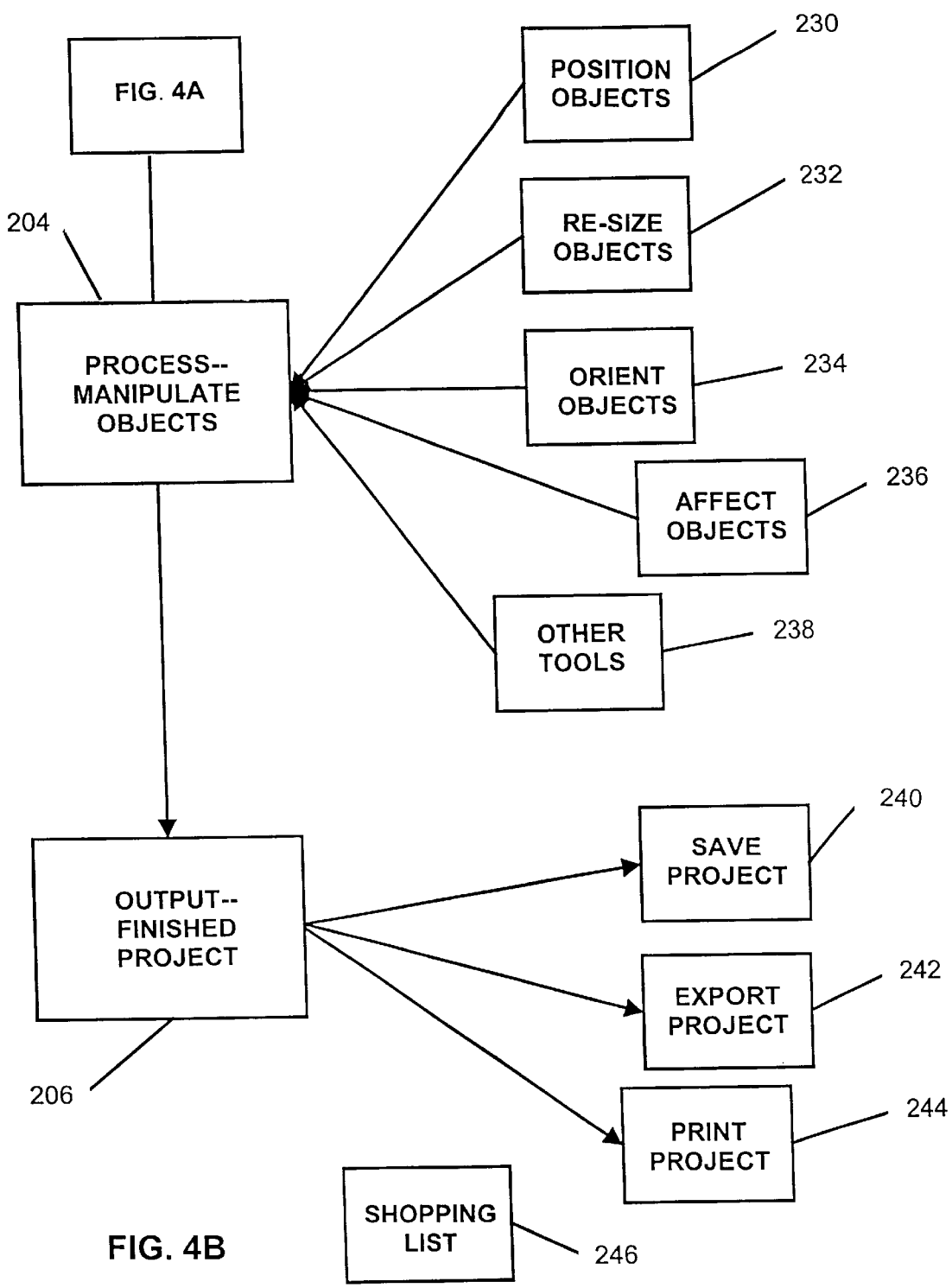

FIG. 4 illustrates an overview of the visualization method of the present invention. As generally illustrated in step 200 of FIG. 4, an input is used to open and generate a background of an actual environment. The environment may be a building structure, but may also comprise a landscape. Then, at step 202, objects are applied to the background by placing the objects over or merging the objects with the background. Next, in step 204, objects are manipulated as desired by the system user to permit the realistic visualization of the object on the background. In steps 202 and 204,

| img | G3 2D | pcx | wpg | jtif | lead2jtif | tif | dxf | pct |
| CCITT | G4 | bmp | lead | lead1bit | lead1jfif | tga | OS/2 bitmap | msp |
| G3 1D | eps | cals | jfif | lead1jtif | lead2jfif | wmf | ras sunraster | mac | the input associated with step 200 is processed. In step 206, an output of the finished project is generated.

FIG. 4 illustrates the various sources of input for step 200 that are useful in creating a digitized background. The background will be used to create a realistic composition with real products from an on-line catalog which is in the form of an object database. The input sources include a saved project 210, an imported bit map 212, a scanner generated image 214, a clipboard image 216 or an image from the CD-ROM database.

Step 202 involving the processing of the background image through the application of objects to the background includes the use of an object database 218, the creation and use of a user generated object database 220, the step 220 of creating objects from other objects or from the background itself, step 222, the saving of objects created by the user into a user database. The databases, as disclosed herein, that are employed by the invention form, in effect, a dynamic product catalog (sometimes referred to herein as a "object catalog").

The process step 204 of manipulating the objects includes step 230, involving the positioning or manipulation of the objects on the background, step 232, the resizing of objects placed over the background, step 234, reorienting objects placed over the background, and step 236, affecting the objects placed over the background. Other tools 238 are provided to achieve other miscellaneous manipulation steps, as more fully explained below.

Output step 206, includes any number of steps including step 240, saving the project, step 242 exporting the project, step 244 printing the project or step 246 generating a shopping list of materials associated with the project.

An overview of the computer processing steps employed in the preferred embodiment of the invention disclosed above in steps 200–246, will now be disclosed.

The process steps discussed below have a sequence in the order as shown in the referenced figures, unless otherwise indicated.

4.3.1. Step 200—Creating a Work Space Environment

Figure 3:
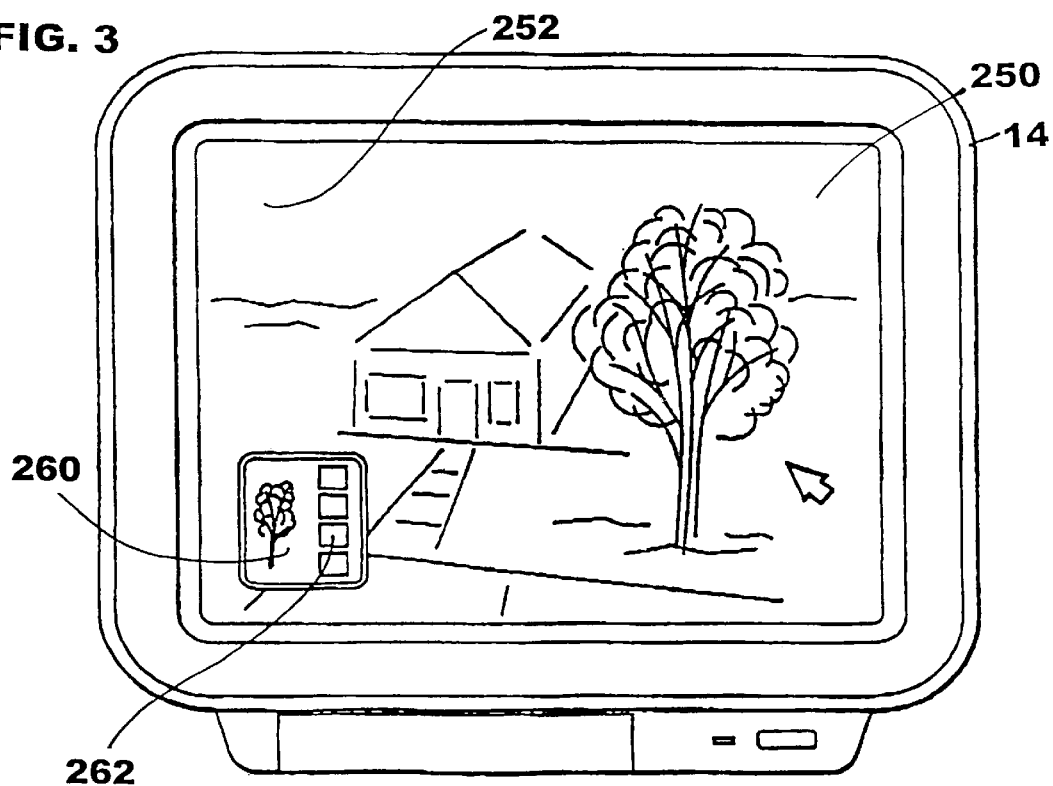
FIG. 3 is a schematic of a screen display showing a background with an object placed over the background and a mouse pointer appearing in the background.

In general, the computer program creates a composition surface or "background work space" 248 to display a digital image background 250 in monitor 14, or in hard copy from printer 18 (not shown), as shown in FIG. 3. The computer program and object database allow the system user to place or "drag" digital images of an object 260 from the database of products (sometimes referred to as "objects") stored in actual manufacturers and vendors on-line catalog database or in a user database of object images created by the system user into the background work space 248 in an on-line display 252. The work space 248 is a fixed image which acts as a lowest layer composition comprising the background 250 and all objects images 260 that will be placed over or merged into the background 250, as shown in FIG. 4. The product object images 260 may be "dragged" from either the on-line catalog database or user database and are then placed over the work space containing background 250, with each such object image 260 in its own depth layer. The object images can then be arranged, positioned, resized and oriented on the background 250 so as to create a realistic composite image of a finished project.

The background 250 is usually created from a fixed digitized photographic image received as input from an image capture means in the form of the image capture device 16. To create the work space 248, the computer program creates a form to hold the background by loading a Microsoft Windows Multiple Document Interface ("MDI") and a client area for the entire program, and designated as step 256 in FIG. 5. The MDI child form is then created in a Visual Basic 4.0 development environment, or equivalent. The MDI child form contains a Visual Basic compatible VBX control ("VBX control"), or equivalent (such as LEADTOOLS, a registered trademark of LEAD Technologies, Inc., 900 Baxter Street, Charlotte, N.C., 28204), that acts as the background 250. After the MDI child form containing the VBX control is created, the digitized background 250 is created in step 258. The process of step 258 includes importing an image from a file in compatible format, capturing the image from image capture device 16, which in preferred form is a Twain-compatible device, pasting the image from the Microsoft Windows Clipboard, retrieving the image from a project previously saved by the computer program, or retrieving an image from the main Microsoft Access database. After the image is placed in the background VBX, the background VBX is copied to the composition buffer. The client area and the MDI child form is re-sized to fit to the size of the image in the VBX controls. In step 260, the MDI child form and VBX control that will serve as the background are made visible.

Figure 5A:
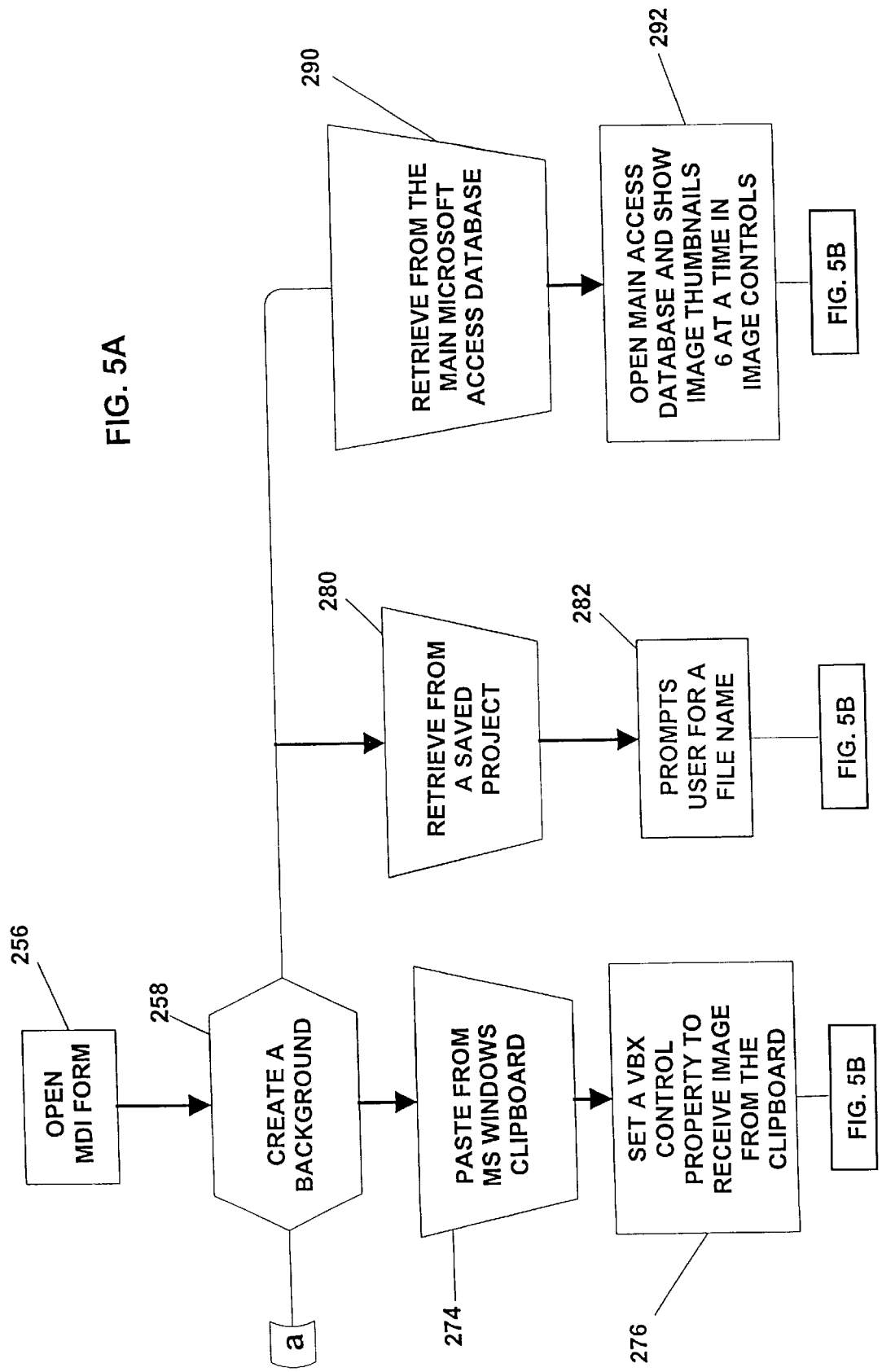
FIGS. 5–7 are flowcharts illustrating the process by which a background is created in a computer generated display.
Figure 5B:
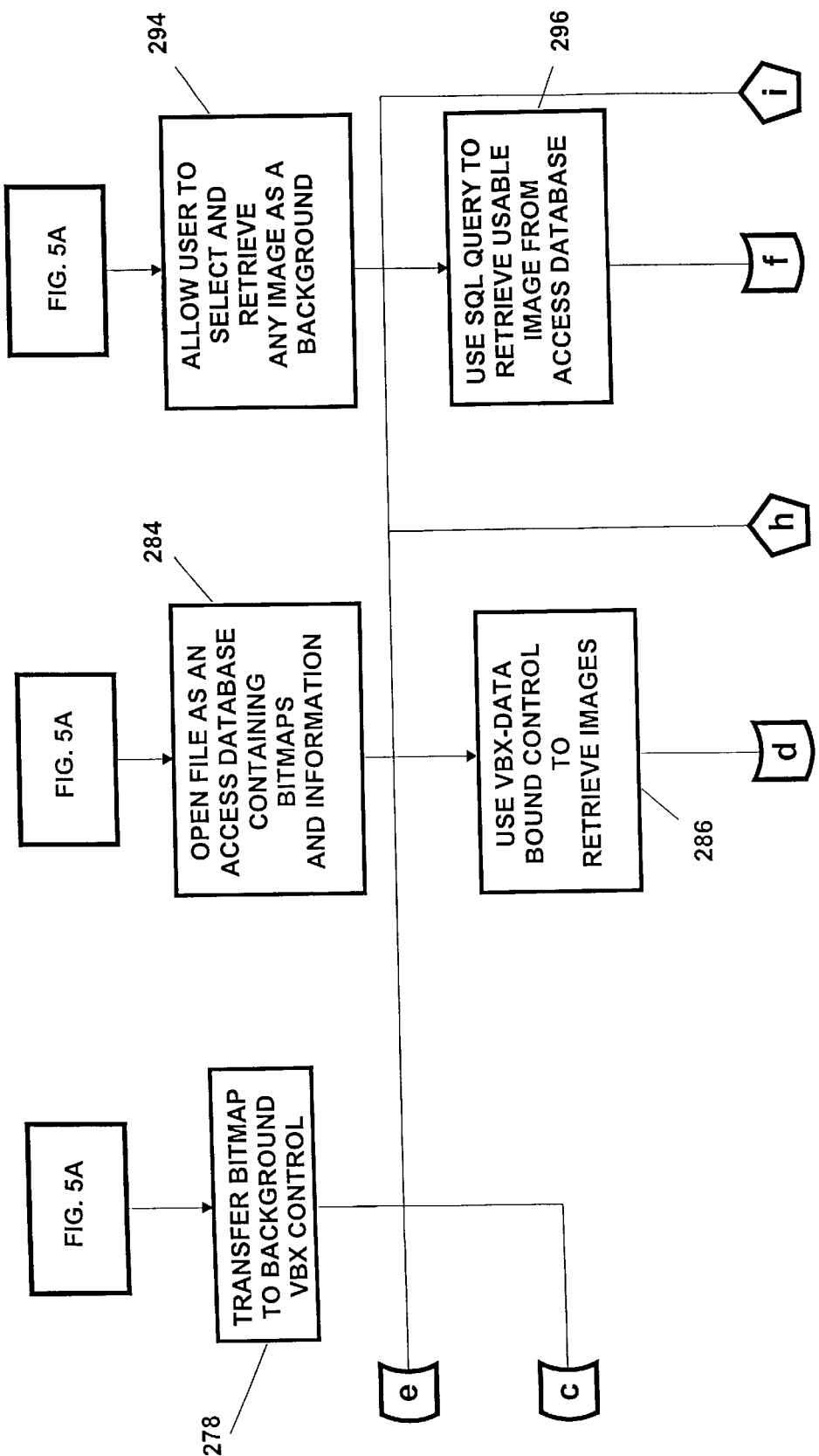
Figure 6:
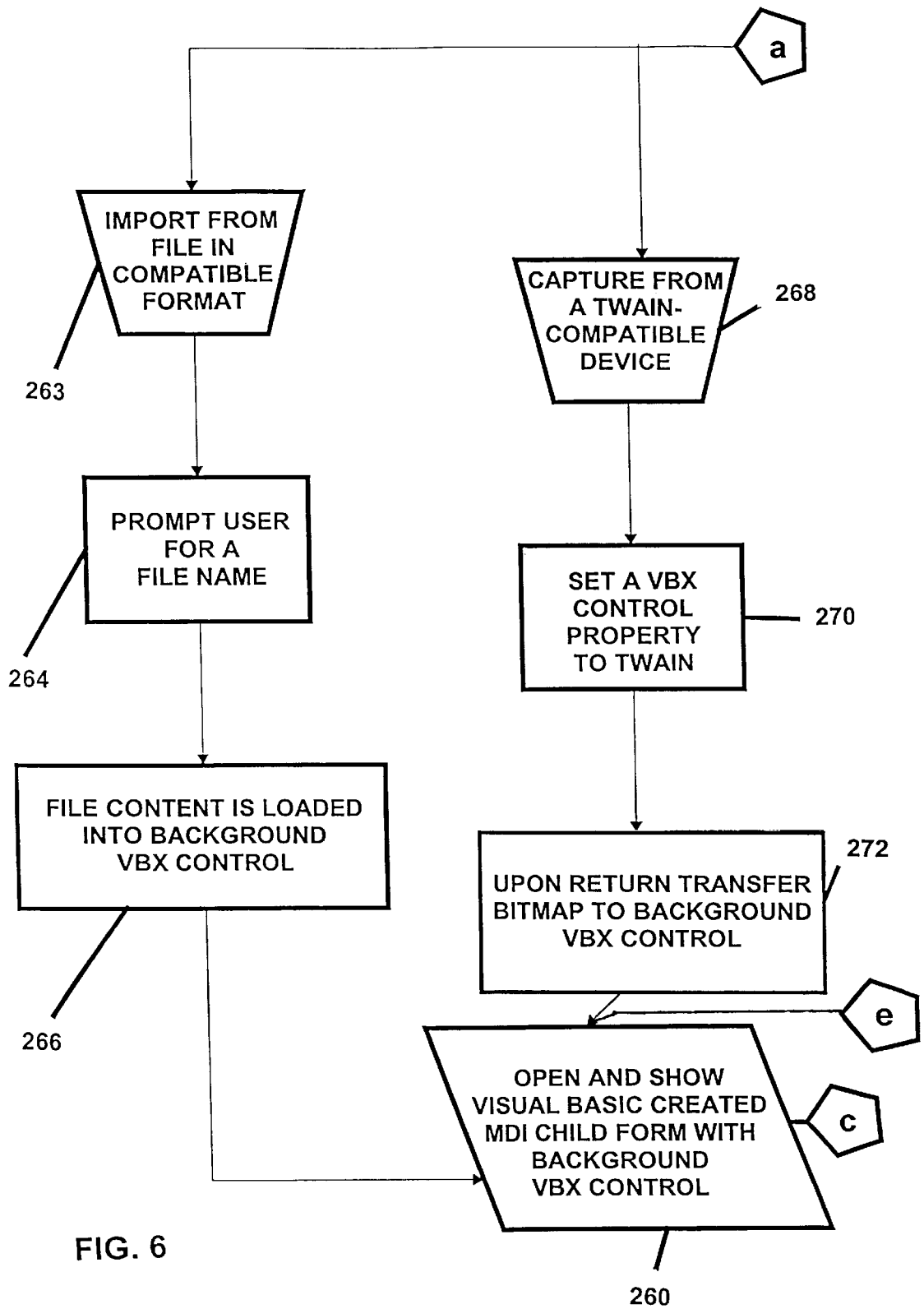
Figure 7:
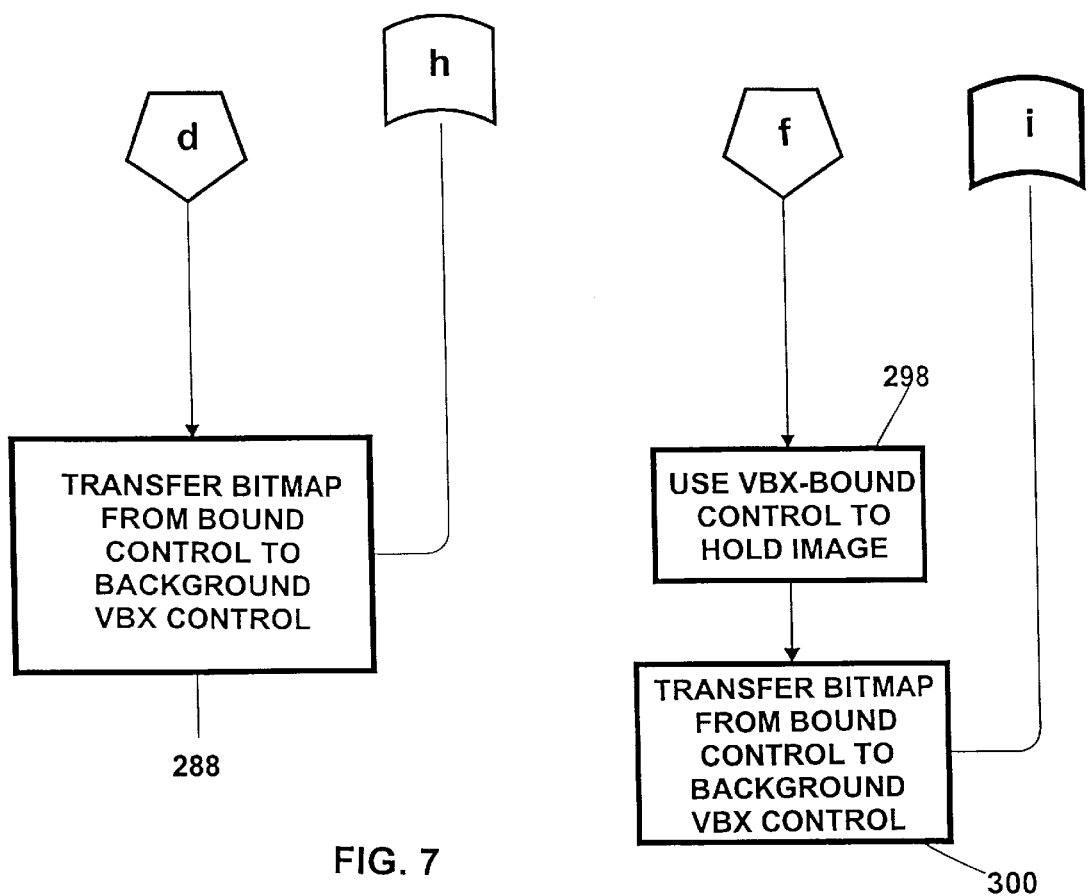
Figure 8A:
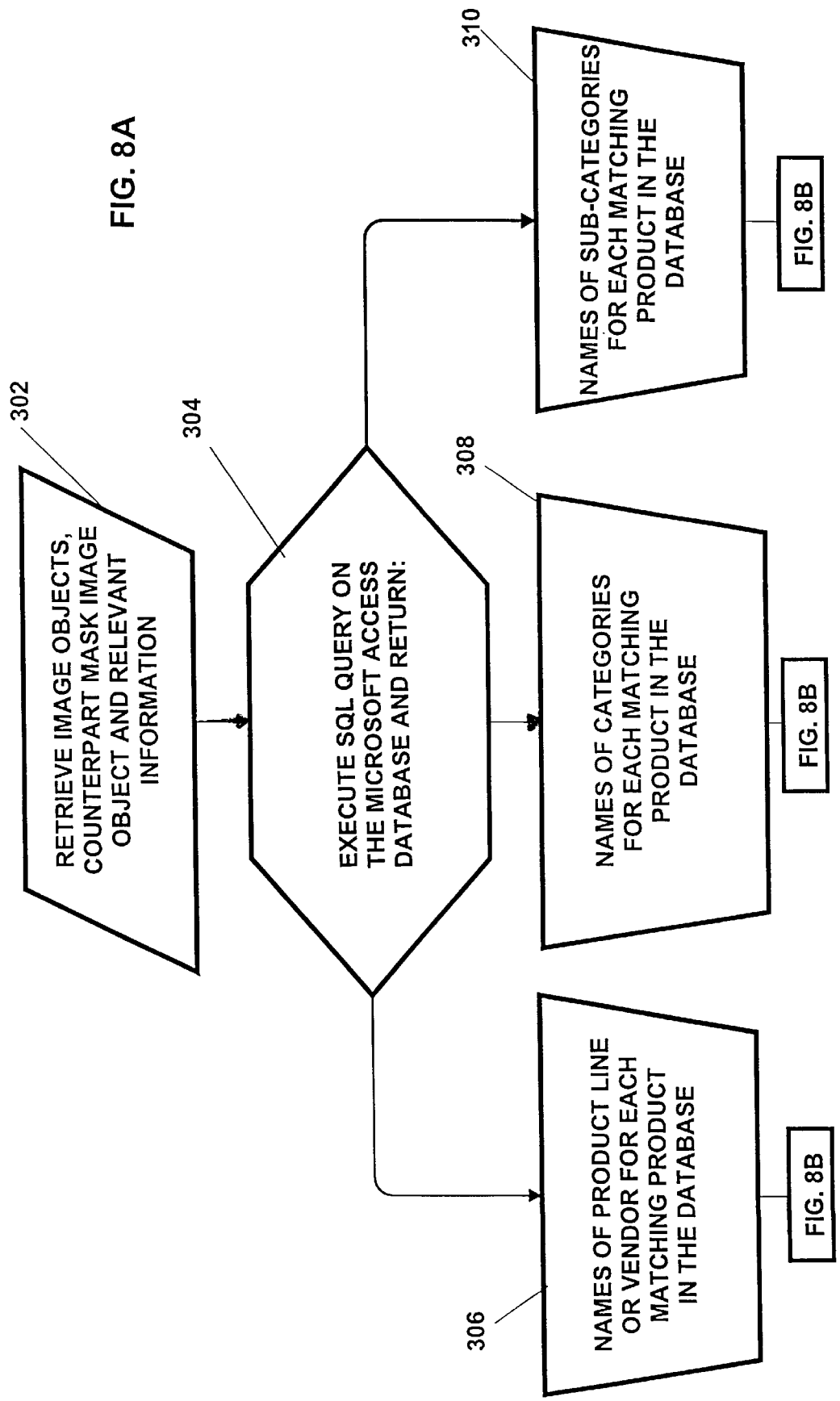
FIGS. 8–11 are flowcharts illustrating the process by which digital images of objects are retrieved from the database.
Figure 9A:
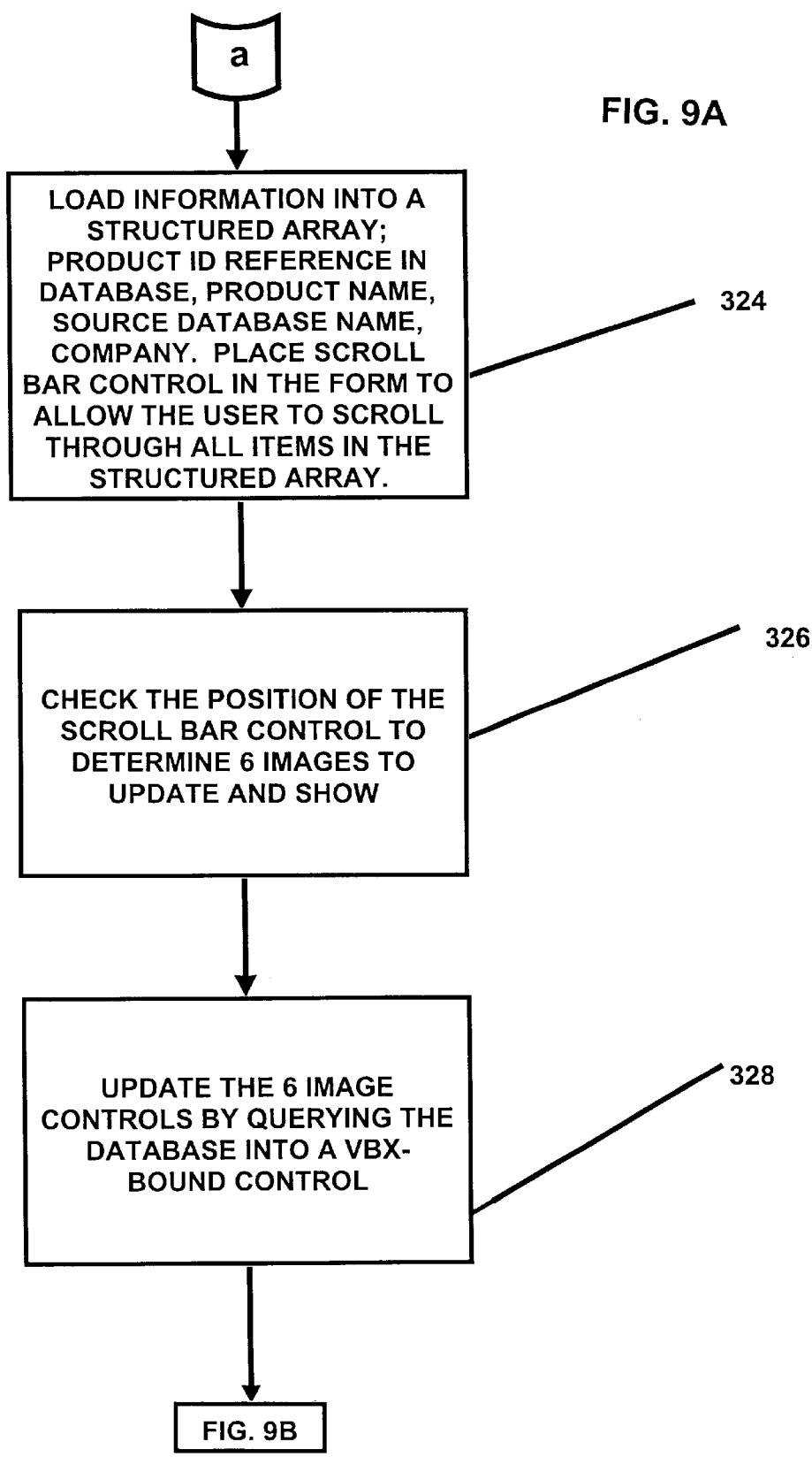
Figure 10A:
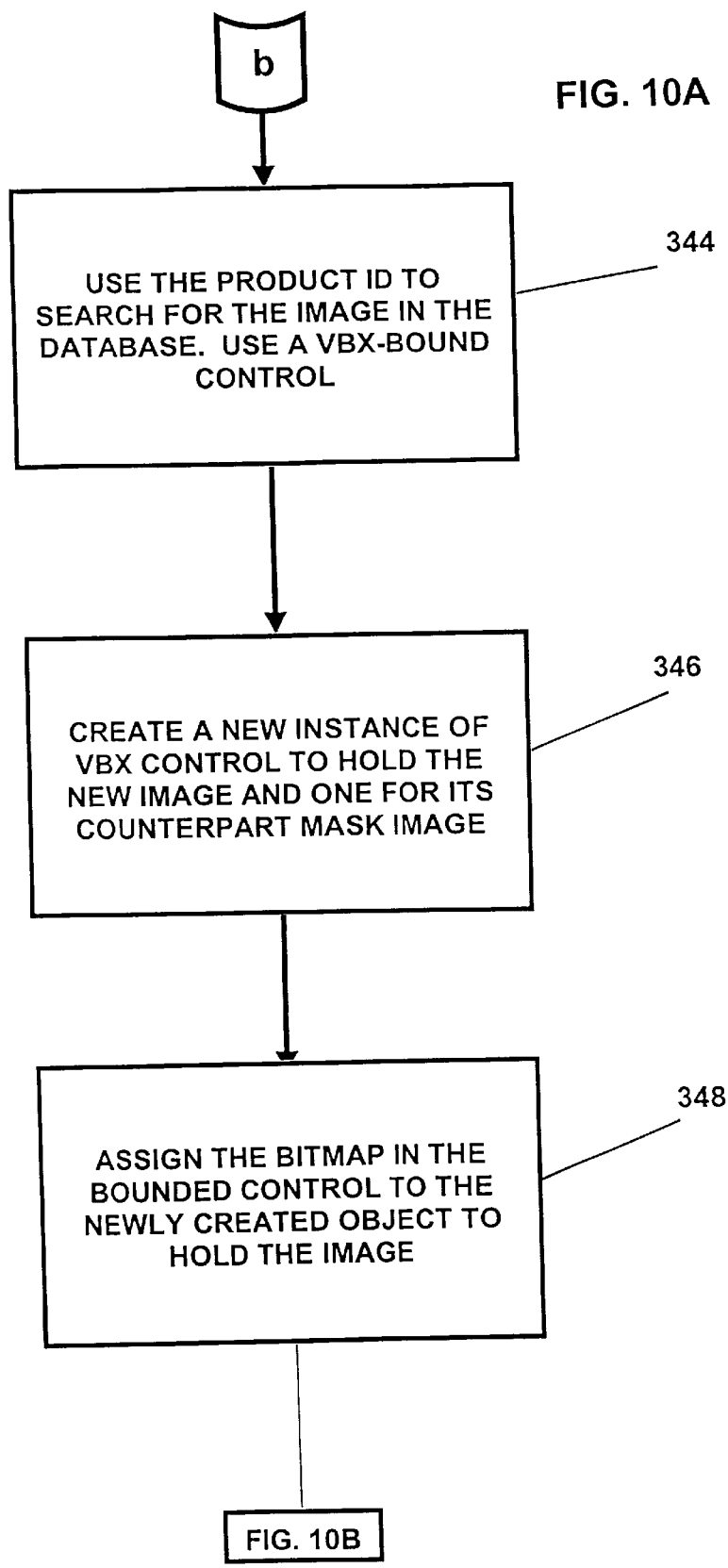
Figure 11:
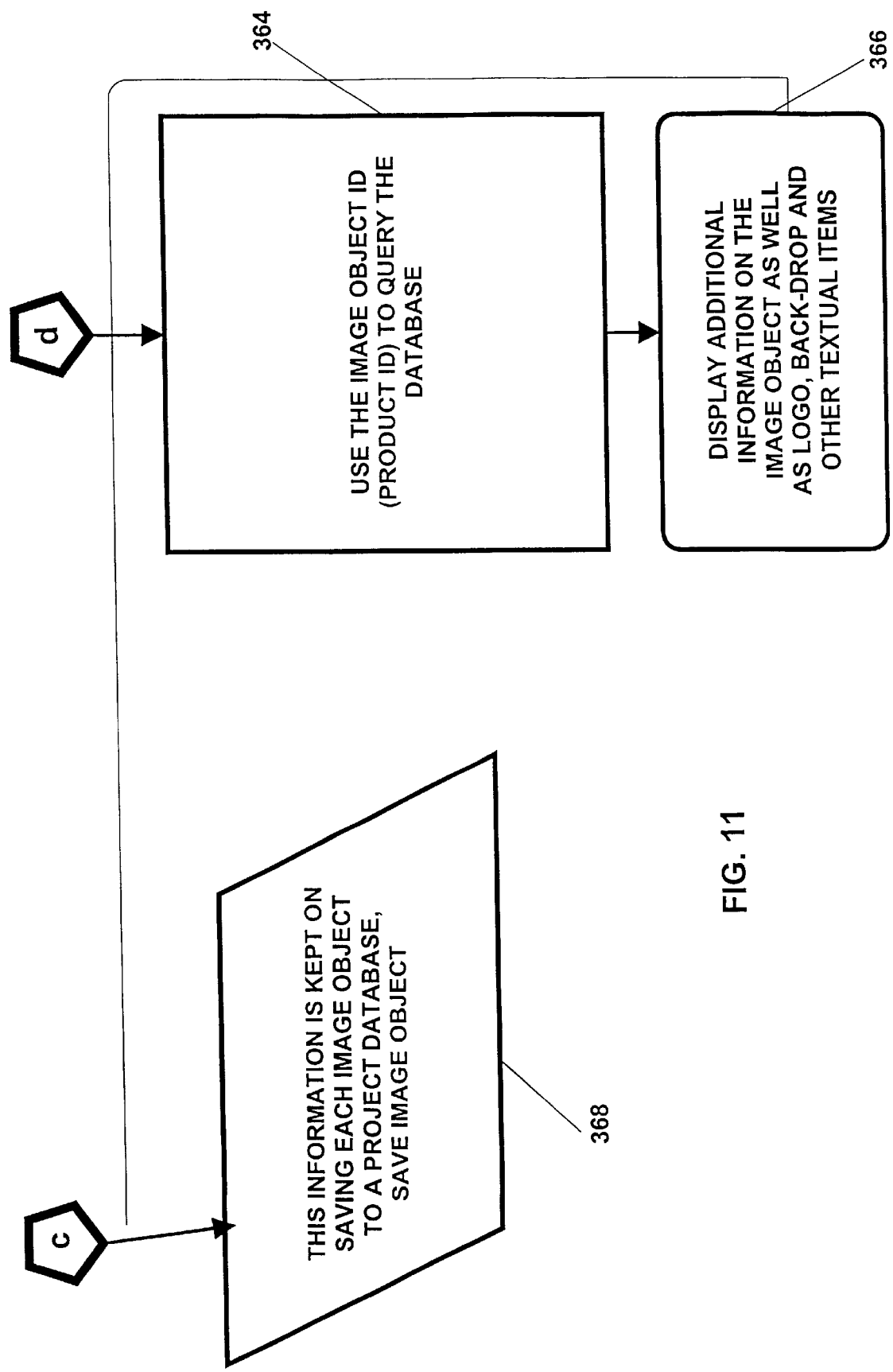

Creating the background image can be accomplished using several methods. Referring to FIGS. 5–7, one method of inputting a image for background 250 in the VBX is by importing a file in a VBX control compatible file format into the computer program, as illustrated in steps 26–266. After the system user selects "Import" from the File Menu, the computer program prompts the user for the name of the image file to be imported, as illustrated by step 264. The system user then selects the appropriate image file by use of a Visual Basic Dialog control box showing the user the available drives and directories from which to import the file. After choosing the file to be imported, the computer program loads the image into the program using the selected file name and VBX Controls loading property, as shown in step 266.

A second method of creating a background 250 is by capturing the image through a Twain compatible installed image capture device 16 such as a scanner, digital camera or video camera, as illustrated in steps 268–272. In step 270, the computer program calls the VBX control Twain property in a buffer control in the MDI child form. If the Twain compatible device is present, the computer program accesses the Twain compatible program and waits for it to terminate. Once the Twain compatible program terminates, step 272 involves transferring the resulting bitmap image to the VBX buffer control and then transferring the buffer bitmap image to the VBX control in the MDI child form.

A third method of creating the background 250 is through use of the Clipboard feature of Microsoft Windows or Windows 95, as illustrated in steps 274–278. Using another computer program storing the desired digitized image, the image is transferred or "copied" to the Windows Clipboard. In step 276, the buffer VBX control paste property of the present computer program invention is set to "true" to enable receipt of the image from the Clipboard. In step 278, the present computer program invention then transfers or "pastes" the desired background bitmap image to the VBX control in the MDI child form.

A fourth method of creating a background 250 is to retrieve an image from a project that previously has been created and saved by the computer program, as illustrated in steps 280–288. The system user opens the file containing the desired background image by selecting "Open Project" from the program's Icon Toolbar or File Menu. In step 282, the computer program then prompts the system user for the name of the saved project file using a standard Visual Basic dialog control box. Once the system user selects the appropriate file, the computer program opens the file as a Microsoft Access database, as illustrated in step 284. In step 286, the computer program uses a VBX Control in the MDI child form that is data bound to this database file to retrieve the image. The computer program next positions on the first record which contains the background image. In step 288, the background bitmap image in the data bound VBX control is then transferred to the VBX control in the MDI child form. The computer program continues to read the file for various image objects that may be part of the saved project file. The computer program then places all such image objects in a new VBX control that are visible and remain in higher control layers than the background 250.

A fifth method of creating a background 250 is to retrieve an image from the main Microsoft Access Database, as illustrated in steps 290–300. In step 292, the system user first opens the main Access Database to reveal the image thumbnails six at a time in the image control. In step 294, the computer program allows the system user to select and retrieve any image to be used as a background image. Next, in step 296, an SQL query is used to retrieve the desired image from the Access Database. In step 298 the VBX data bound control is then used to hold the image. Finally, in step 300, the desired bitmap background image is then transferred from the data bound control to the background VBX control.

4.3.2 Applying Objects to the Background—Step 202

FIGS. 8–11 illustrate the various steps by which objects 260 are applied to the background 250. The objects 260 to be applied to the background 252 can be retrieved from the on-line catalog database, as illustrated in step 218 or, as illustrated in step 220, can be created by the user. Objects created by the user may be saved in a User Database as shown in step 222 for later use.

4.3.2.1 Step 218—Retrieving Objects from the On-Line Catalog Database

In general, the computer program offers the system user thousands of product objects 260 that can be utilized in designing a project. Each product image object 260 is stored in the on-line catalog database and arranged by Product Lines, Categories, and Sub-Categories as more fully described in section 4.4 Data Structures.

In greater detail in FIGS. 8–11, the process 302 process for retrieving image objects, counterpart mask image objects and relevant information. As set forth in Step 304, the computer program executes an SQL query to search the Microsoft Access Database to retrieve the names of Product Lines 306 for vendors for each matching product in the database, the names of Categories 308 for each matching product in the database, and the names of Sub-Categories 310 for each matching product in the database. Step 312 involves the process of showing the result of the search for each field in a drop-down-combo control. In step 314, the user is allowed to select any combination of Product Line, Category and Sub-Category by executing proper SQL queries. In step 316, the Category is updated according to the selected Product Line, and the Sub-Category is updated according to the selected Category. In step 318, the system user is allowed to select the option to retrieve information pertaining to the current Product Line Category and Sub-Category.

Step 320, involving the opening of a form, called database strip, with seven image controls, permits the display of the first six thumbnail images in the database and logo of the manufacturer or general group logo for the top most image. The next part of the process, Step 322, involves querying the database product table to retrieve production information for the Sub-Category. In step 324, the computer program next loads information into a structured array, including product ID reference in the database, product name, source database name and the manufacturer or general product group. Step 324 further involves placing a scroll bar control in the form to allow the system user to scroll through all items in the structured array.

After loading the information into a structured array, the computer program checks the position of the scroll bar control to determine six images to update and show, as illustrated in step 326. Step 328 involves updating the six image controls by querying the database into a VBX data bound control. A data bound control is a data-aware control that provides access to a specific field in a database in combination with a data control. Data controls are placed in the different forms in the application to allow interaction with VBX data bound controls. As illustrated in Steps 330, 332 and 334, the computer program allows the display of information on the "mouse move" event of the image controls and the scroll bar "scroll" event. After the image information is displayed, Step 336 allows the system user to "drag and drop" the image from the image control onto the work environment, provided that the work environment is showing. Step 338 involves placing code to store the database image identification on the "mouse down" event of all six image controls and setting a "drag" mode for that control. Next, in step 340, code is placed in the "drag drop" event of the VBX control serving a background to the work environment. In step 342 the code detects that the "drag drop" event originated from the database strip.

In step 344, using a VBX Data bound control, the computer program uses the product ID to search for the image in the database. Step 346 of the process involves creating a new instance of the VBX control to hold the new image and one for its counterpart mask image. In step 348, the bitmap image in the data bounded control is assigned to the newly created object to hold the image. Using a VBX data bound control, the program in step 350 then uses the product identification to search for the image mask in the database. Step 352 involves assigning the bitmap image in the data bound control to the newly created object to hold the mask. Next, step 354 involves executing the image object selection process. After executing the image object selection process, step 356 involves assigning information on the structured array belonging to the newly created object.

Step 358 involves viewing image object information. One method of viewing image object information 262, as shown in FIG. 4, is through the "mouse move" event of each image object 260 to display image information 262 such as the name of the product and the company manufacturing it, as shown in step 360. Steps 362–366 involve allowing the system user to view further information on the image object through the use of the "right-click" event of each image object. In step 364 the image object identification (product identification) is used to query the database. Step 366 involves displaying additional information 262 on the image object 260 as well as logo, back-drop and other textual items. As illustrated in step 368, the information 262 is kept on saving each image object to a project database, the computer program provides for saving image object information such as the name of the product, the company manufacturing the product, the product identification and the CD volume.

4.3.2.2 Step 220—Creating Objects

In addition to retrieving product image objects 260 from the on-line catalog database, a user may also use means to record and store digital images of objects to create image objects 260. These user-created image objects 260 can either be rectangular-shaped objects or free form (polygon) objects.

Figure 12A:
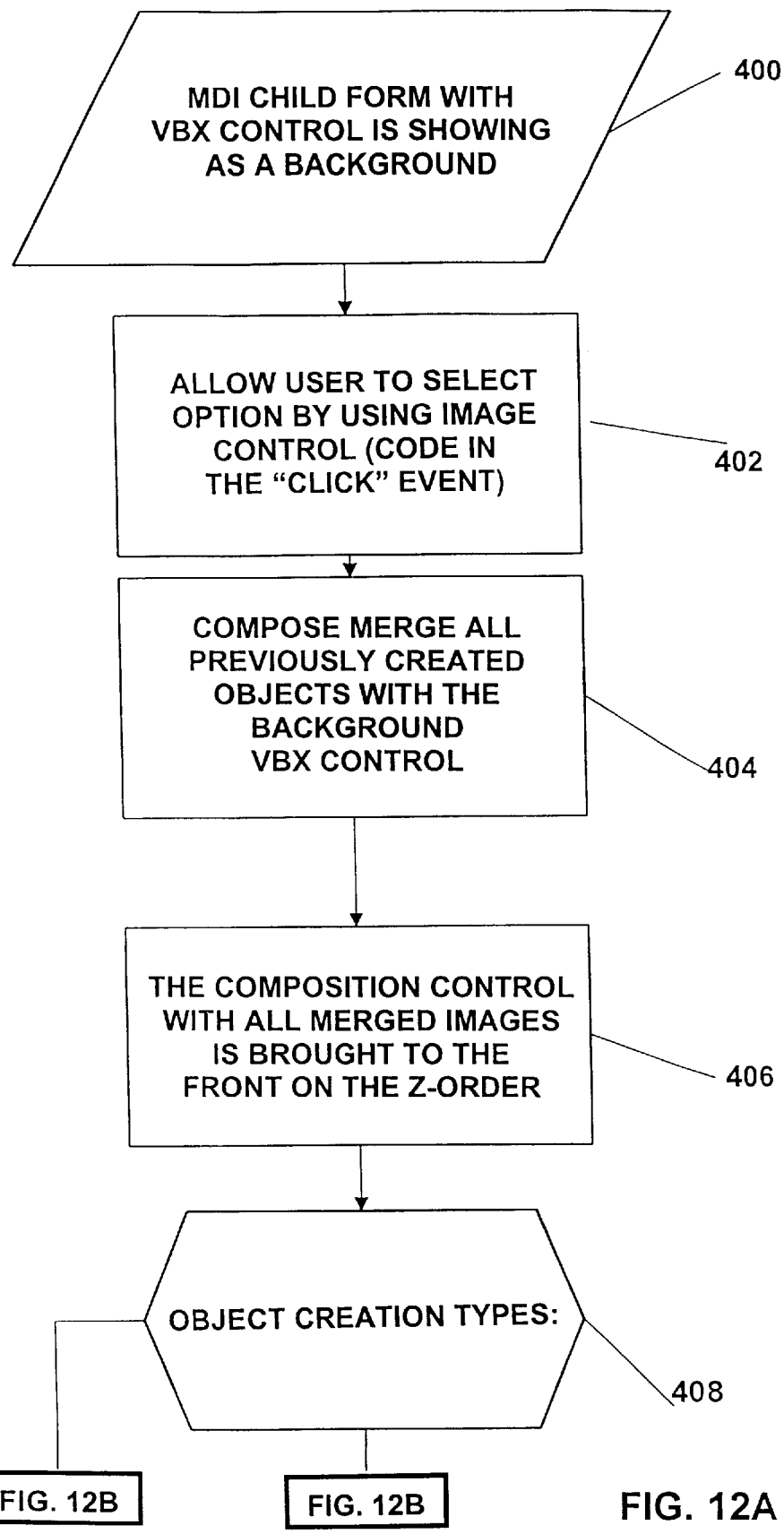

The means to record and store digital images of objects is now disclosed in greater detail with reference to the processes as illustrated in FIGS. 12–13, the object creation process begins with step 400 in which the MDI Child form with VBX control is showing as a background 250. In step 402 the system user is allowed to select the option that initiates the object creation process by using an image control in the toolbar (code in the "click" event). Step 404 involves the process of composing/merging all previously created objects with the background VBX control. Next, in step 406, once all previously created objects are merged, including the background VBX control, into the composition control, this control with all merged images is brought to the front in Z-order, which is the relative order that determines how controls overlap each other on a form.

In step 408, the computer program provides two types of object creations—rectangular object and free-form (polygon). Referring to the rectangular object-type, in step 410 a user is allowed to create a rectangular object. Next, step 412 allows the user to "click and drag" the mouse pointer so as to create a rectangular shape. In step 414, the program shows a rectangular shape with XOR'ed lines from start to current position. In step 416, the image bitmap is copied using Windows API calls upon release of the mouse pointer from the VBX control that has all bitmaps merged. In step 418, the program creates two new instances of VBX controls—one for mask and one for copied image. In step 420, an image is created that is a counterpart black and white mask of the rectangular shape. In step 422, the copied image is placed into a newly created VBX control, which is shown and brought to the front in Z-order. In step 424, a "user created" name is assigned to the object in a structured array for that object. In the final step 426 associated with the creation of a rectangular object, the newly created object is shown as selected.

In step 428, a user is allowed to create a free-form object (polygon). Next, step 430 allows the system user to "click" a mouse pointer to create line segments between points. In step 432, segments are shown with XOR'ed lines. In step 434, the user is allowed to "right click" a mouse pointer and select from a pop-up menu to complete the operation. In step 436, the user is allowed to complete the operation. In step 438, a polygon region is created by automatically connecting the current mouse click x,y position with a first mouse click x,y position. In step 440, the image is copied using API calls from the control that has all merged bitmaps. The free-form object is then shown as selected with the sequence of Steps 418–426 described above.

4.3.2.3. Step 222—Saving Image Objects into the User Database

As shown in FIG. 14, step 500, a user is given a choice of entering objects into the database by importing an image and counterpart mask 502 or creating the image objects in step 514. The process of entering objects into the database by importing an image and counterpart mask begins with step 504 in which, using a common dialog control, the user is prompted for a valid name of the file to be imported. In step 506, VBX controls are used to import the image from compatible file formats such as the .bmp file format. In step 508, the user is allowed to enter textual information on the display screen relevant to that image object. In step 510, VBX data bound controls are used to update a Microsoft Access Database. Finally, in step 512, the computer program uses data controls to update the textual information on the same record where the image and mask reside.

The process of entering user created objects into the database, begins with step 516, in which the computer program allows the user to select a menu option to save the selected user-created image object and counterpart mask. Next, in step 518, the image and mask bipmaps are transferred to VBX data bounded controls. Data controls are used to update the textual information on the same record where the image and mask reside, utilizing the sequence described above in Steps 508–512.

4.3.3. Selecting, De-selecting and Recreating an Image Object.

Figure 15:
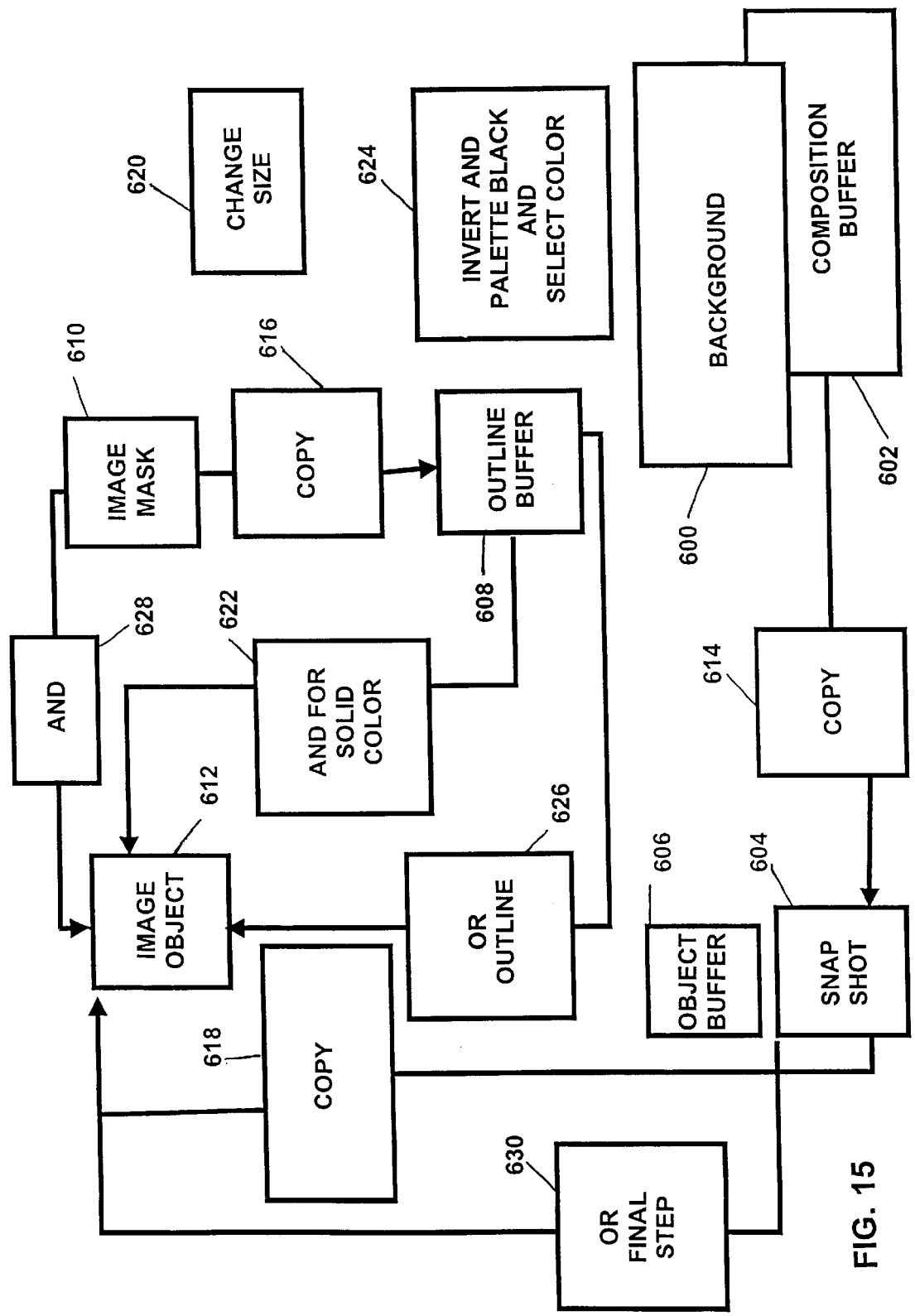
FIGS. 15–17 are flowcharts illustrating the select, recreate and de-select feature of the invention.
Figure 16:
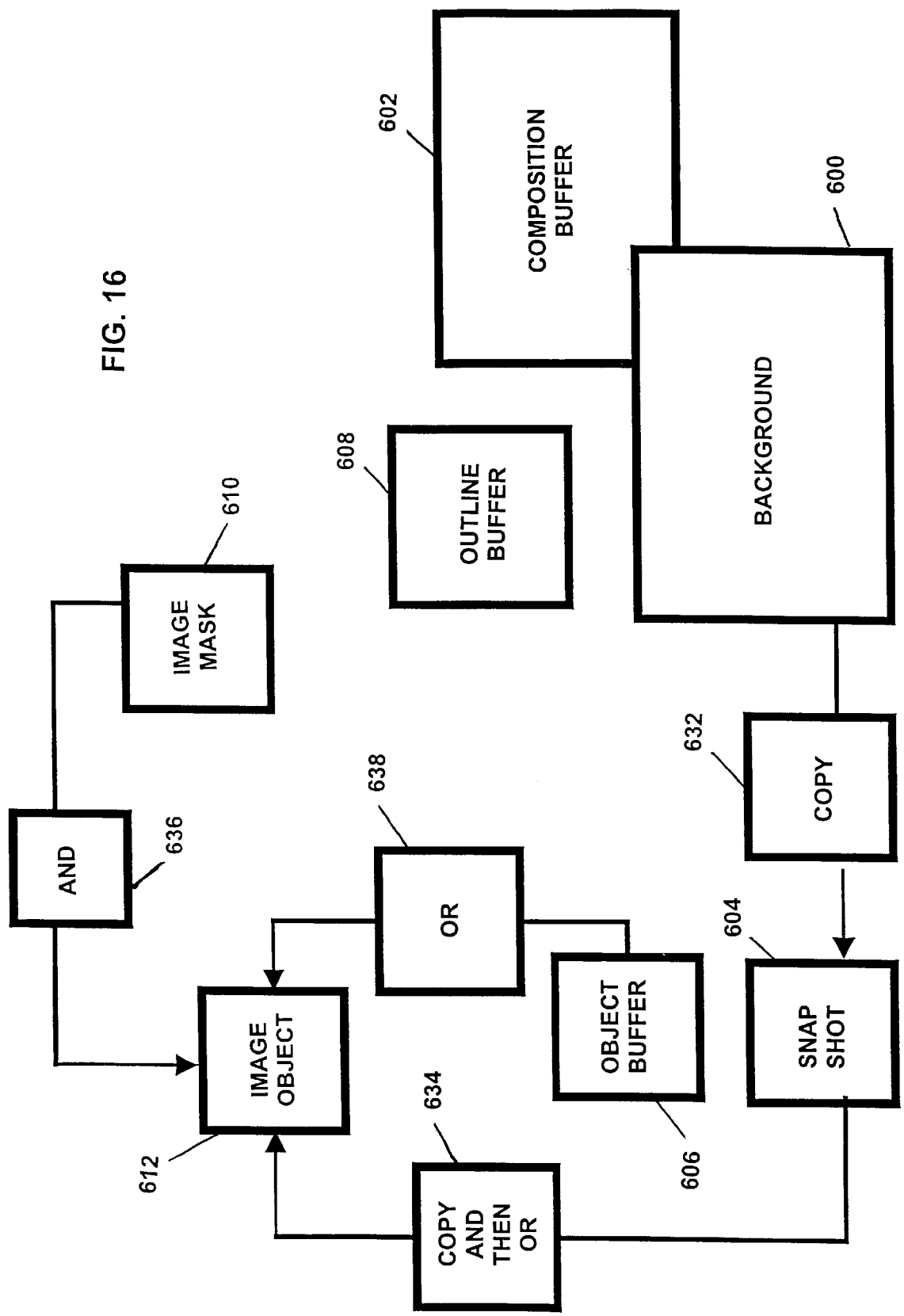
Figure 17:
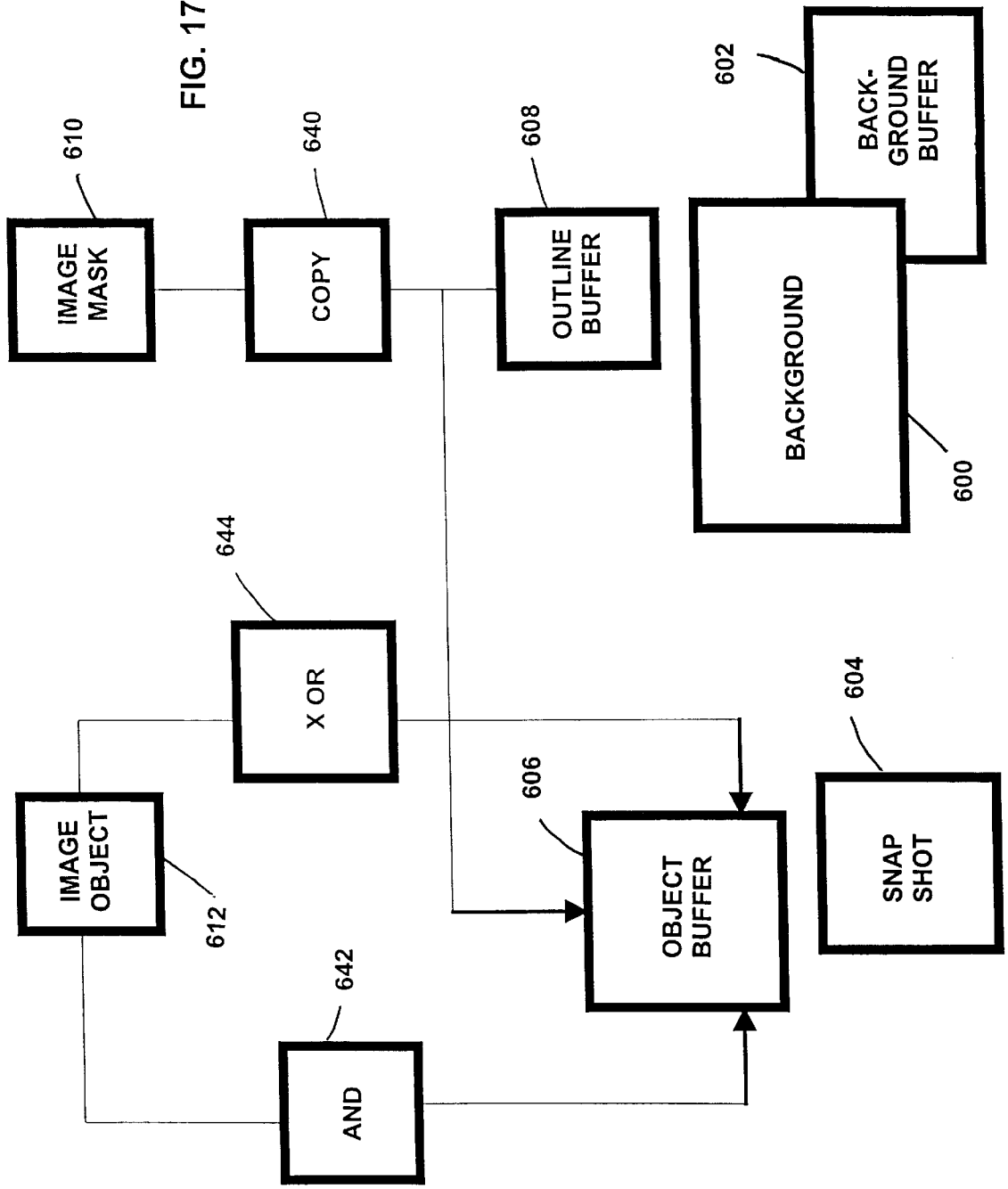

As illustrated in FIGS. 15–17, the computer program utilizes a special technique for showing that an image object is currently selected. Operations such as resize, rotate and other object processing routines are only applied to currently selected objects. A selected image object 260 shows a colored outline that follows its contour. The computer program's selection process outlines the object by using the image mask belonging to the selected image object. This eliminates the need to keep track of the object's contour coordinates.

In greater detail, to select an image object the user must "click" on a de-selected object. Code in the "click" event of the object initiates the selection process. The steps set forth below are taken to select the object by the use of Windows API call to functions, mainly the BITBLT function. The Windows API BITBLT function copies from a specified device context to a destination windows device context. Below are the objects involved in the selection, de-selection and recreation process and how the logical operations are applied.

4.3.3.1 Selecting an Image Object

As shown in FIG. 15, the following logical operations are done to the images:

Interaction of 7 VBX controls referred as:

A) the background (holds the environment background image, such as a house), described as 600;

B) the composition buffer (all images merged such as the house with doors and trees), described as 602;

C) the snap shot, described as 604;

D) the object buffer, described as 606;

E) the outline buffer, described as 608;

F) the image mask (holds the mask counterpart to the image object), described as 610;

G) the image object (holds the image, such as a door or tree), described as 612.

The interaction is as follows:

Call the Recreate Object procedure places the image in object 606. A bitmap is placed in object 612. Decrease size by outline 612.

Step 614: Segment 602 equal to the image object size is applied the logical operation COPY with object 604.

Step 616: Object 610 is applied the logical operation COPY with object 608.

Step 618: Object 604 is applied the logical operation COPY with object 612.

Step 620: Object 608 is changed in size to allow for the size of the outline.

Step 622: Object 608 is applied the logical operation AND with object 612.

Step 624: Object 608 is inverted and assigned palette containing black and outline color.

Step 626: Object 608 is applied the logical operation OR with object 612.

Step 628: Object 610 is applied the logical operation AND with object 612.

Step 630: Object 606 is applied the logical operation OR with object 612.

4.3.3.2 De-Selecting an Image Object

Referring to FIG. 16, to de-select an image object the user must "click" on the object. Code in the "click" event of the object initiates the de-selection process if the object is already selected. Also click on the background image initiates the de-selection process if an object is already selected. Using the same objects described above:

The interaction is as follows:

Decrease size by outline 612.

Call the Recreate Object procedure places the image in object 606.

Step 632: Object 602 is applied the logical operation COPY in object 606.

Step 634: Object 604 is applied the logical operation COPY and then OR with object 612.

Step 636: Object 610 is applied the logical operation AND with object 612

Step 638: Object 606 is applied the logical operation OR with object 612.

4.3.3.3 Recreating an Object Image

Referring to FIG. 17:

Step 640: Object 610 is applied the logical operation COPY with object 606.

Step 642: Object 612 is applied the logical operation AND with object 606.

Step 644: Object 612 is applied the logical operation XOR with object 606.

Figure 22:
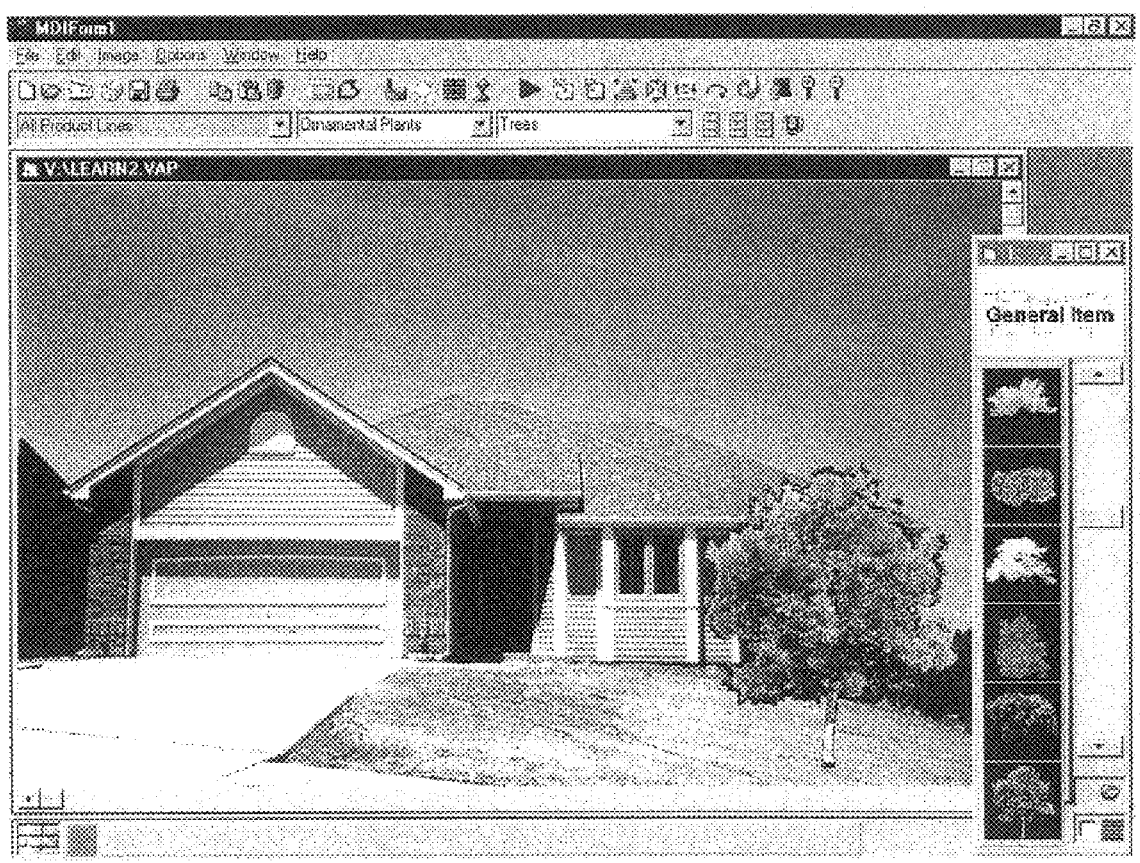

An example of an object selected by means of steps associated with the selecting, de-selecting and recreating process described above and illustrated in FIGS. 15–17 is illustrated in FIG. 22. Tree 920 is selected and appears within an outline 950 that follows the contoured border of the tree 920.

4.3.4 Step 204—Manipulating Objects

The process of manipulating objects in Step 204 will now be described.

4.3.4.1 Step 230—Position objects

Digital images of objects 260 are positioned in the screen display by use of a common technique for "drag and drop", which technique is available in development tools such as Visual Basic, to allow the user to reposition objects by means of VBX controls, or equivalent. In the case of a "mouse down" event of a control containing the image, programing code is placed to enable "drag" mode, and is also placed to run through the Recreate and De-select procedure. On the background 250 and on all image objects 260, programing code is placed in "Drag Drop" Event. The Selecting process is run and the control is made visible.

4.3.4.2 Step 232—Re-sizing the objects

This feature allows the user to re-size the controls containing bitmaps that originated in a database or that were created by the user. This feature allows the user to resize controls at the smallest visible increment on the screen. Common techniques are used to change the width and height of a Visual Basic VBX control or equivalent. Four controls are placed in the Visual Basic type MDI child form. The controls should be a solid color and be visible as an rectangles when the user selects the re-size option. The four controls will be used as re-sizing "ears" that the user can "drag" and "drop" to determine the new object size. Upon user selecting the re-size option, De-Select the currently selected object. An "XOR'ed" line is placed, using common API calls, around the contour of this control holding the image and displaying a rectangle. Four controls are placed and made visible so that they will serve as "re-sizing" ears—2 centered to the sides of the object, one centered on top and one centered on the bottom of the control containing the bitmap of the object. Traditional programing code is placed to allow drag and drop of the re-sizing ears. The ears are allowed to be placed anywhere on the current MDI child form. The rectangle formed by the new position of the ears is updated; the first rectangle is XOR'ed to eliminate it and form the new rectangle. The user is allowed to repeat this procedure any number of times. Programing code is placed to determine if a "click" event occurred. If a click event did occur, and if it is the first "click" event after the "dragging" of the "ears", the control and the image contained in the control is resized using the conventional feature for this purpose found in Control VBX or equivalent, that allows for re-sizing of the image without resizing of the bitmap. To display image correctly in the new size, the de-select, recreate and select processes are executed. A buffer control containing the black and white mask that is the counterpart control to the image product is also resized. This will represent images of any shape correctly integregated with the current background. The new size is determined by the position of the re-sizing ears. If the user executes a second click event outside the "ears", then the image bitmap and its counterpart mask bitmap are re-sized to the new dimension determined by the "XOR'ed" rectangle. As in many operations to bitmaps, due to the de-select, recreate and select processes and to the preview modes, manipulation of bitmaps are done in buffer controls. This way, the original bitmaps are only modified when the operation is complete. It is also to be understood that manipulation of bitmaps undertaken in other process steps described herein are also done in buffer controls so that in each case, the original bitmaps are only modified when the operation is complete.

The "XOR'ed" line is repeated to erase the rectangle, make the resizing ears invisible and execute object selection process. This will show the objects selected to be either enlarged or reduced to the desired size.

4.3.4.3 Step 234—Orienting the Objects

To orient objects in step 234, the following sequence of steps occurs. Create form to hold scroll bar control. Use a scroll bar control such as ones used in the Visual Basic. Assign to the range value properties of the scroll bar control to hold the values 0 through 360. Make a copy of the bitmap in the selected control holding the current image to another control that will be used to preview the changes in orientation, and do the same with the image counterpart white and black mask. Use commonly known techniques of assigning bitmaps from one control to another, such as those found in VBX controls. Allow the user to select this option by Pull Down menus and Icons in tool bar format. Load form with the scroll bar. Display an object that shows a circle label 0, 90, 180 degrees as to allow feed back to the user on the angle that has been selected by sliding the scroll bar element. Allow the user to move the scroll bar element so as to select new degrees of rotation. Display the scroll bar value to provide feedback to the user. Place a Visual Basic Button control labeled "Preview." Place code in this button control to rotate the temporary control holding the current bitmap by changing the rotate property to the value of the scroll bar. VBX controls provide a rotate property, upon changing this value the bitmap will be rotated to the specified degree ranging from 0 through 360. Allow the user to preview the new orientation any number of times. Every time the user selects Preview, the changes are copied from the original control to the temporary control. Additionally, the buffer control containing the image counterpart mask is rotated. The mask and the image are used in the combination in the selection process. The mask allows for correct intergration with the background of images with non-rectangular areas where part of the background is copied to the image to show intergration. This will allow the correct preview of the display. Place a button control on the same form so as to allow the user to cancel operation. In this case, the bitmap is not copied to the original control.

Place a button control that allows the user to select the previewed changes and apply them to the currently selected control holding the bitmap. Use the bitmap assignment property to assign bitmaps from the buffers control (image and mask) to ones used in the selection process.

4.3.4.4 Force fit (Other tools)

This technique comprises the transfer of the content bitmap of a control to another control. Functionally this allows the user to copy the content bitmap of a control to a buffer control that holds the bitmap temporarily. The user can then choose to replace the content of any control holding a bitmap with the content in the buffer control. The placing of the bitmap in the buffer control is referred to as Copy Special and the placing of the bitmap on the destination control is referred to as Force Fit. This technique consists of the following steps. Allow the user to initiate this option by placing code in the Windows Pull Down menus and icon tool bar. Place code to assign the bitmap from the currently selected control holding the image object to the buffer control that is in the windows MDI form that is common to all Windows Child forms. Use the commonly known bitmap assignment found in tools such as VBX controls. The same process is needed for the image counterpart black and white mask. In other words, the source image bitmap control and its counterpart containing the image mask are copied to the buffer for later assignment to the destination controls, one containing the image and the other containing the black and white mask. Place information contained in the object structure, such as Name, Product ID, Company/General group and Database name, in variables. These variable values will be assigned to the destination object later.

Place code in Windows Pull Down menus, Window Pop-Menu on the "right click" event of the control to allow the Force Fit feature to execute. Copy content bitmap that is in the buffer control to the currently selected control. Do the same with the image counterpart bitmap buffer and assign it to the control holding the destination bitmap mask. Due to the selection and de-selection process the resulting bitmap is placed in the "Object Buffer" in the MDI child form; this allows the Selection process to place the bitmap in the correct control and show it selected.

4.3.4.5 Force Fit proportional (Other tools)

The code to execute this option is the same as Force Fit, but the destination control width is re-sized to keep the same aspect ratio to the height control that remains the same and unchanged in relation to the buffer control in the Windows MDI form holding the bitmap to copy. For example, if the original object had a height of 2 and width of 4, then if the destination control has a height of 4 and width of 7, the height on the destination control will remain at 4 and the width will be modified to 8 to keep the same aspect ratio between height and width of the original control holding the original bitmap. Code is added to determine the proper width of the destination control depending on the original height on the buffer control and the height on the destination control. Assign the new size value, using the commonly known method of assigning values to Visual Basic VBX type controls, to the width property of the destination control.

4.3.4.6 Opacity (other tools)

This tool allows the user to select a color from common color dialog provided in Windows and accessible by tools like Visual Basic by the following sequence of steps. Place the return value representing the color in a global variable. Place code in Windows Pull Down menus, Window Pop-Menu on the "right click" event of the control and toolbar icons to allow the Paint with Opacity feature to execute. Upon execution, place code that assigns a solid color to a bitmap in a control, such as VBX control. This is done by assigning the bitmap color to the control property. This control is used as underlay in combination with the currently select control that is holding a bitmap. Controls such as VBX control allow for the combination of bitmap by using the Underlay procedure.

4.3.5 Step 206—Output—Finished Product

Step 206, as previously indicated, involves outputting the finished project. Steps 240–246, each different forms of outputting the finished product will now be discussed.

4.3.5.1 Saving a project

The following sequence of steps occurs in saving a project. Place code in Windows Pull Down menus and toolbar icons to allow the Save as Project feature to execute. Open a common Visual Basic Open Dialog that is placed in the Windows MDI form. This will return a file and valid name to a variable string. Place an extension, such as VAP or equivalent, that uniquely identifies the file to be created as one belonging to this application. Place a Microsoft Access Relational database type file in a directory accessible to the program. Create, on this database file, one table with fields to hold bitmap and information such as Product name, database name, product ID and Company or general group. Use commonly known methods to create fields in the database provided with the database tools. This file has no information except a place holder image in the first record. This database file will be used as a master file that is never written to but instead is used to create new ones. Make a copy of the file to the path and assign the name returned by open dialog. Open the database file. Using a data-bound control such as VBX control, update the first record with project background. Loop through array of controls that conform all the images over the background that originated from the main database or were user created. Use a data bound control to update each one of these images and counterpart black and white mask to this project database file. Also update information that is bundled with each control; information such as Product name, database name, product ID and company or general group. Close the new project database file. This information in the project file should allow a project to be loaded later and reconstructed to the original configuration. This process consists of reading each record, retrieving the background, opening a new MDI child form and placing all the remaining objects in movable controls over the background.

4.3.5.2 Step 242—Exporting a Project

To export a project, the following steps occur. Create a form and place controls that allow the user to type in a file name and choose from a valid directory. Also display all the support file formats such as extension PCX, BMP and TIF. Create lookup table according to all format specifications for available options for each format. Allow user to select any of these available combinations using radio button controls or their equivalent. For example, if the user wishes to export a PCX format, allow the user to select options such as available bits per pixel, such as 8, 16 and 24. Also, each format may have a number of available compression options. Allow the user to select from a Pull-down combo box control these available compression options. Controls such as VBX controls commonly allow saving a bitmap to a particular format just by setting several properties. Cycle through all the bitmap objects that originated from the database or were created by the user from the background.

Use the Windows API BITBLT function that is used conventionally to combine bitmaps, to integrate the background and all the bitmap images into one bitmap in the control used for saving. The API function should be used in combination with the image counterpart black and white mask. This allows for part of the bitmap to be intergrated while others are not. An example is a tree which is not a rectangular image although the bitmap containing the tree is rectangular. In combination with the mask, the image of the tree that holds the leaves and the other parts of the tree are copied to the background while the areas around the tree and in between the leaves are not copied. This shows the background through the "see through" areas of the tree such as the areas in between the leaves. This process includes using BITBLT function by "Anding" (SRCAND) the mask and the "Oring" (SCRPAINT) the image bitmaps to the bitmap containing the background. Set the properties, on this control holding the bitmap, necessary to save a bitmap such as compression factors, file format, file name, and valid path. Close the form and return to the current project.

4.3.5.3 Step 244—Printing a project

To print a project, the following steps occur. Create a form that allows the user to select and preview the project to be printed. Detect printer settings so as to create a preview of the hard copy to be made. Take into consideration paper orientation so as to present the correct preview. Cycle through all the bitmap objects that originated from the database or were created by the user from the background. Use the Windows API BITBLT function that is used to combine bitmaps, to integrate the background and all the bitmap images into one bitmap in a control used for printing. The API function should be used in combination with the image counterpart black and white mask. This allows for part of the bitmap to be intergrated while others are not. An example is a tree which is not a rectangular image although the bitmap containing the tree is rectangular. In combination with the mask, the image of the tree that holds the leaves and the other parts of the tree are copied to the background while the areas around the tree and in between the leaves are not copied. This shows the background through the "see through" areas of the tree such as the areas in between the leaves. This process includes using BITBLT function by "Anding" (SRCAND) the mask and the "Oring" (SCRPAINT) the image bitmaps to the bitmap containing the background. This control holds the bitmap that will be printed. Controls such as VBX controls conventionally allow printing the bitmap found in the control by setting properties to specific values. These values, such as print to page size or to specific size, are assignable to properties for the control. Place controls on the printing form to allow the user to choose printing options fit to page or print to actual size. Change the preview control in size and orientation so as to simulate what the print out will look like. Once the user is satisfied, set the properties in the control holding the bitmap used for printing so that it will print to the users specifications.

4.3.5.4 Step 246—Shopping List

This feature allows the user to print or export to a file the list of products and items used in the current project. To create a shopping list, the following steps occur. The list of items originates from all the controls that are placed over a background and that are still active and moveable. The user can choose to print the list of items or to save it to a text file. Cycle through all the controls containing bitmaps over the background and read the indexed array containing information related to the images. Group images that have the same product and company name so as to create a list that shows the quantity of similar objects. For example: a garage door from the database appears twice, the list reports a quantity of 2. Both the printed and saved Shopping List contain Quantity, Company or General Group and Product name. Use the conventional programming practice to print text by use of a printer or to save text to a text file. Use a Visual Basic common dialog control type to allow the user to enter a valid filename and path in the save to file option.

4.4 Data Structures—Overview

One of the objects of invention is to allow the user to visualize how real items from the real world would look on a given environment. Normally, it is difficult to visualize how a remodeling, reconstruction or landscaping project would look when completed. The invention allows users to preview and experiment dynamically with different object arrangements and ideas. It is an interactive system that allows the user to select and "try out" a large number of items on the current background.

In the preferred embodiment, a Microsoft Access relational database ("Microsoft Access" is a registered trademark of Microsoft Corporation) is used in the computer program in the practice of the invention. It is to be understood that any equivalent database may also be used in the practice of the invention.

A relational database is a computer file that is composed of different tables. Each table holds information on records. Each record is composed of fields. Each field is used to hold information and bitmap objects. The bitmap objects are items from the real world, such as wall siding, windows, doors, trees and brick, to be applied to the environment. Traditionally images and clip-art to be used in composition environments have been saved in file formats known as extension BMP and TIF, among others which normally contain single bitmap image files. By placing objects in the database, the following differences and advantages may be realized:

1) Information about these objects can be stored in the related record such as:

Product name (fictitious examples: Garage Door Traditional Style)

Product vendor or Line (fictitious example: ABC, Inc.)

Product category (fictitious example: Exterior Images)

Product sub-category (fictitious example: Garage Doors)

Manufacturer phone number (fictitious example: 555-5555) Other relevant fields of information depending on the type of product This database structure allows every object to have relevant information for use in sorting, searching and understanding the characteristics of the product to be used in the composition background. These bitmap composition programs are not known to have a source of structured product information (e.g., information such as product name, vendor, manufacturer, etc.).

2) Information is saved in different tables such as:

Category names

Sub-category names

Company names

Company Logos bitmaps

Company backdrops bitmaps

This relational database permits supplementary information to be stored on products on different tables. The structure permits more information to be shown on objects when requested by the user, such as the company logos, backdrops and information.

3) Due to the database structure, the information is presented in a way to allow the user to search the following manner:

Product Vendor or Line

Category

Sub-category

Actual products By means of SQL queries characteristic of relational databases, bitmap objects stored in the database are presented to the user on the screen display in an organized manner. Selecting a product vendor category performs a query to update and provide available Categories and Sub-categories to the user. Selecting a Category performs a query to update and provide the available Sub-categories to the user. Finally the user can select to preview bitmap objects from the current sub-category. The approach is believed to be a highly organized manner of previewing bitmap objects and is a unique feature of the invention.

4) The user can view product information. The information available to the user is displayed by category on the status bar on the screen. Further information can be viewed by "clicking" on the company logo or sub-category logo for that bitmap object. The product information for each bitmap is obtained by SQL queries. The combination of previewing images with information to be used later in the composition is unique feature of the invention.

5) The user is able to "drag" or select an object originating from the database to be placed over the bitmap background that forms a composition environment. At this point a new object is created to hold the bitmap that is retrieved from the database. The objects are indexed, the first object in the first project is referenced as 1-1, the second object in the first project it is referenced as 1-2, and so forth. For example, in the case of the first object the system program proceeds to attach information about that particular object in the object's array position 1-1. The information attached is relevant to the particular object, such as product name, ID number reference in the database, company and database name. This information follows the object no matter where it is located in the background environment. The ID reference to that database is used upon user request for more product information. This is done by performing a query to the database using the ID number as a search criteria.

6) A bitmap is an 2 dimensional array of pixels each representing a color. A bitmap can hold a digitized image. With 8, 16 and 24 bits per pixel color resolution, it is possible to produce a high quality image representing the item from the real world in a realistic manner. In color resolutions such as in 16 bits per pixel there are 16 bits of information per pixel allowing a possible range of about 65,000 colors. With such resolution, it is possible to meet current public expectation on realistic quality allowing users to experiment with different items from the database and arrive at different possible scenarios.

The invention provides a dynamic and interactive program that combines the capability to view two or more bitmaps objects 260 from the database and to do so with product information 262. It allows the user to select or "drag" objects to the project environment and experiment with over 1,000 different images that are stored in the database as well as objects saved in a second database which can be updated by the user. The user can then position and accommodate these bitmaps objects onto the environment 250 in such precise way to create different scenarios.

The invention provides a precise means to visualize changes because the system uses a mask per bitmap object. By combining the mask with the bitmap and the background, a seamless integration is achieved. The user is also allowed to fit the image precisely into areas by using a set of tools provided, such as force fit into the area or by sizing the object a pixel at a time. Through the combination of these and other features, bitmap objects are integrated without visible seams to the background. For example, the placement of a bitmap of a tree selected from the database, once placed over the background, will show areas that are around the outline of the tree itself as well as areas of the background that show through branches and leaves.

4.4.1 The Database Structure—Data Related to Image Objects

Data (object information 262) originates from the database and is either tagged to the objects once out of the database in the project or linked to by database volume name and product/object ID.

The fields listed below are the items related directly to bitmap products/objects. The list includes fields that are linked with fields in other database tables for additional information. For example, the Company field allows the linking of a table that has more information on the company. The fields are those in the database that provide most meaning to the user and more functionality to the program (actual field names in the list provided).

Unique ID A unique number that is used to link the object back to the database once in the project.

Item ID A combination of category and sub-category numbers

Category ID Category number

Sub-category ID Sub-category number

Item name The name of the bitmap of product

Company Company name or if no company then the general group name

Product support phone number

Product support E-mail address

Price Price information 1

Price2 Price information 2

Units Units of product for the stated price (if applicable)

Conditions Conditional statements related to the item

Image The product image

Mask The image counterpart mask

Thumb The thumbnail version of the image for quick display and preview

Compression Type of image compression (used as reference)

Qfactor How much image compression (used as reference)

Fields with Functionality emphasis

Masked Does the image have a mask; if not, one is created on the fly on image retrieval Size Factor What size the image should come at, for example ½ re-sizes brings the image to half the size Variable fields according to the type of object Rmodel: Field 1

Common name

Plan name

Rdescription: Field 2

Botanical name

Plan number

Rcolor: Field 3

Hardiness Zone

Style

Rsize: Field 4

Use

Number of bedrooms

Landscape category

Rsku: Field 5

SKU number

Number of bedrooms
Ornamental Value
Rmore: Field 6
Information
Micro-climate
Number of levels
Rpattern: Field 7
Pattern
Size
Square footage
Flower Color: Field 8
FoliageChar: Field 9
FoliageChange: Field 10
FruitChar: Field 11
Texture: Field 12
Form: Field 13
Growth Rate: Field 14
Temp: Field 15
Sunlight: Field 16
Moisture: Field 17
Soil: Field 18
Region: Field 19

In the preferred embodiment, the specific columns associated with the products in the database appear in the list the following table.

TABLE

The objects once out of the database:

Listed below are the attributes that are tagged to the object bitmap that originate from the database. Listed below are the fields that have meaning to the user and keep a link to the database for retrieval of more information:

Name (Holds the name of the image item/object)

ID (Holds the ID number that the objects has in the database; used to link for more information)

CD Volume name (Holds name of the database)

Company name (Holds name of the company)

If the object is user created and has not been saved then all values are "NONE" or 0 except for Name which is allocated the following string "User Created".

As used herein, the term "means for copying and moving an object" is intended to refer to processes described in steps 202 and 204, and their equivalence.

4.4.2 Data Structure—The Unique "Link"

The data structure discussed above is unique in that a "link" relationship is established between the movable object control and the relational database containing information related to the object 260 depicted in the movable digital image (sometimes also referred to as the "movable object"). It is known in the art that programs such as that sold under the Visual Basic trademark tag information related to movable objects to controls such as size, color and other properties associated with the object. It is also known in the art that variables may be used to keep information about form, controls and other programmable items associated with the movable object. The design and arrangement of the relational database associated with the inventive computer program, however, provides advantages not found in the prior art, including a "link" from the VBX control to the place in the database where the information can be found (see computer programming code in the attached Appendix, page 300 beginning with the code "Private Sub . . . " which shows the form referred to as frm Info. Prod., page 158). The link provides the inventive computer program a means to access and retrieve more information about a particular object image. The "link" is also referred to herein as the "object data access means". The link provides a novel relationship between the movable object control and the relational database. The relationship is established in a structured array that contains the database volume name and the product identification which is depicted in the digital image comprising the movable object. The combination of the product identification with the database volume name allows a specific query to be executed that locates the exact record in the database and facilitates the retrieval of all information in the database about a particular product shown in the movable object digital image.

In one aspect of the invention, the information about a particular object 260 that is retrieved from the database and displayed on the screen may be programmed to appear in any particular order. The ordering of the information allows the invention to be practiced under circumstances where the invention operates as an advertising tool employed by vendors of products recorded in the database to market such products. Stated another way, this aspect of the invention permits apparatus 10 to be programmed so that when a system user, via the display interface, employs the data access means to access and retrieve information about an object, a product of the vendor who is willing to pay a premium for advertising can be made to appear first in the screen display. In this way, the invention may be used as a advertising and marketing tool to market vendors' products to system users who would represent the relevant purchasing market for such products.

4.5 Description of the System in Operation

Turning now the operation of apparatus 10 according to the invention, with particular reference to examples of the visualization of changes to residential houses on window displays produced on monitor 14 or in hard copy by printer 18. It will be understood by those skilled in the art that other displays may be employed in the practice of the invention.

As used herein, the term "system" is intended to mean apparatus 10 according to the invention having the operational features disclosed herein.

4.5.1. Creating a Background Image

A system user starts a project utilizing image capture means for receiving and storing a captured image of an actual environment in digital form. The captured image will form a background 250 in the window display. It is to be understood that a reference to window display is intended to mean a display created by the monitor 14, the printer 18, or both.

As previously indicated, the image capture means in the preferred embodiment comprise; (1) importing an image file in a compatible format; (2) capturing an image from a Twain-compatible device such as a scanner, a digital camera, or a video camera; (3) pasting an image from the Microsoft Windows Clipboard; (4) retrieving an image from a previously saved project; or (5) retrieving an image from the CD-ROM Database.

The discussion will now turn to the procedure by which a user can create computer generated displays using apparatus 10 programmed with the functionalities as set forth above that permits visualization of changes to the interior or exterior of a building structure shown in its actual environment. The procedures are set forth below and were also used to generate the screen displays appearing in FIGS. 18–26 by the operation of apparatus 10.

Step 1

Choosing Background Image. The system user determines whether to use a photograph of the home, a digital image of a home in the CD-ROM Database or a home in an existing project on the user database. The next step is to bring one of these homes (images) into the project work space 252. The method of choice is started by clicking on the topic icon for step-by-step instructions, which provides the following features in the screen:

a. Open Project—to open a pre-existing project. The user in given the choices of a quick tour tutorial to learn how to open projects or selecting a saved project.

b. Import—to import an image (graphics file) of a home. The system user may select a scanning service to scan a photograph of a home onto a diskette. The scanned image is a graphics digital images file and can be imported into the system program. The system user may also select other graphics images of other homes or products from the CD ROM database.

c. Open the CD-ROM Database—The system user may select a model home from a site planning category of the CD ROM database to create a particular home, or view other homes for ideas.

d. Open from Scanner/Camera—The system user may scan into the system photos or blueprints by means of a scanner, a digital camera or camcorder with a frame grabber. The background can be created from any source described above once the background appears on the screen.

Step 2

Touching Up the Image. If the home background selected has an object (such as an old mailbox) that the user wished to remove, a flaw in the photograph that the user wishes to touch up, or if the image needs to be sharpened or brightened the user employs the drawing program or the adjustments tool that appears on the screen. Both these tools are useful at the end of a project when the user is ready to put on the final touches.

Step 3

Selecting Products from the CD-ROM Database. The user selects objects from hundreds of products or images from the database for placement on the background. The user may be select, for example, plants, trees and shrubs; siding and paint; or adding a deck or pool. A "Click" function is provided to the user to access instructions on selecting objects from the database.

Step 4

Using the Video and Step-by-step How-to's. As the user selects and adds products and images to the project background, other program tools and features are also available to make objects fit, serve as patterns, or replace other items in the background image. Visual demonstrations and step-by-step instructions on the tools and techniques are provided to the user. The user can click on topics of choice, or review topics later from the table of contents of the on-line manual. The on-line manual can be accessed at any time from the help menu.

Step 5

Gluing Objects to the Background—As the user progresses in the project, he may place many objects on the project background. Eventually the user may need to glue some of the images to the background, making them a permanent part of the project because of limited computer memory. Objects at the bottom of the stack must be glued first.

Step 6

Deleting Unnecessary Objects—Another way to keep the project clean and conserve memory, reducing the size of the project, is to delete any objects that are no longer needed. Often when making patterns and objects from the background image, the user can end up with objects that he doesn't realize are still there. To find unnecessary, hidden objects in the project, the program is provided with an object list.

Step 7

Continue to Save or Archive—The user who wishes to keep a record of the project at various stages, may do so by using the "Save Project As," giving each phase of the project a different file name.

Step 8

Final Touches—To add even more realism to the project, the user may add shadows, use perspective or change the lighting (time of day), and how-to's: step-by-step instructions for additional tips and tools are provided. The user may use the drawing program again at the end of the project to "clean up" the image.

Step 9

Print a Copy of the Project—To produce a printed copy of the project (e.g., to show a contractor, client, or other person), a print function on the file menu is provided.

Step 10

Export Project Image—The user may make a final project into a graphic image by using the export function. This will provide a copy of the project into another computer program or make into a slide. When a project is exported as a graphic file, all objects in the new image file are a permanent part of the image and are no longer able to be edited or manipulated.

Using the User's Own Photographs

Listed below are options for getting photographs or pictures into the program.

Scanning

A common way to get pictures into the software is to use a scanner. Most scanners are Twain-compatible, but some are not. After the user installs the scanner according to the manufacturer's directions, the following steps are followed to scan an image into the system:

To use a Twain-compatible scanner

1. The user selects the photograph or picture for use.
2. The user opens the scanning application.
3. The user clicks the scan icon on the toolbar or go to Open from Scanner/Camera on the File menu.
4. The user selects the scanner as the source.
5. The user refers to the scanner user's manual to proceed with the scanning process.
6. When the user is finished scanning, the image appears on the screen as a new project. At this point, the user has the option to save the image before beginning work so that the scanned file is created to use again. The user may use the image file on another project or creates a back-up copy. Directions on saving the image file are provided with a click function.
7. The background image is now ready for use.
8. A save function and instructions are provided to save the project. Directions on saving the project are provided by click function.

To use a scanner that is not Twain-compatible

1. Select the photograph or picture for use.
2. Scan the picture and save it onto the hard drive. Refer to the scanner user's manual for instructions on scanning and saving.
3. Once the picture is saved, close the scanner software application.
4. Open the scanning application.
5. Now open the picture file using the "import" function under the "file" menu, retrieving the file from wherever it was stored while scanning. The background is now ready for use.
6. The user may save the work as a project. After saving as a project, the user can continue to add, change and move objects on the project background. This will save the work done as a separate file from the original scanned image. Directions on saving the project are provided by a click function.

Digital Cameras

With a digital camera, a picture can be taken and instantly imported into the system. Most digital cameras are Twain-compatible, but some are not. After the digital camera is installed according to the manufacturer's directions, the steps below are followed:

If the digital camera is Twain-compatible

1. Take a picture with the digital camera. (Refer to the digital camera user's manual for instructions.)
2. Open the scanning application.
3. Go to open from scanner/camera under the file menu, or click the open from the scanner/camera icon on the toolbar.
4. The scanning application will then access the digital camera software within the scanning application.
5. Refer to the digital camera user's manual to import the digitized photo.
6. The image imported by the user appears on the screen as a new project. At this point, the user will have the option to save the image before beginning work so that the digitized file may be used again. The user may also use the image file on another project or create a back-up copy to start over. Directions on saving the image file are provided by a click function.
7. The image is now ready.
8. The work may be saved and directions on saving the project are provided by a click function.

If the user digital camera is not Twain-compatible

1. Take a picture with the digital camera. (Refer to the digital camera user's manual for instructions.)
2. Import the picture and save it onto the hard drive. Refer to the digital camera user's manual for instructions on importing and saving.
3. Once the picture is saved, close the camera software application.
4. Open the scanning application.
5. Now the picture file may be opened using the "Open Image" (import) function under the File menu, getting the file from wherever it is stored while operating in the camera software. The user is now ready to work on the image on the screen.
6. A save function is provided to save the project. Directions on saving the project are provided by a click function.

Video Cameras

A video interface hardware to capture a frame from a video tape and import it into the program may also be used to create a background. Most video interfaces are TWAIN-compatible, but some are not. This can be determined by looking at the literature provided with the video interface. After the user installs the user video interface according to the directions that came with it, follow the steps below:

To import a frame from a video interface that is Twain-compatible

1. Record the picture intended to be brought into the scanning application with a video camera.
2. Connect a video interface to this computer. Follow the connecting directions in the video interface user's manual.
3. Open the scanning application.
4. Click the open from scanner/camera icon on the toolbar or go to "open" from scanner/camera under the File menu.
5. Refer to the video interface user's manual for instructions on how to import a frame of video as an image file.
6. When the user is finished importing the frame, the image just imported appears on the screen as a new project.

At this point, the user has the option to save the image before beginning work so that the image file may be used again. Directions on saving the image file are provided with a click function.

7. The user now can work on the image.

To import a frame from a video interface that is not Twain-compatible

1. Record the picture into the scanning application with a video camera.
2. Import the picture and save it onto the hard drive. Refer to the video interface user's manual for instructions on importing and saving.
3. Once the picture is saved, close the video interface application.
4. Open the scanning application.
5. Now open the picture file using Open Image (Import) under the File menu, getting the file wherever it is stored while in the video interface software. The user may then work on the image on the user screen.

The Drawing Program Feature

Figure 28:
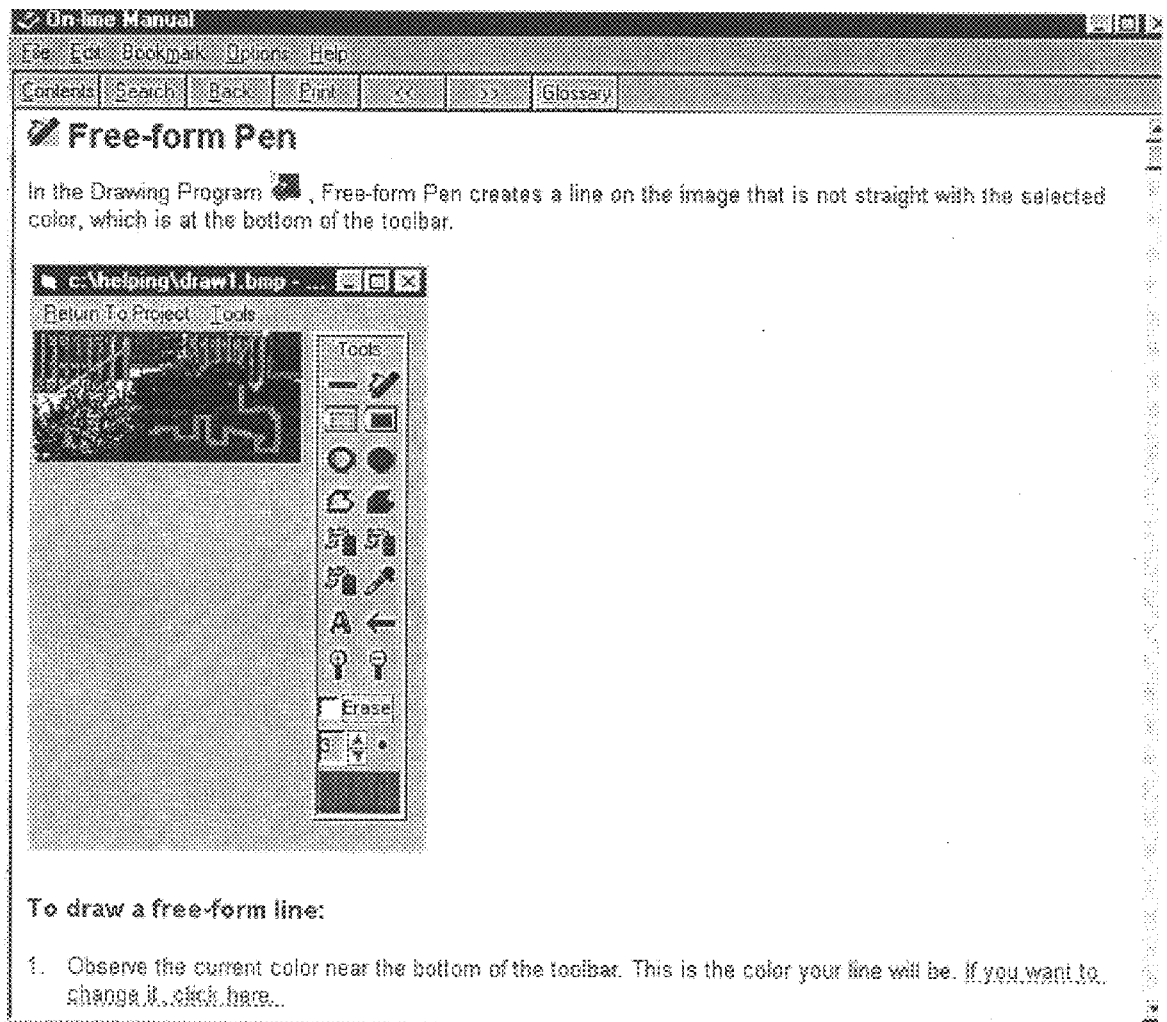

The background 250 may be touched up using a drawing program that may be accessed through an icon toolbar, as shown in FIG. 28. A conventional drawing program can be used for touching up images by drawing on them with numerous tools, including spray cans and an erasing tool. The drawing program also is useful because it can zoom in more than can be done in the main system. To start the drawing program, the system user clicks on the drawing program icon on the icon toolbar. If an object or image already has been selected, the selection is taken into drawing program to work on. If nothing was selected, the fixed image is taken into the drawing program without any of the objects or products that have been added to the fixed image. As a system user works on the image, the tool being used is shown at the bottom of the toolbar. When the system user is finished using the drawing program, the system user selects the Return To Project menu. If the system user selects Update Changes to Project, the object or fixed image comes back into the main system with all of the changes made in the drawing program and is permanently changed. If the system user selects Do Not Update to Program, nothing is changed on the current project.

4.5.2 Applying Objects to the Background

Once a fixed background image has been created, the system user must next select digital images of objects from an object catalog. The object catalog is a CD ROM database collection of products and images. In the preferred embodiment, the collection of products and images are arranged in categories and subcategories. A category is the first layer of organization of the database products, and all products fall into one of the categories. A subcategory is the second layer of organization of the CD ROM database products. In addition, a Product Lines field gives the system user the option to view the products of all of the available product lines in the CD ROM Database or only one product line at a time. The product line selected by a system user is displayed at the top of the database window and can be double-clicked for more information on the product line and the vendor. To select images and products from the CD ROM database, the following nine-step sequence is utilized:

1. The system user clicks the CD ROM icon on the toolbar and a database bar appears.
2. If it is desired to limit the search of the database to a particular product line instead of all product lines, a pull down menu is used to choose a particular product line.
3. The system user then chooses a category from the pull down menu. A category is the first layer of organization of the database products. All products fall into one of the categories.

4. The system user chooses a subcategory from the category just selected.

Figure 26:
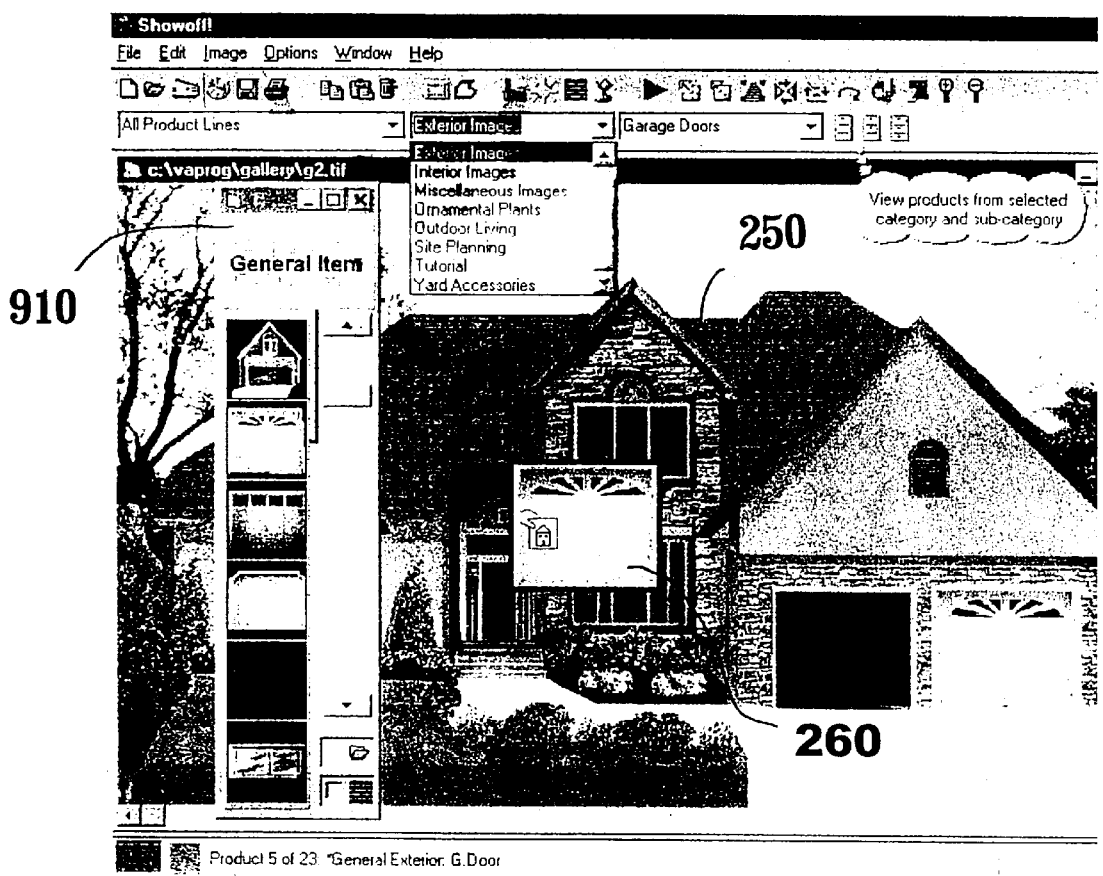

5. The system user clicks on one of the three database buttons to make a database display box appear as shown in FIG. 26.

6. Up to three display boxes can be on the screen at once. If a database display box is already active and the system user wishes to display a different subcategory in that box, the system user selects a new category and subcategory, and clicks on the first database button.

7. The system user can scroll down the scroll bar on the right or use the up and down arrows to see the items available. The red line on the right indicates what object is being displayed. The name of this object is seen in the Information Bar at the bottom of the screen. The company that makes this product is displayed in the box at the top. If the product image was not provided by a specific manufacturer, it will say General Item.

8. While scrolling through the products in a subcategory a system user can mark an item to be able to see it later by right-clicking and selecting Bookmark with the left mouse button. A small yellow bookmark appears in the corner of the picture. It will stay there as long as that display box remains open.

9. To select an item and place it in a project, the item is dragged and dropped onto the project window. The item also may be double clicked to automatically place it in the project.

4.5.3 Opening and Editing User Database

To open the user database and select an individualized object of it, the system user first clicks on the CD icon on the toolbar. Next the system user clicks on the user database icon at the end of the database bar. When the user database appears, the system user selects the image to be used in the project from the pull down menu, illustrated in FIG. 27 and then clicks select.

To add an object to the User Database, the system user selects the image desired to be stored with a rectangular or polygon tool, or by selecting it from the CD ROM database if that is where the image originated. The system user next right-clicks on the object and chooses Add to User Database. In the resulting dialog box, the system user then types in a name to call the object and clicks OK.

4.5.4—Miscellaneous Features

Using Area Selector Tool

Utilizing the icon toolbar, a system user can define or select areas of an image using a rectangular tool and a free form tool. To use the rectangular tool, the user clicks the Rectangle on the toolbar. The curser then turns into cross hairs and a system user places the cross hairs at the top left corner of the rectangular area to be selected. The system user clicks and drags the cross hairs to the bottom right corner of the rectangle until it is as big as desired. The mouse button then is released and the rectangle is created. A duplicate of the image is then formed to move something in the image, cover other parts of the image, paint with opacity color, thereby painting a house or object, fill with Current Pattern (such as bricks), use with the Paste Into Object command, fill with solid color and use with the Skew and Perspective tool.

To select an irregular shape area of an image, the system user uses a free form object tool from the icon toolbar. To create a free formed object, the system user clicks on the free-form object tool and an arrow appears. The system user then begins to draw the outline of the free-formed object by clicking to mark a starting point. As illustrated in FIG. 28, at each place where the object curves or changes directions, the mouse is clicked to pin down the outline. When the system user has gone all the way around the object and is back to the starting point, the system user right-clicks the mouse and selects Complete Operation. The free form object tool allows for irregular shaped areas to be selected in order to move something in the image, cover other parts of the image, Paint with Opacity Color (thereby painting a house or object), fill with current pattern (such as bricks), fill with a solid color and use with the Skew and Perspective tools. At any time while making a free-formed object, the system user can right-click and select Erase Last Line to undo the last click that has been made as far back as the second click. The system user also can right-click and Cancel the Operation at any time.

Tools for Editing Images

The system includes a plurality of tools for editing the composite image, the background image, and an object before the object is merged into the background. Using the Fill With Current Pattern command, a selected area of an image may be filled with a currently defined pattern.

Fill an Object with a Pattern

Figure 29:
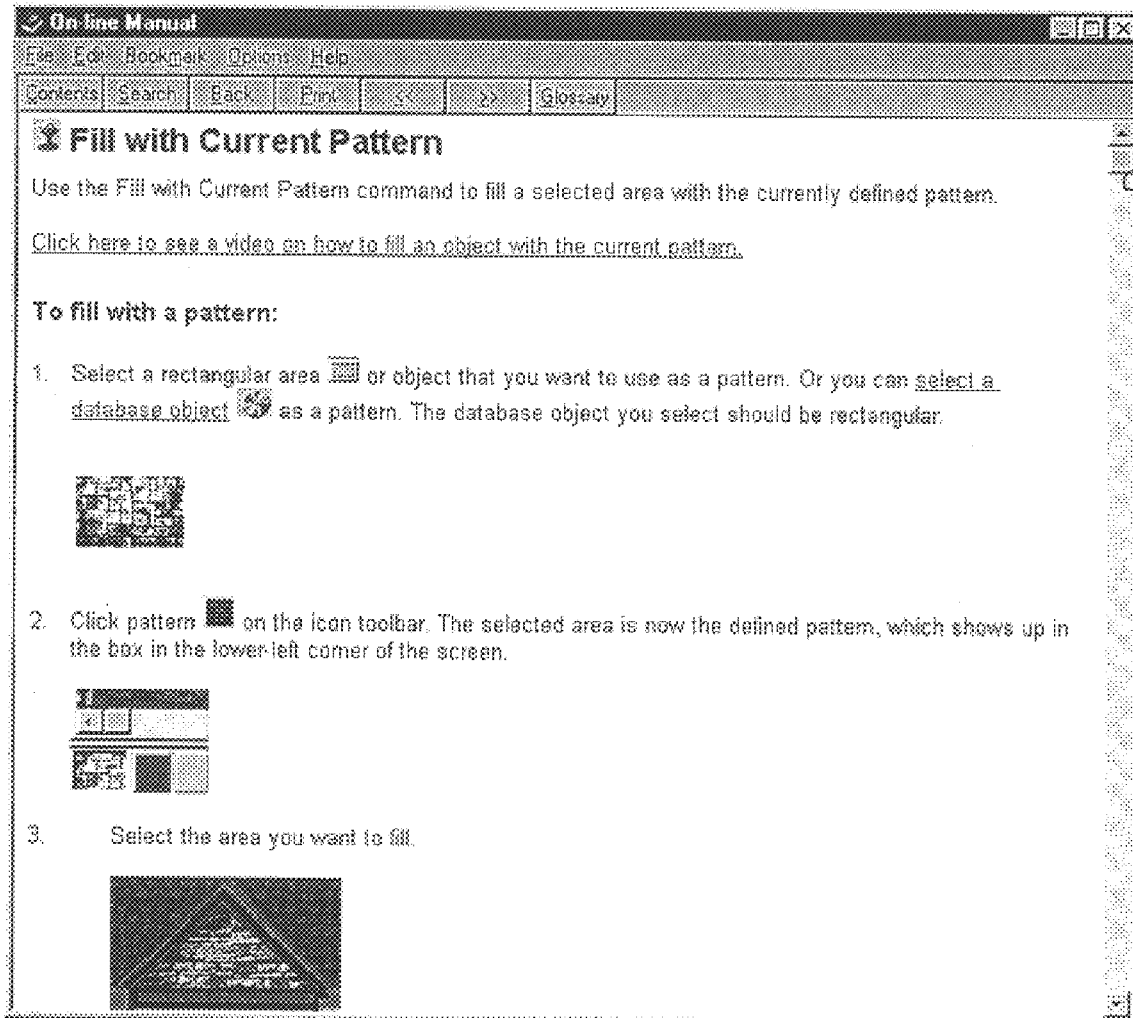
Figure 30:
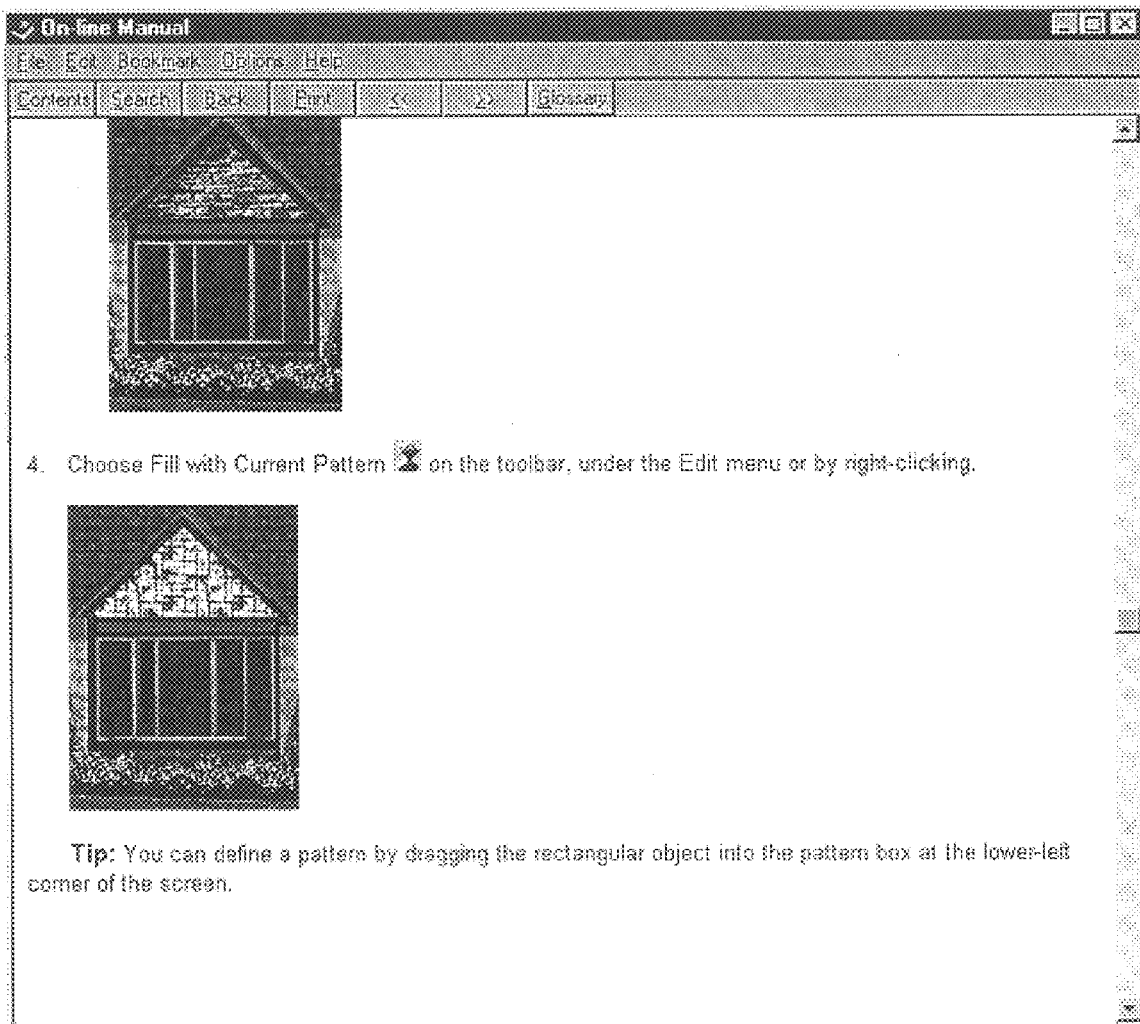

To fill with a pattern, the system user selects the rectangular area desired to be used as a pattern. Alternatively, the system user can select a database object as a pattern, as long as the database object is rectangular. Next, the system user clicks pattern on the icon toolbar. As illustrated in FIG. 29, the selected area is now the defined pattern, which shows up in the lower-left corner of the window. Using the rectangle tool or the free-form object tool, the system user selects the area to be filled with the pattern, as shown in FIG. 30. Next, the system user chooses Fill with Current Pattern on the icon toolbar under the Edit menu or by right-clicking the mouse.

Resizing an Object

Figure 31:
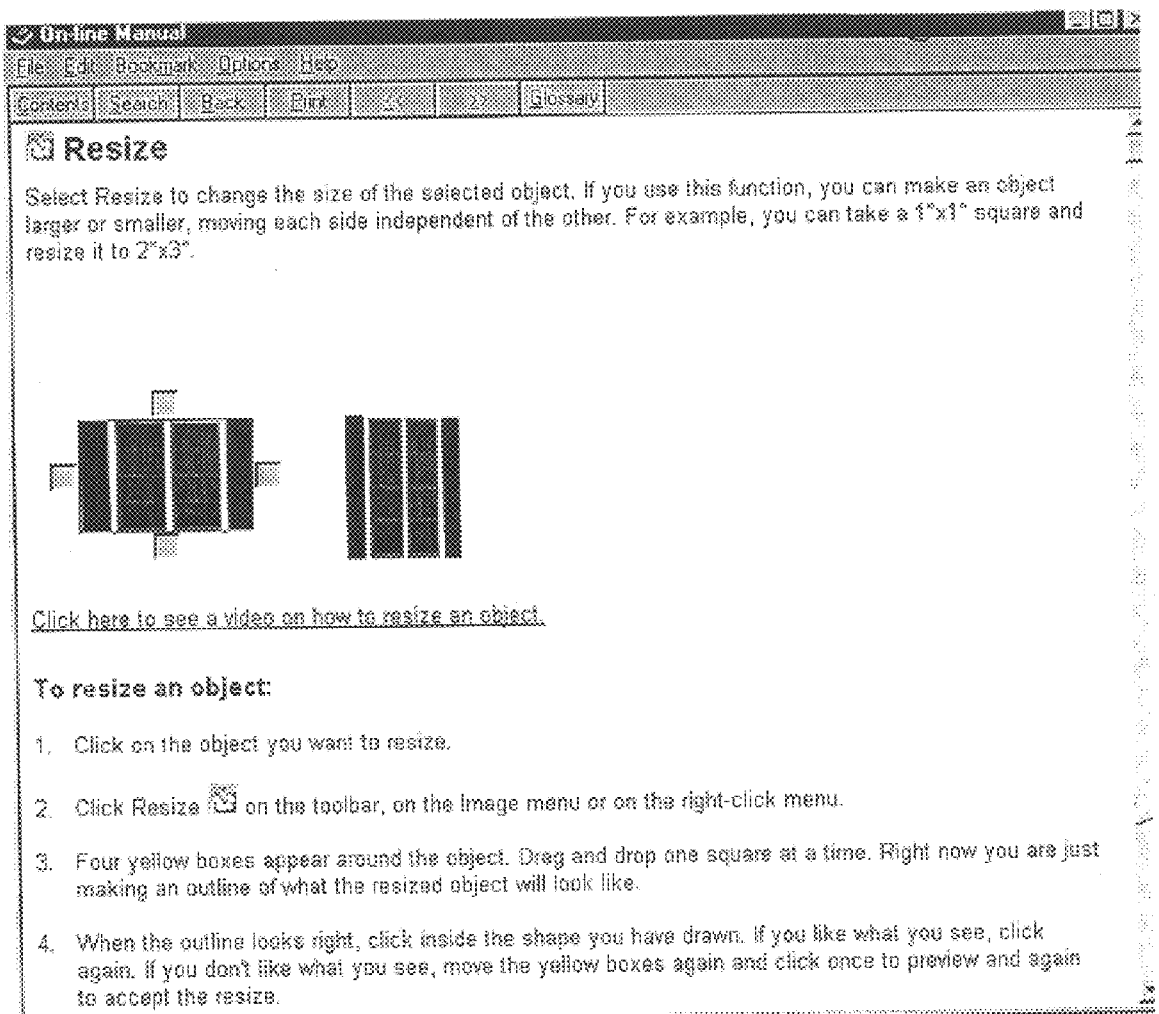

The system user also can resize an object and thereby make the object larger or smaller in one direction than in another. To resize an object, the system user first clicks on the object to be resized. The system user then clicks "Resize" on the icon toolbar, under the Image menu or on the right-click menu. As illustrated in FIG. 31, four yellow boxes then appear around the object. The system user drags and drops one square at a time in order to make an outline of what the resized object will look like. When the outline appears to be the desired size, the system user clicks inside the shape that has been drawn. If the system user is satisfied with the result, the mouse is clicked again. If the system user is not satisfied with the result, the system user may move the yellow boxes again and click once to preview the resized object and again to accept the resizing of the object.

Figure 32:
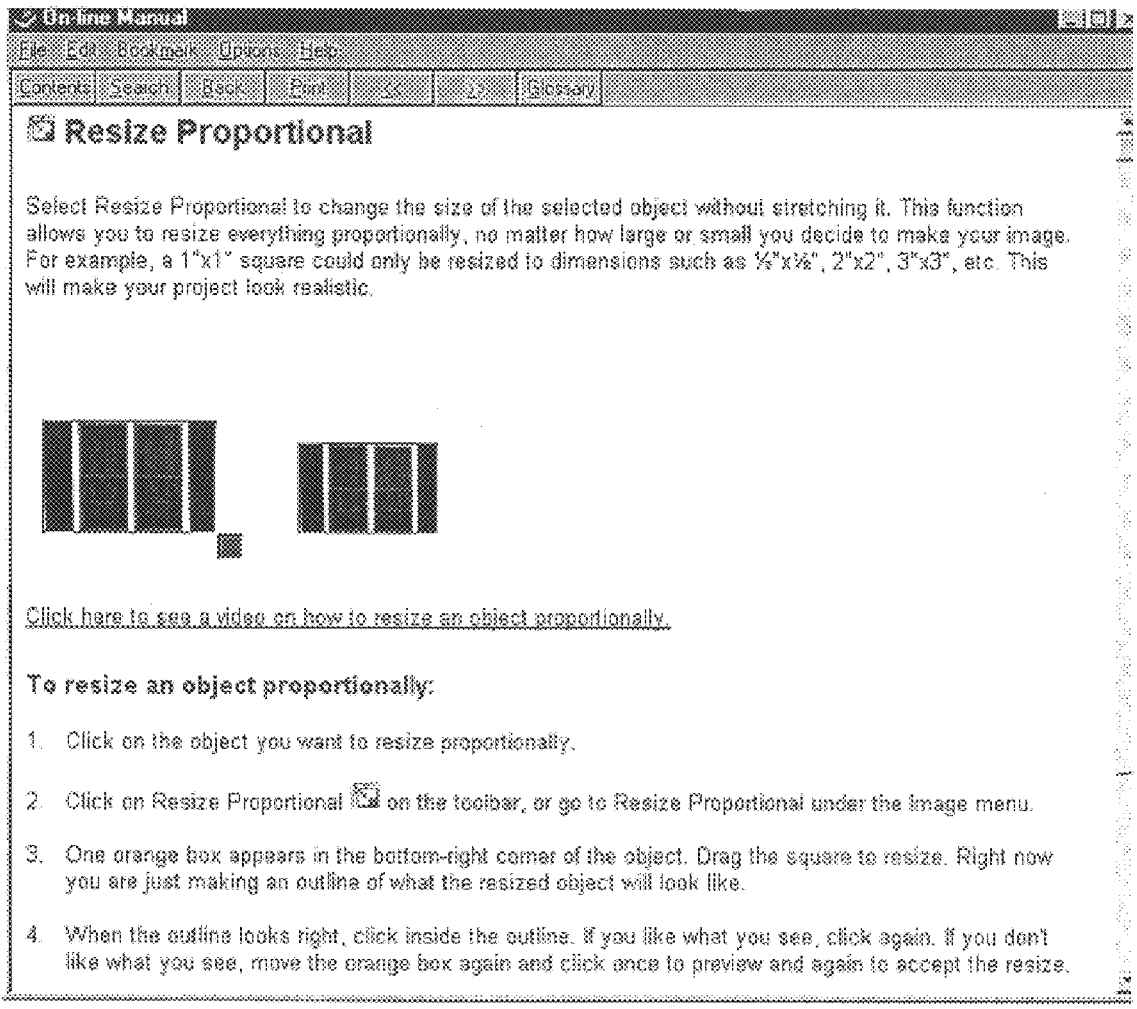

Alternatively, the size of a selected object may be resized without stretching it. This function allows an object to be resized proportionally, no matter how large or small the object is to be resized. To resize an object proportionally, the system user clicks on the object sought to be resized. Next, the system user clicks on "Resize Proportional" on the icon toolbar, or selects "Resize Proportional" under the Image Menu. A box or square appears in the bottom-right corner of the object, as illustrated in FIG. 32. To make an outline of what the resized object will look like, the system user drags the square to resize the object. When the outline of the resized object looks correct, the system user clicks inside the shape that has been drawn. If the results are satisfactory, the system user clicks again inside the shape. If the results are unsatisfactory, the system moves the orange boxes again and clicks once to preview and again to accept the resize.

Paint with Opacity

Figure 33:
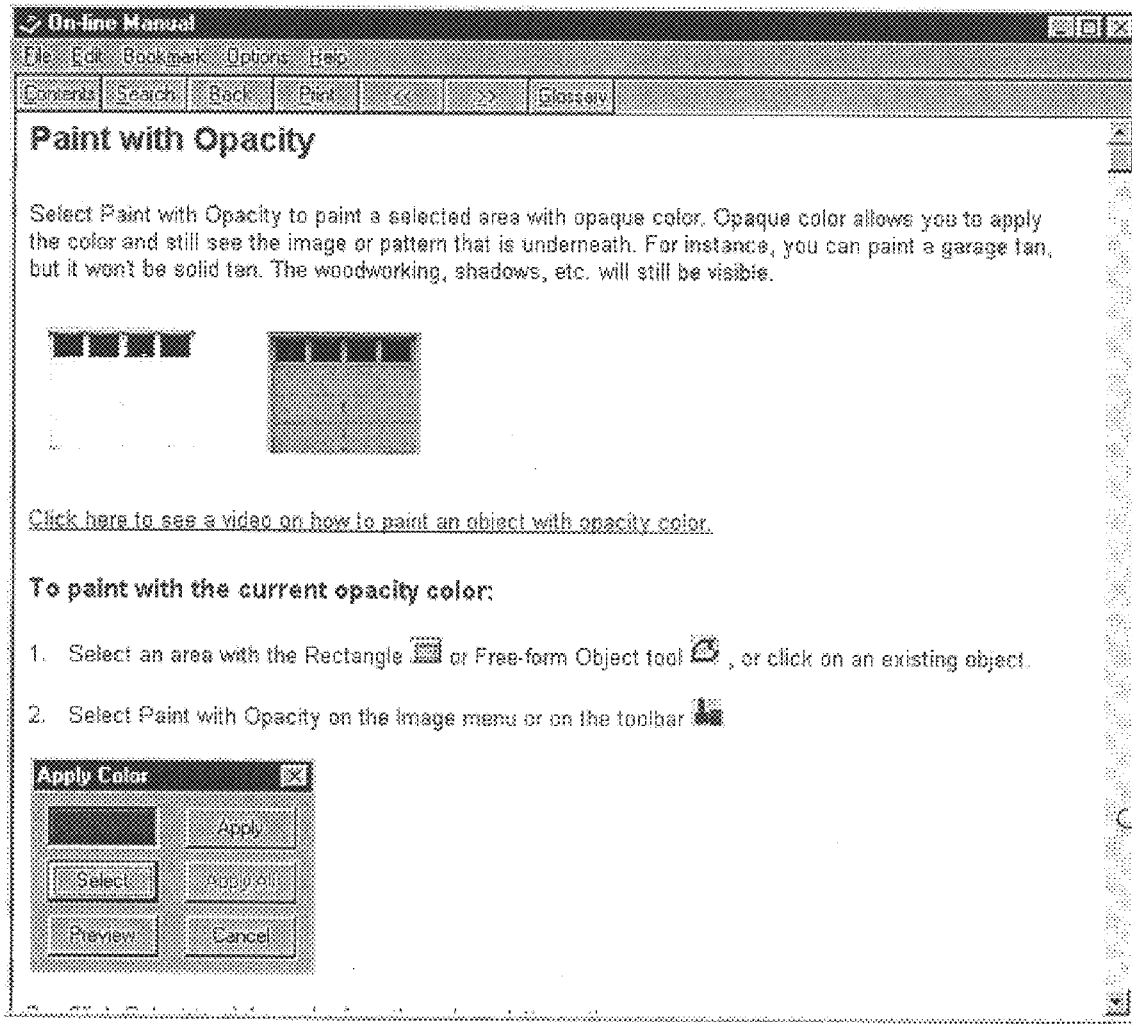

The system also allows a selected area to be painted with opaque color. Opaque color allows the color to be applied, yet permits the image or pattern that is underneath to remain visible. For instance, as shown in FIG. 33, a garage can be painted tan, but it will not be a solid tan; the wood working, shadows, etc., will still be visible.

To paint with the current opacity color, the user selects an area with the rectangular or free-form object tool, or clicks on an existing object. Next, the system user selects Paint with Opacity on the Image menu, on the icon toolbar, or by right-clicking. The system user next clicks Select in the dialog box as illustrated in FIG. 33, to pick a color from the color pallet on the screen. Clicking Preview allows the system user to see what the color looks like on the image behind the dialog box. If the system user does not like the color chosen, the Select button may be clicked again, and another color chosen. When the system user is satisfied with a color, the Apply button shown in FIG. 33 is clicked. The system also allows the system user to create a custom color with which to paint an object.

Force-Fit Into Rectangle

The system allows the system user to resize a copied image into a selected rectangle on the fixed image thereby stretching the copied image to make it fit into the designated rectangular area. To force fit into a rectangular area, the system user first selects a background image from the database or selects a user inputted background image. The system user next clicks the CD database icon, selects a category, selects a subcategory and clicks on one of the three database buttons to make a floating database appear. The system user then selects a product by clicking on its picture and dragging it onto the product. The product is now a selected object. The system user clicks the Copy Special icon on the icon toolbar or chooses Copy Special under the Edit menu. The system user clicks the rectangle tool icon, and outlines a rectangular area on the project into which the database object is to fit. The system user next goes to the Paste Into Object item under the Edit menu, and chooses Force-Fit Into Rectangle. The product selected will fit exactly into the rectangular area chosen. If a product that is not rectangular is chosen, the outer-most points of the object will fit exactly into the rectangle.

Proportional-Fit Into Rectangle

Alternatively, the system allows an image to be pasted into a rectangular area proportionally. If the image will not fit proportionally into the selected area, a dialog box will appear stating how far off the image is from fitting by percentage. This will make the object being pasted fit vertically into the selected rectangle, but be off horizontally. The object will get smaller or larger, but it will never be stretched (distorted) using the Proportional-Fit Into Rectangle command.

To proportionally fit an image into a rectangular area, the system user chooses a background image from the database or selects a background that has been inputted into the system. The system user next clicks the CD database icon, selects a category, selects a subcategory, and clicks on one of the three database buttons to make a floating database appear. A product is selected by clicking on its picture and dragging it onto the project. The product is now a selected object. The system user then clicks a Copy Special icon on the icon toolbar or chooses Copy Special under the Edit menu. The system user clicks the rectangle tool icon and icons a rectangular area on the project. The system user goes to Paste Into Object under the Edit menu, and chooses Proportional Fit into Rectangle. A dialog box appears informing that the destination area is off by a calculated percentage. The system user chooses Yes to paste the product into the selected area. The product is now pasted into the rectangular area without distorting its dimensions. Because it is not distorted, it will be narrower or wider than the rectangle into which it was pasted.

Adjustments to the Image

The system also allows the system user to change the brightness, contrast and sharpness of the composite image. Using a brightness tool, the system user can lighten or darken a fixed image, a database object on a fixed image, or any selected area on the window. If the system user only wants a part of the picture to be adjusted, that part of the picture is selected with the rectangle tool or free-form object tool. If the brightness of the whole picture is to be adjusted, nothing is selected. The system user then selects Adjustments from the Image menu, right-clicks to select Adjustments, or selects the Brightness icon from the icon toolbar. If only a selected object is to be adjusted, the current object in the lower-left corner should be selected. If the whole picture is to be adjusted, Background in the lower-left corner is selected. The system user may slide the scroll bar to the right to increase brightness and to the left to decrease brightness. The adjustments in the brightness can be seen automatically on the picture behind the adjustments dialog box. The system user may click Reset to go back to a zero value, which is the starting brightness. To accept the change in brightness, the system user clicks OK; to reject the change in brightness, the system user clicks Cancel. If the system user clicked OK and then decides the result is unsatisfactory, the system user may use the Undo function under the Edit menu.

The system also allows a system user to adjust the brightness of a group of objects. To do so, the system user clicks on the first object in the group, creating a blue outline around it. The system user presses Shift while clicking on the rest of the objects in the group, creating red outlines around them. The system user then selects Adjustments from the Image menu, or right-clicks and selects Adjustments. The system user may slide the scroll bar to the right to increase brightness and to the left to decrease brightness. The adjustment in brightness can be seen in the first object that was clicked with the blue outline. This object serves as the preview for the adjustment being made to all the objects in the group. The system user may click Reset to go back to a zero value, which is the starting point. When the system user is satisfied with the adjustment in the preview object, the Apply All button is clicked.

Using a Contrast tool, a system user can adjust the amount of gradation or difference there is between the highlights, mid-tones and shadow areas of an image. The higher the contrast, the more difference there is between the color tones, while the lower the contrast, the less difference there is between the color tones.

If the system user wants only a part of the image to be adjusted, that part of the image is selected with the rectangle tool or free-form tool. If the whole picture is to be adjusted, nothing is selected. Next, the system user selects Adjustments from the Image menu or right-clicks and selects Adjustments. If only a selected object is to be adjusted, Current Object in the lower-left corner should be selected. If the entire picture is to be adjusted, Background should be selected in the lower-left corner. The system user slides the scroll bar to the right to increase contrast and to the left to decrease contrast. Adjustments in contrast can be seen automatically on the picture behind the Adjustment dialog box. The system may click Reset to go back to a zero value, which is the starting point without any adjustments. To accept the change in contrast, the system user clicks OK. To reject the change, the system user clicks Cancel. If the system user clicked OK and then decides the result is unsatisfactory, the Undo function under the Edit menu may be used to undo the result.

The contrast also may be adjusted for a group of objects. The system user clicks on the first object in the group, creating a blue outline around it. The system user next presses Shift while clicking on the rest of the objects in the group, creating red outlines around them. The system user then selects Adjustments from the Image menu, or right-clicks and selects Adjustments. The system user slides the scroll bar to the right to increase contrast and to the left to decrease contrast. The adjustment and contrast can be seen in the first object that was clicked with the blue outline. This object serves as a preview for the adjustment being made to all objects in the group. The system can click Reset to go back to a zero value, which is the starting point without any adjustments. Once the system user is satisfied with the adjustment in the preview object, the Apply All button is clicked.

Using a Sharpness tool can sharpen a blurred picture. If the system user wants only part of the picture to be adjusted, that part is selected with the rectangle tool or the free-form object tool. If the whole picture is to be adjusted, nothing is selected. The system user next selects Adjustments from the Image menu, or right clicks to select Adjustments. If the sharpness of only a selected object is to be adjusted, Current Object in the lower left corner should be selected. If the sharpness of the whole picture is to be adjusted, Background in the lower left corner should be selected. The system user slides the scroll bar to the right to increase sharpness and to the left to decrease sharpness. The adjustments in sharpness can be seen automatically on the picture behind the Adjustments dialog box. The system user may click Reset to go back to a zero value, which is the starting point before any adjustments. To accept the change in sharpness, the system user clicks OK; to reject the change in sharpness, the system user clicks Cancel. If the system user clicked OK and is not satisfied with the result, the Undo function under the Edit menu may be used to undo the adjustment in sharpness.

The system also allows for the adjustment of the sharpness of a group of objects. To do this, the system user clicks on the first object in the group, creating a blue outline around it. The system user then presses Shift while clicking on the rest of the objects in the group, creating red outlines around them. The system user next selects Adjustments from the Image menu, or right-clicks and selects Adjustments. The system user slides the scroll bar to the right to increase sharpness and to the left to decrease sharpness. The adjustment in sharpness can be seen in the first object clicked with the blue outline. This object serves as the preview for the adjustment in sharpness being made to all objects in the group. The system user may click Reset to go back to a zero value, which is the starting point before any adjustments. When the system user is satisfied with the adjustment in sharpness being made in the preview object, the system user clicks Apply All.

Flipping an Image

The system also provides certain tools to allow the system user to orient objects. One of the tools is the Flip tool, which allows the system user to flip the selected object, creating a mirror image of the original.

Figure 34:
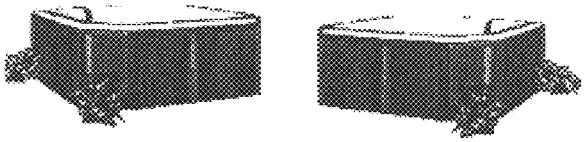

The horizontal flip function illustrated in FIG. 34 allows a system user to flip a selected image or area 180 degrees horizontally. To flip horizontally, the system user first selects the object to be flipped. The system user next clicks Horizontal Flip on the icon toolbar. The system user can also go to Flip under the Image menu, or right mouse button menu, and then select Horizontal. The object selected is now a mirror image. To get the image back to where it was, the system user can flip horizontally again or go to Undo on the Edit menu.

As illustrated in FIG. 34, the Vertical Flip function allows a system user to flip the selected image or area 180 degrees vertically. To flip vertically, the system user first selects the object to be flipped. The system user next clicks Vertical Flip on the icon toolbar. The system user can also go to Flip under the Image menu or right mouse button menu, and then select Vertical. To get the flipped object back to where it was, the system user can flip vertically again or go to Undo on the Edit menu.

Rotating an Object

The system also allows a system user to turn an object clockwise up to 360 degrees. To rotate an object, the system user first clicks on an object. The system user next goes to Rotate under the Image menu or clicks the Rotate tool on the icon toolbar. A dialog box appears with a circle and needle. The system user drags the scroll bar underneath to the right to rotate the object clockwise. As this is done, the degrees that have been rotated is indicated above the scroll bar and in the circle. The system user clicks preview to see the object rotate by the amount that has been chosen. If the result is satisfactory, the system user clicks apply; if not, the system user continues to adjust the rotation and hit preview until satisfied with the result, and then clicks Apply.

Invert Image

The Invert Image function allows the system user to make colors in the selected area opposite (green becomes red, purple becomes yellow, etc.). When used, the image changes dramatically. To use the Invert Image tool, the system user first selects an object or part of the image with the free-form object tool or rectangle tool. The user next goes to Effects under the Image menu and then chooses Invert Image. The object selected is changed. If the change is unsatisfactory, the system user goes to Undo under the Edit menu to undo the change.

Skew Object

The system also allows the system user to slant objects using a Skew tool. The Skew tool allows a user to slant a rectangular object while keeping its opposite sides parallel. This Skew tool is used to place an object into an area that is angled, matching its perspective.

To skew a rectangular object, the system first clicks on the object to be skewed. The system user next goes to Skew under the Image menu, and a dialog box appears. The system user then must decide whether to skew horizontally or vertically. A vertical skew keeps the left and right sides of the rectangle level and angles the top and bottom sides. A horizontal skew keeps the top and bottom sides of the rectangle level and angles the left and right sides. The system user enters an angle for the skew in either the horizontal or vertical boxes by typing a number or using the arrows. An object may be skewed from 45 to −45 degrees. The system user can click Preview to see what the object will look like as skewed. If satisfied, the system user clicks OK; if not satisfied, the system user can further adjust the angle and click Preview until satisfied.

Parallel Perspective

Figure 43:
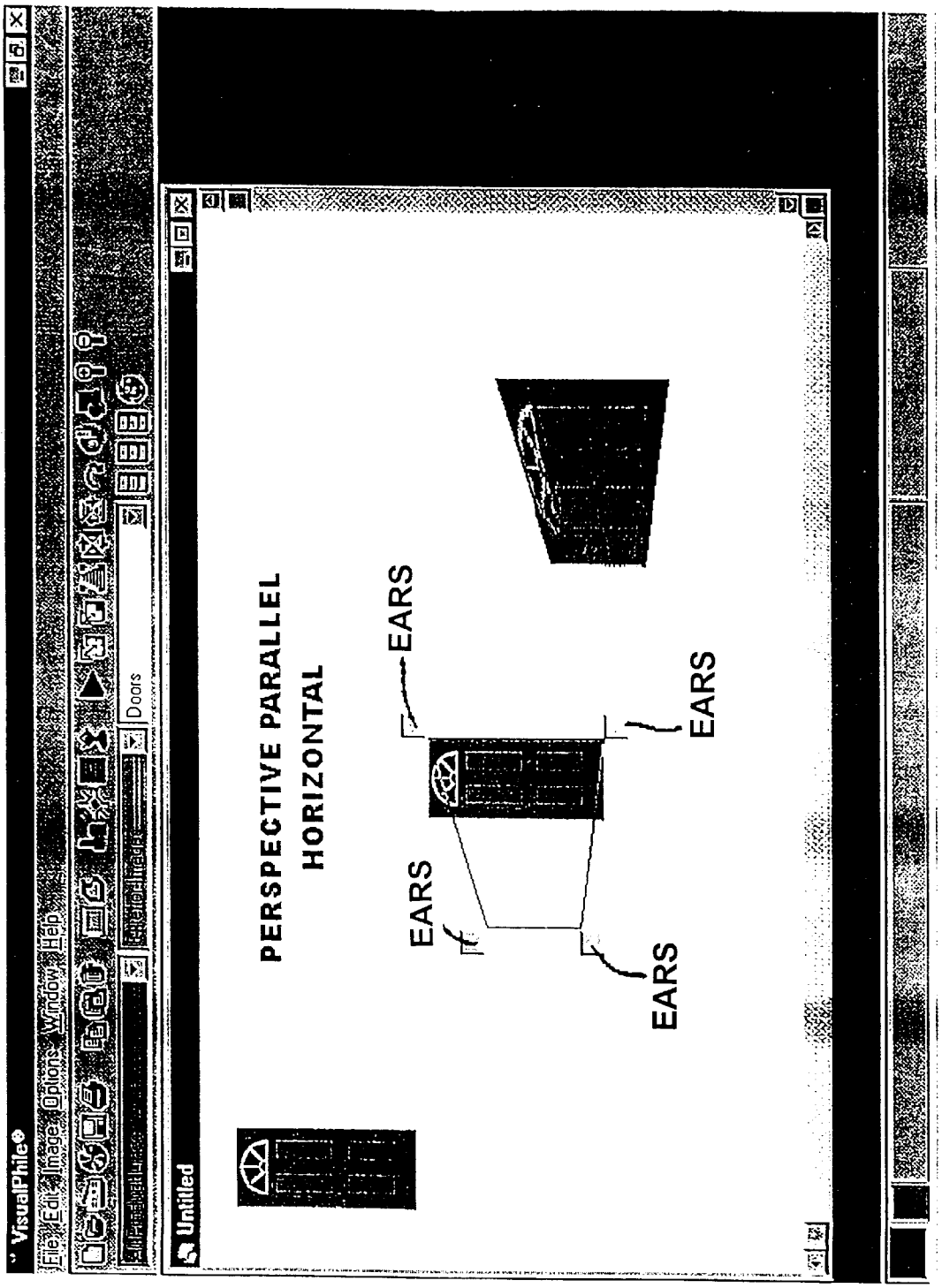
Figure 44:
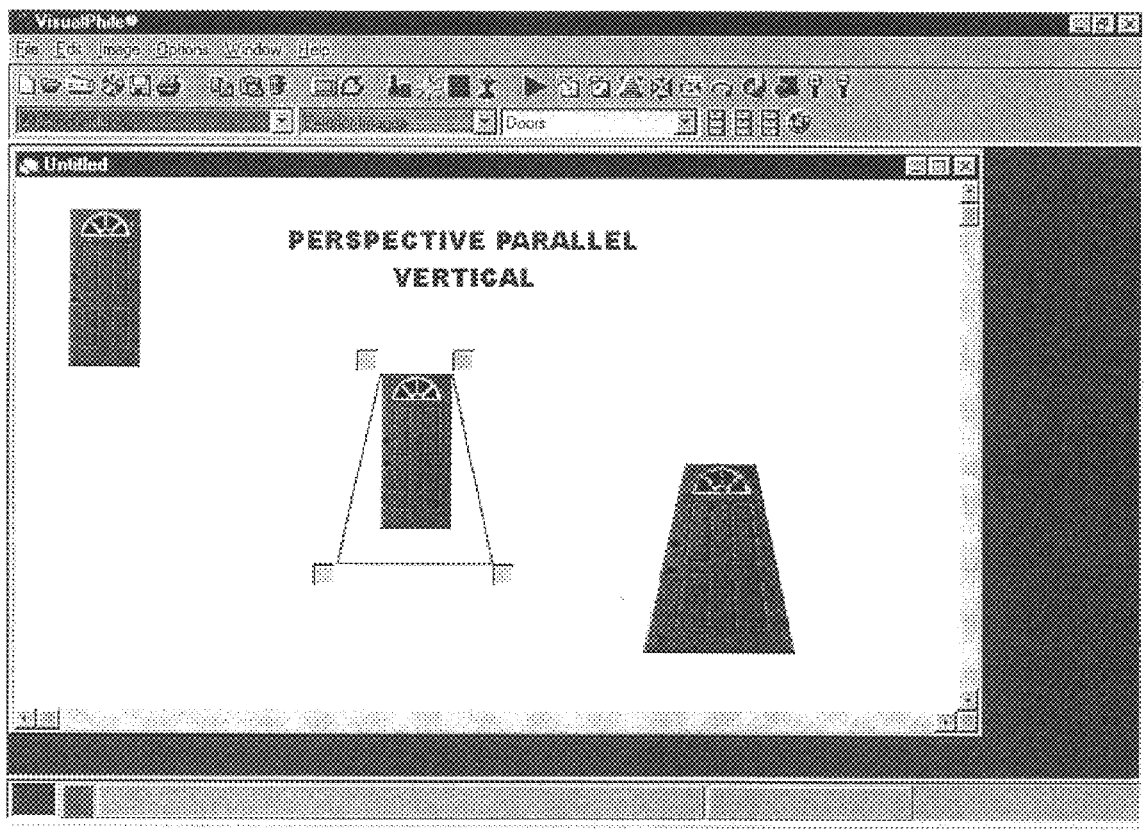

The system further allows the system user to apply perspective to an object using a Parallel Perspective tool. The system user first selects the object with which to apply perspective. Alternatively, the perspective may be applied to a pattern by selecting and defining that pattern. The system user next clicks on Perspective on the icon toolbar or selects Perspective under the Image menu. A dialog box then appears. If perspective is to be applied to an object, Current Object should be selected at the bottom of the dialog box. If perspective is to be applied to a pattern, Current Pattern should be marked in the dialog box. The system user then must select between horizontal or vertical parallel object. As illustrated in FIG. 43, horizontal will stretch the object or pattern more horizontally to fit the object being created. Vertical will stretch the object or pattern more vertically to fit the object being created as shown in FIG. 44. The system user then clicks OK. The object or pattern appears with yellow boxes at the corners. The system user drags and drops one square at a time to make an outline of where the pattern or object will fit into. When the outline appears satisfactory, the system user clicks inside the shape that has been drawn. If the result is satisfactory, the system user clicks again inside the shape. If the result is unsatisfactory, the system user continues to move the yellow boxes until the desired result is achieved.

Free-Form Perspective

Figure 35:
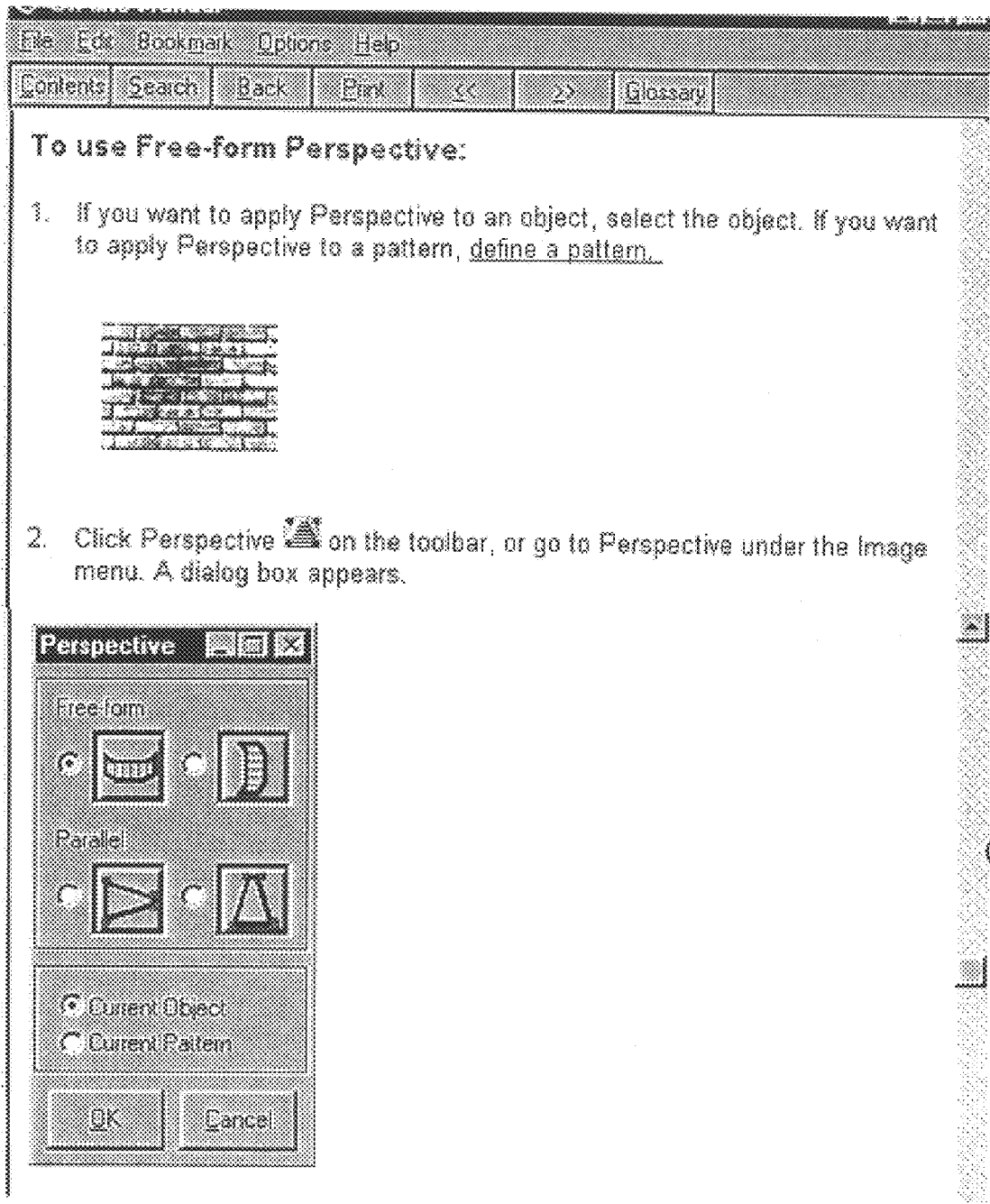
Figure 36:
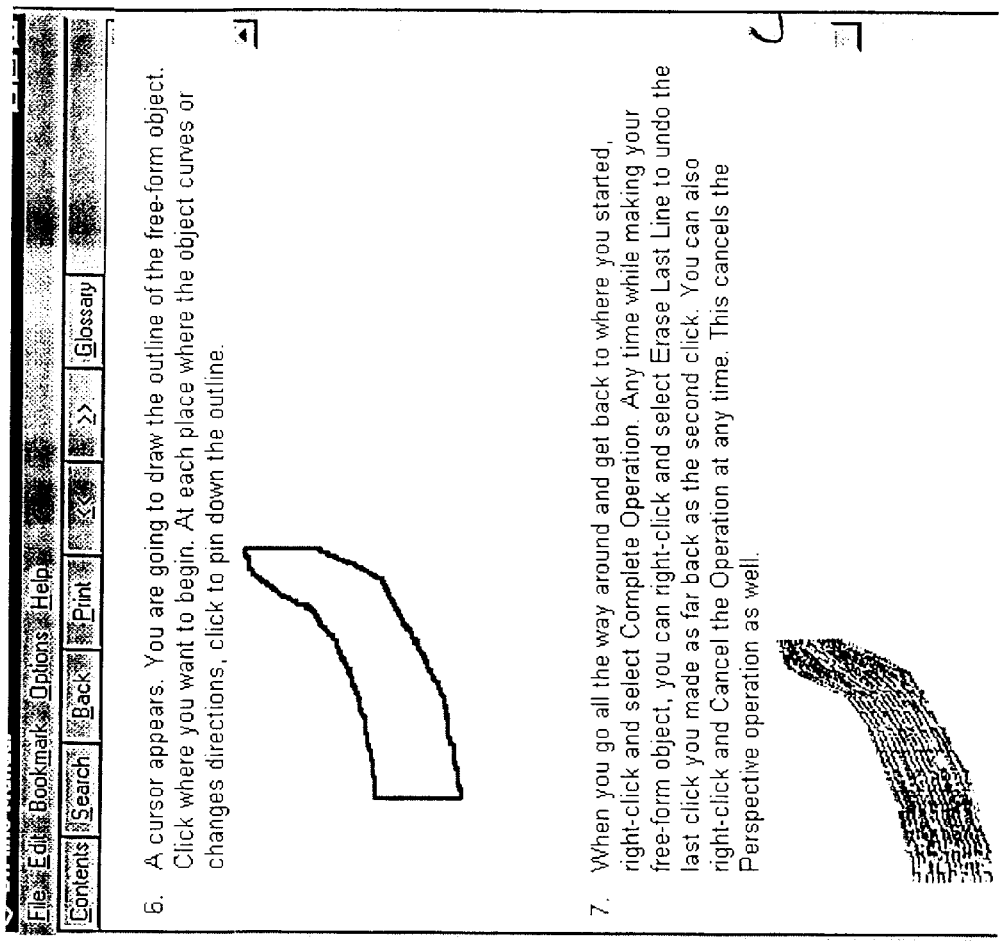
Figure 41:
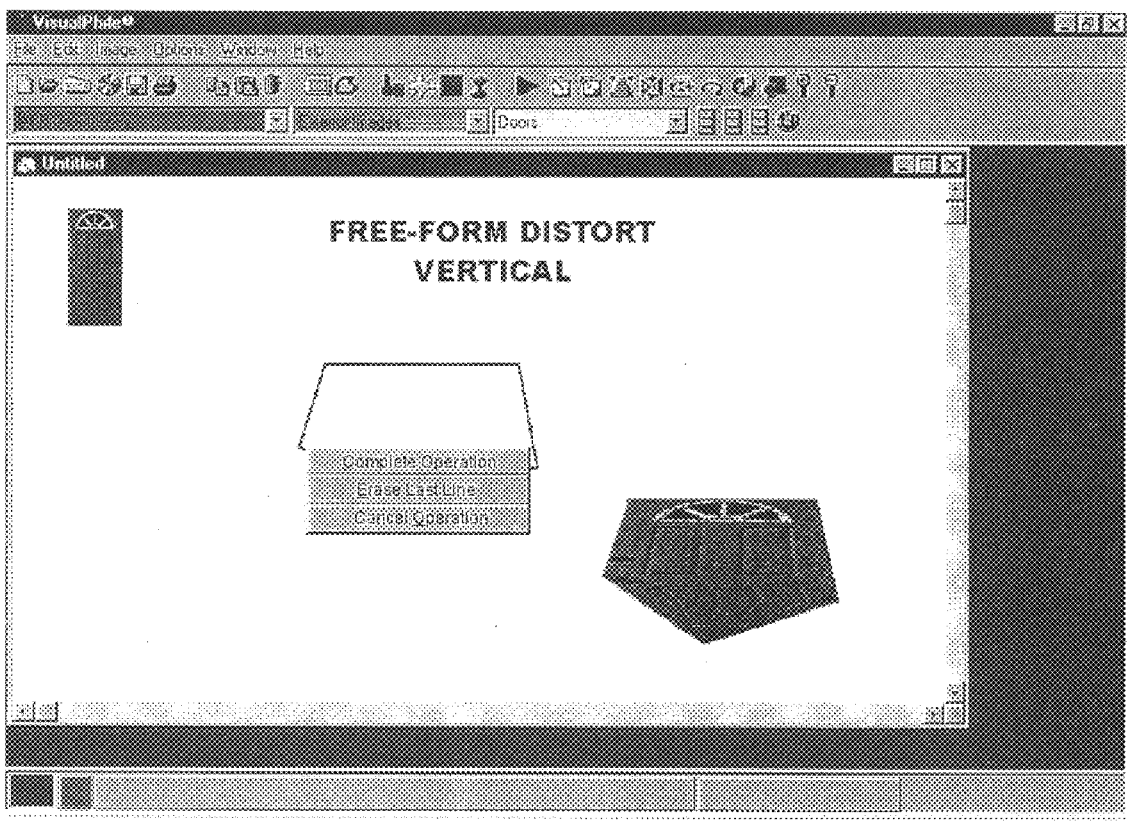
Figure 42:
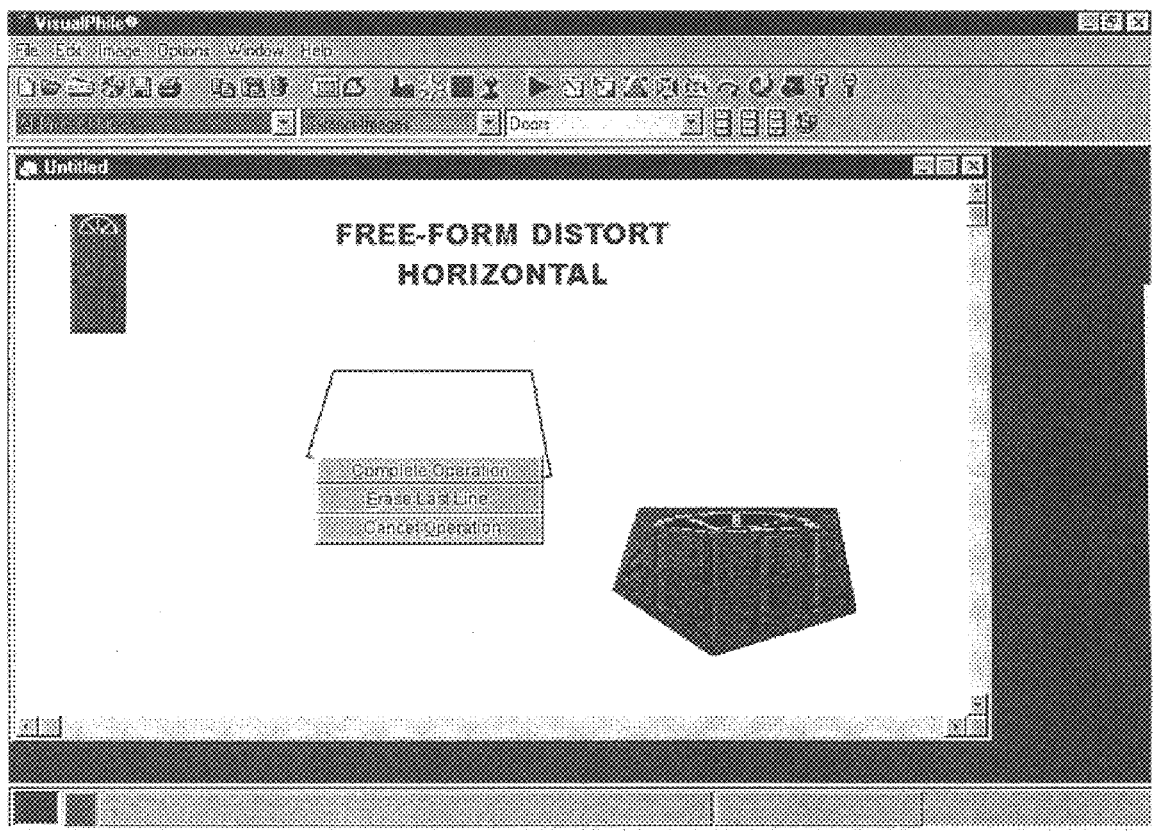

Using a Free-Form Perspective Tool, a system user can create a free-form object with which a pattern or object is filled. The pattern or object is distorted to fit into the area of the free-form object. To use the Free-Form Perspective Tool, the system user first selects the object. Alternatively, perspective may be applied to a pattern, in which case the system user first selects or defines the pattern. The system user next clicks the Perspective tool on the icon toolbar, or goes to Perspective under the Image menu. A dialog box illustrated in FIG. 35 then appears. If perspective is to be applied to an object, Current Object should be selected at the bottom of the dialog box. If perspective is to be applied to a pattern, Current Pattern should be selected at the bottom of the dialog box. The system user must next select between horizontal or vertical free-form object. As illustrated in FIG. 42, horizontal will stretch the object or pattern more horizontally to fit in the free-form object that has been drawn. As illustrated in FIG. 41, vertical will stretch the object or pattern more vertically to fit in the free-form object that has been drawn. The user then clicks OK and a curser appears. As shown in FIG. 36, the user then draws an outline around the free-form object, clicking at a starting point and again clicking to pin down the outline at each place where the object curves or changes direction. When the free-form object has been traced all the way around back to the starting point, the system user right-clicks and selects Complete Operation.

See-Through Erase

Figure 37:
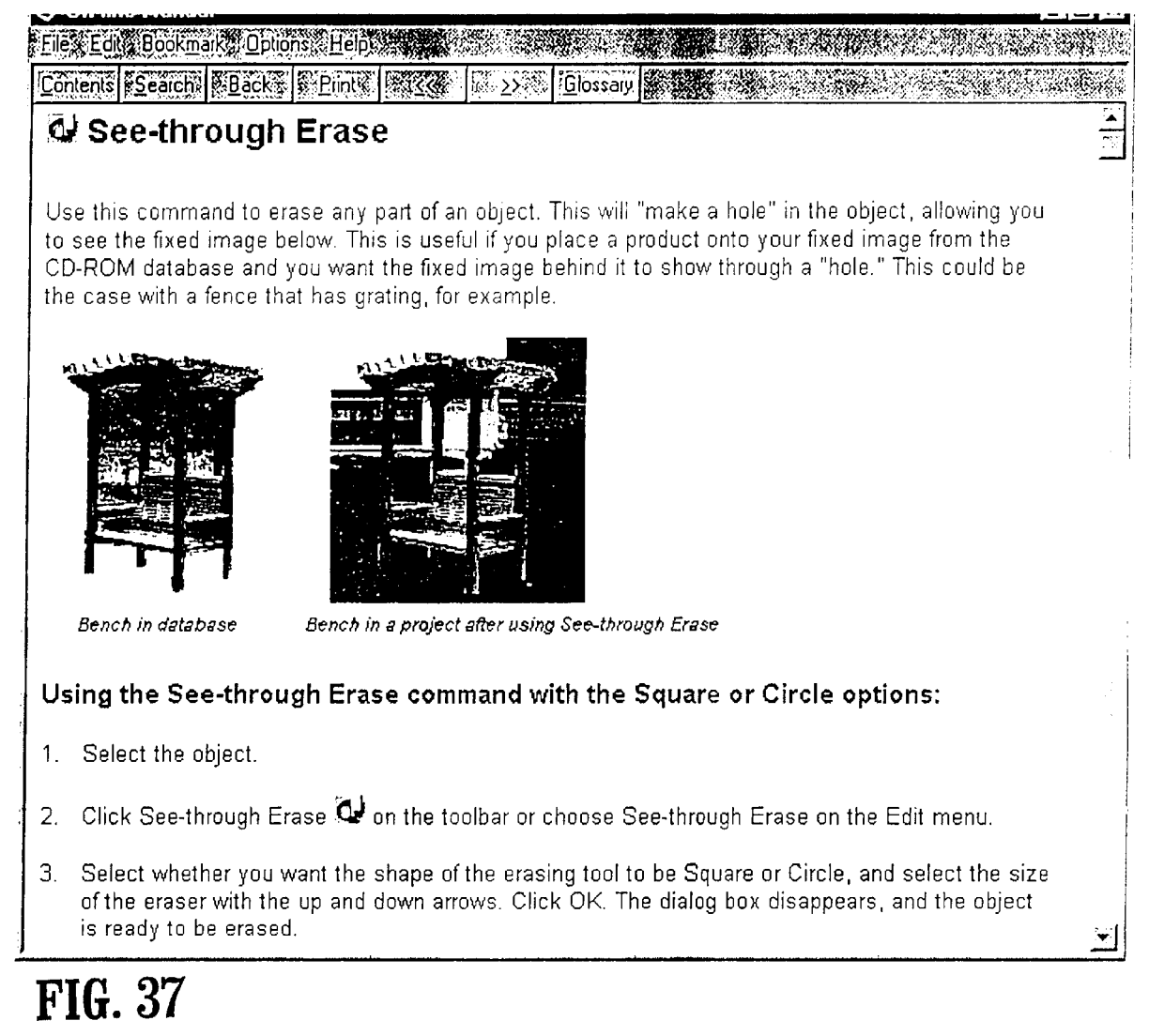

As illustrated in FIG. 37, the system also allows a user to utilize a See-Through Erase command to erase any part of an object, thereby "making a hole in the object," allowing the system user to see a fixed image below. The See-Through Erase command can be used with a square or circular area, as well as a free-form area. To use the See-Through Erase command with a square or circle option, the system first selects the object in which the tool is to be used. The system user next clicks See-Through Erase tool on the icon toolbar or chooses See-Through Erase on the Edit menu. A dialog box then appears. The system user next selects whether the shape of the erasing tool is to be Square or Circle, and selects the size of the eraser with the up and down arrows in the dialog box. The system user clicks and drags the left mouse button to erase the part of the object where the background is to show through. The system user right-clicks and chooses Exit from the Erase mode to accept the erasing that has been done. If the erasing that has been done is unsatisfactory, the system user can right-click and choose Cancel to undo the erasing.

To use the See-Through Erase command with the region option, the system user first selects the object upon which to use the See-Through Erase tool. The system user next clicks See-Through Erase tool on the icon toolbar or chooses See-Through Erase on the Edit menu. A dialog box appears, from which the system user selects Region. The system user next creates a free-form object using the Free-Form Object tool. After the free-form has been created, the system user right-clicks and selects Erase Region. At any time in Region Mode, the system user can right-click and choose Cancel Region to stop creating the free-form object. The system user can also right-click and select Remove Last Line while making the object. The See-Through Erase function will then be applied to the free-form object created. The system user has the option of creating another free-form object or exiting by right-clicking and selecting the Exit Region Mode.

Time of Day Function

A system user may make the composite image look more or less sunny using a Time of Day function. In the preferred embodiment, it is best to use the Time of Day function at the beginning or end of the project because a duplicate of the project is produced with all objects glued. The duplicate can be used as a fixed image of a new project or as an image file of the finished project with all the objects glued.

If the system user is starting a project, the system user selects the fixed image for the background as a new project. If the system user is finished with the project, the system user should make sure the project looks the way he wants. The system user next goes to the Time of Day under the Image Menu. A new screen will appear on the window with the project image and function tools next to it. The system user next goes to a list of times under the clock and selects one. If the results are unsatisfactory, the system user may select other times until the image looks right. When satisfied with the image, the system user clicks on the File menu. The system user then chooses Create New Project to bring in the darker or lighter image that has just been created as the fixed image of a new product. The system user may choose Export to save the darker or lighter image just created as an image file, which can be exported to other programs or saved for importing as the fixed image of a project some other time. Whether Create New Project or Export is chosen, any objects on the fixed image are glued to the new image created with the Time of Day function.

Shadows Tool

Figure 38:
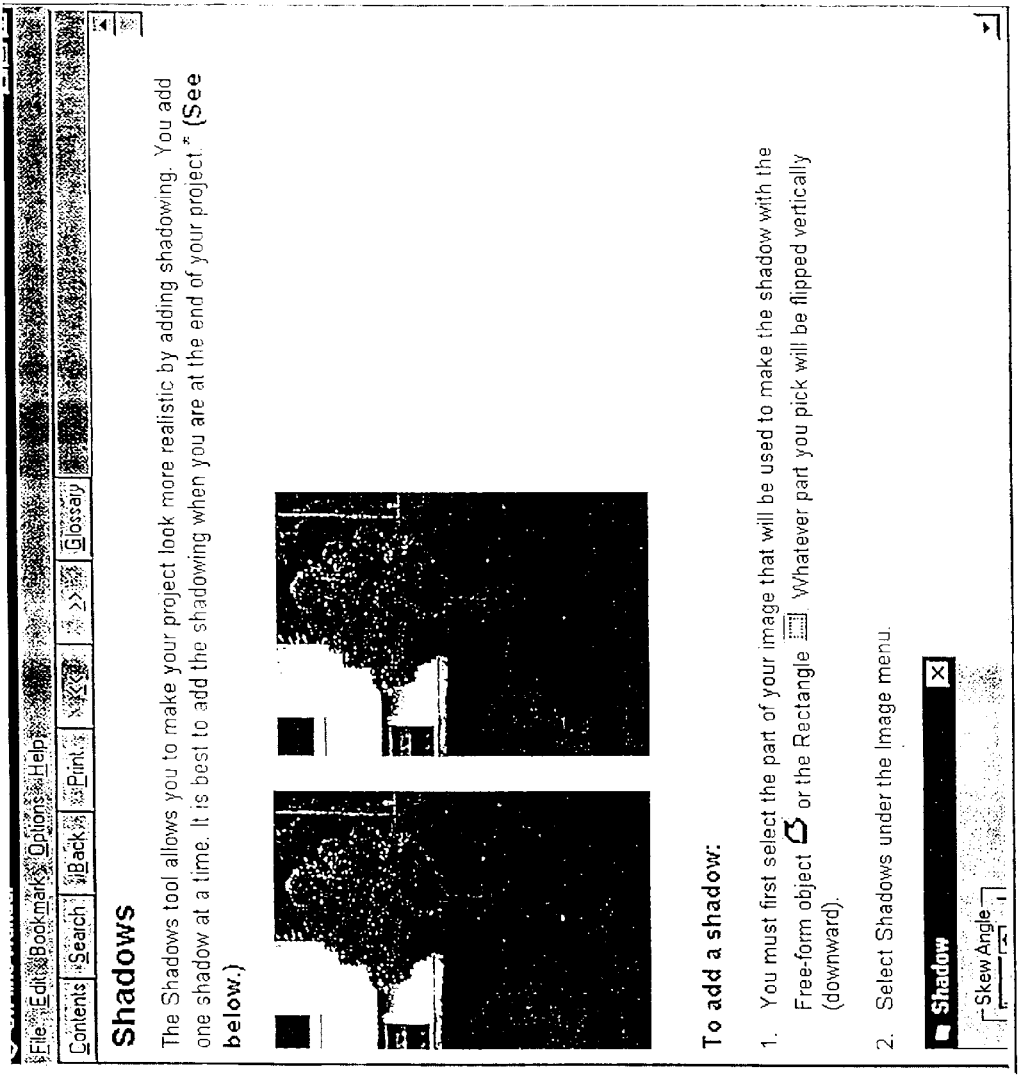

Using the Shadows Tool, a system user may make a project look more realistic by adding shadowing, as illustrated in FIG. 38. Shadows are added one at a time, and it is best to add shadowing at the end of a project.

To add a shadow, the system user must first select the part of the image that will be used to make the shadow with the Free-Form Object tool or the Rectangle tool. Whatever part of the image is picked will be flipped vertically (downward). The system user next selects Shadows under the Image menu, and a dialog box appears. An Edit box reflecting Intensity appears within this dialog box. The intensity reflects how dark the shadow is, with the default being set to −300. To lower or raise the Intensity number, the system user types the new number in the box and hits Return or clicks a little button with several dots on it next to the amount chosen for Intensity. The preview shows in the window. The system user may change the width and height of the shadow by manipulating the up and down arrow keys in a Dimension edit box. The shadow is changed interactively on the window as the width and height of the shadow is manipulated. Using an Skew Angle edit box, a system user can slant the shadow to the left or right by typing in an angle between −45 and 45 degrees. Negative will slant the shadow to the left, while positive numbers will slant the shadow to the right. The system user clicks the little button with dots on it to the right of the Skew Angle edit box and a preview of the shadow, as slanted, shows in the window. The shadow may be moved by clicking on the direction arrows in a Jog Shadow exit box, or by using the keyboard arrow keys. Once the shadow appears satisfactory, the system user clicks an OK button within the dialog box.

4.5.5 Obtaining Product Information—The Display Interface

The system allows a system user to retrieve and display information relative to any product in the CD ROM database within a window that appears over the background for convenience purposes. In the preferred embodiment, this product information consists of a product name, a product vendor, a product category, a product sub-category and manufacturer phone number. For products that are image objects merged into the composite image, information about the product may be accessed by right-clicking on the product image and choosing Information. To obtain information about a product that is in the CD ROM database, the system user clicks on the box at the top of the display box that contains the manufacturer's logo.

A novel feature of the invention is the provision of an object data access means associated with the screen display 252. The display interface will now be discussed with reference to FIG. 45, and the steps employed by the user to access information about products from the database by means of the display interface will also be discussed. In the preferred embodiment, the user places a CD containing the computer program having the features of the invention in the CD-ROM in host computer 12 and launches the application from the Windows environment. In the example shown in FIG. 45, the user selects a picture of a house 800 as background 250 to the project. Backgrounds can originate from several sources, such as a previously saved project, a scanned image, an image file, the windows clipboard or from the main database, as previously described. Once the background image of the home has been loaded into the project form, the program presents a display interface in the form of application tool bars, combo boxes, file cabinet icons, and the like, operable with a mouse-click function or keypad, as generally set forth below. The user employs the display interface by proceeding to "Click" on the CD-ROM icon 802 on the application tool bar. The program proceeds to search the database in order to present three drop-down combo boxes with database information available for the software product in use. The first combo box 804 contains a list of Product lines or vendors. The default is "All Product Lines", meaning that all products for all Product Lines are available to the user for the version in use. The second drop down combo box 806 contains a list of Categories that are available to the user. The third drop down combo box 808 presents a list of all available Sub-categories on the selected Categories. For example, the list of Sub-categories "Windows", "Roofing Material" and so on, are members of the selected Category "Exterior Images". The user can select from the first combo box 804, for example "Sample Company" by "clicking" on the Product Lines Combo Box and choosing from the list of available Product Lines or companies. Once the user makes the selection, the second and third combo boxes 806, 808 are updated to show only categories and sub-categories in which "Sample Company" products exist. Therefore, the first combo box 804 acts as a filter in the search for information in the database. In this case, the user leaves the default selection "All Product Lines" and proceeds to select category "Exterior Images" and sub-category "Windows".

The user now chooses to see all the product images in the sub-category by "clicking" on any of the three file cabinet icons 810. The program proceeds to show a form containing a strip of images 812 from the database pertaining to the sub-category. The top of this database strip form shows the logo 814 related to the selected image; this is indicated by a line 816 connecting the logo to the image below. When the strip is loaded for the first time, the line connects the topmost image to the logo. Items that don't belong to a Product Line or Vendor are shown as a General group. The user can "click" on the logo and view additional information on selected image in the database strip form. The user can use the scroll bar 818 to the left of the images to view more images in the current sub-category. As the user moves the scroll bar 818, the user can view Product Line, Vendor name or General group name and the image product name in the information bar below 820. When the user releases the mouse button on the scroll bar 818, the six images are updated to contain images for that section in the database. For example, in the preferred embodiment, there are 60 windows in the windows category. The user moves the scroll bar 818 to position 39, then the database strip form will show items 39 through 44. Additionally, as the user moves the mouse over any of the images in the database strip, the information in the database about these items will show on the information bar 820 below.

The user is now ready to experiment with an image object from the database onto the picture of the home 800. The user can "drag" the image from the database strip 812 onto the background 250 containing the picture of the house 800. When the user releases the mouse button, the image is retrieved from the database and placed in a movable object 260 over the house. Once the image object 260 is placed in background 250, the user can view the product name and Product Line/Vendor or Group name just by placing the mouse over the image object 260. If the user wishes to view additional information about the image object 260, the user can "right click" on the object 260 and select from a pull down menu the "Information" menu item. This will show as form containing more information on this image product.

The images from the database can be of irregular shape, such as the example window 822 shown at the top of the strip form 812. This window 822 item has a curvature at the top and if used will be integrated to the house in a realistic manner. Also items from the database can have "see-through" areas that will show part of the background through the object. This is useful for images such as trees and gazebos. In this example, the user can re-size the window image in order to fit it realistically onto the house 820. The three house windows 824 have been already added from the database, as contrasted to preexisting window 826.

Many other features are available to the user in order to alter the form, size and orientation of the window image object 260. The user can repeat the steps above to retrieve more image items from the database such as trees, doors, and siding patterns, among other things. In the examples shown, the siding on the walls 828 on the top floor of the house 800 has been placed there from an image retrieved from the database. The original wall 830 at the bottom level of the house still remains. The user can continuously experiment with image positioning and orientation in order to visualize how different images would look if they were applied on the real house.

Once the user is satisfied with the design or prefers to continue at a later time, the user may save the project. Once the project is saved, it can be retrieved at a later time. The background 250 and image objects 260 will be positioned at the correct locations in relationship to each other. The image objects 260 are still movable and the user can perform further image object manipulation operations on them such as perspective, brightness and contrast. The link between each object 260 and the database is maintained so that the user can view relevant information relating to the image. (In the case where the images were created by using the tools available, a link to the database is not possible.) Images created by the user are assigned the "User Created" name.

Any image name can be changed by selecting the object list from the pull down menu. There, the user can view a list of all objects and modify the object name in order to give it more meaning. Optionally, the user can save objects to a User database to create a customizable library of objects. This user database contains the image and the name.

Finally, in this example, the user can print a list of images used in the current project by selecting the "Shopping List" from the "File" pull-down menu. This list contains quantity, company/vendor or general and image name such as "Square-Classic Picture".

The information that originates in the main database of real products is presented on the screen in the database strip showing up to six images at a time in combination with the scroll bar. The scroll bar allows the user to view other images in the sub-category. This information is bundled with the image product once applied onto the project background. Limited information about the images is viewed on the information bar by moving the mouse over the image. Complete information on the image products is also available through the "right click" event on the image and the pull down menu. All image information pertaining to a project can be stored through the "save as a project" option and later retrieved using the "open project" option. The link between the image product or object and the database where it originated is maintained over time and across work sessions.

4.5.6 Finishing Product

Saving Project

A system user may choose the Save Project As to save the current project as a new project file or to save changes to an existing file. The project will be saved with objects in place. After reopening the project, all images are "active" or moveable. A system user would want to use Save Project As command to save another copy of the project with a different name. A system user might want to do this to save the project during the different stages of development, or to save a copy of the project with a different name and a different directory of the system user's computer. The system user chooses Save Project As from the File menu. The Save Project As dialog box then appears. The system user types in the file name under which to save the project as, and changes the drive or directory as desired. The system user then clicks OK to save or can click Cancel if the system user decides not to save the project to this project file name.

A system user also may choose the Save Project command to save the project that is presently being worked on with the same name it already has. By using the Save Project command, the system user adds all of the changes that have been made since the last time the project was saved, completely overwriting the last saved version. A project is a document with non-glued, editable objects. These objects can be placed on the fixed background image and can later be moved or deleted even after the project has been saved and reopened. To save a project, the system user chooses Save Project under the File menu, or clicks the Save Project icon on the icon toolbar. If the project has already been saved, the computer program will simply save the changes to the existing project file name. If the system user has not saved the document yet, the Save Project As dialog box appears and the user follows the steps discussed above to save Project As.

Export Project

A system user also may select the export command to save a document being worked on as an image file. Doing this will glue all of the objects in the display down to the fixed background image. If a system user then opens this file at a later time, new objects may be placed onto the image, but the system user can no longer work with objects that were placed onto the background image before saving the project as an image through the Export command. This allows the picture being worked on to be taken into another application. Alternatively, the Export command can be used to create an image file from a project that can be used over and over again later for the fixed background image of new projects. Thus, exporting creates a one-layer image that can serve as a fixed image for future projects.

To export, the system user first creates a project. The system user then selects Export from the File menu. The Save File Dialog Box will appear. The system user enters a file name in the File Name box and selects an image file format. The default image file format is .tif, which is a widely used standard image file format.

Print Project

A completed project or other image may be printed by the system user. To print an image, the system user selects Print from the File menu, types Ctrl+P, or clicks on the Print icon from the icon toolbar. A Print Dialog Box will appear. The system user then clicks Setup and the dialog box for the system user's selected printer appears. The system user then makes any adjustments necessary (such as the number of copies and which pages to print) and then clicks OK to get back to the Print dialog box for the system. The system user clicks Print to send the image to the printer.

Shopping List

The system user can utilize a Shopping List command to generate a list of all objects in the current project. The Shopping List may be printed or saved as a text file. The Shopping List provides a list of materials necessary for the project design. To save the Shopping List as a text file, the system user chooses Shopping List on the File menu, and from the resulting pop-out menu, chooses Save Shopping List. A dialog box appears, within which the system user designates a file name and the drive and directory within which to save the file on the system user's computer. The system user then clicks OK and the file saved may be opened in most word processing programs. To print the Shopping List, the system user chooses Shopping List on the File menu. A pop-out menu then appears from which the system user chooses Print Shopping List. The list will print to the designated printer for the system user's computer.

Bill of Materials

Another method by which to generate a list of products used in a project is through a Bill of Materials function. To create a Bill of Materials, the system user opens the project file for which to create the Bill of Materials. Using the left mouse button, the system user double clicks on the first product to be included in the Bill of Materials. This product must be in the CD-ROM or user databases. The system user then clicks on the right mouse button and chooses Bill of Materials from the menu by clicking on the left mouse button. Next, the system user places the mouse pointer over the empty white box and clicks once on the left mouse button. The name for the Bill of Materials file is then typed in the white box. The system user then selects an Add to List button. A coin icon will move from the image selected to the cash register icon that is located at the bottom of the display, indicating that the information has been saved. The system user repeats these steps to include additional products in the Bill of Materials.

Once the system user has added all of the images to the Bill of Materials, the Bill of Materials may be viewed by double clicking on the cash register icon located in the lower-right corner of the display. To enlarge the Bill of Materials display, the system user clicks on the maximize box located in the top right corner of the display window. The Bill of Materials can be exported to estimator software applications in a plurality of supported file formats.

Substitute Function

The Substitute Function allows a system user to define a pattern and fill a selected area in one step. The Substitute Function only works on rectangular objects in the CD-ROM database. To substitute an item in the database for a selection in the current project, the system user presses the Shift key and then clicks on the object to be filled in the current project. Next, the system user clicks the pattern button at the bottom of the display box on the right. A check mark appears next to it. The system user then double clicks on a rectangular section in the CD-ROM database so the red line extends to it. To continue to see what other items look like filled in the object, the system user continues to double click on the rectangular section in the CD-ROM database. When finished, the user de-selects the Substitute Function.

Zoom In, Zoom Out

The system user can select Zoom In on the icon toolbar to increase the magnification of the current image by 200 percent. The system user can edit the current project in regular magnification or zoomed-in magnification. Selecting Zoom Out on the toolbar decreases the magnification of the current image by 50 percent. A system user must be in either regular magnification or zoomed-in magnification to edit a project. Zoom Out is used to return from zoomed-in magnification.

Delete Object

A system user may use the Delete Object function to delete selected items from a project. The items to be deleted could be a product selected from the database or a self-made object. A warning box appears as a double check of the system user's intentions before the object is deleted. The Delete Object function will delete an object from the current project only, not from the database itself. To delete an object, the system user clicks on the item to be deleted. The system user then selects Delete Object from the Edit menu or clicks Delete Object on the icon toolbar. A warning dialog box will appear. The system user then selects Yes to delete the item selected.

Copy Special and Paste Special Function

The Copy Special Function is used for copying within the system and is done in preparation for pasting within the system program. The Copy Special and Paste Special Function can be useful when moving objects between projects created in the system.

To Copy Special, the system user first selects an object. The system user next clicks Copy Special from the Edit menu, types Ctrl+C or clicks the Copy Special icon on the icon toolbar. A duplicate of that item is placed on the system's Clipboard. If a system user desires to paste the item selected into another project, the system user should open that project, or, if it is already opened, click on the title bar for that project to make it active. The system user next clicks Paste Special on the Edit menu, types Ctrl+V or clicks the Paste Special icon on the icon toolbar to place the copied item on the active project.

The New Command

A system user may use the New Command to create a project from scratch within the system. For example, a system user may want to assemble objects on a white background instead of on a fixed image or to print out objects on a white background to show others. To create a new project, the system user first selects New from the File menu, types Ctrl+N, or clicks the New icon on the icon toolbar. When the New Command is selected, a dialog box appears. To select a screen size other than the default, the system user types in a new height and width, or uses the up and down arrows to specify a new height and width. To change the measurement from Pixel, the default setting, the system user chooses inches. The system user then clicks OK and a new project work space appears.

Gluing an Image

Using a Glue function, any selected image, whether it was pasted or moved from another part of a photo, can be permanently merged with the fixed image by gluing it. When an object is glued, it becomes part of the fixed background image and can no longer be modified in any way. The Glue function is important because when projects are done with many objects, it can become necessary to glue some objects in order to free up computer system memory. When a system user has too many objects on a page that are not glued, and attempts to select another item from the database, a dialog box appears informing the user that some of the objects must be glued or deleted in order to continue.

When an object is exactly where the system user wants it to be and the system user is done editing it, the object must be selected. If the object is in a stack of objects, the object at the bottom of the stack must be glued first and then each object on top of it successively must be glued. When a system user clicks on an object at the bottom of the stack, it comes to the top, but when it is glued, it goes back to its same location in the back, but as part of the fixed background image. After selecting the object, the system user selects Glue under the Edit menu. A warning box appears as a double-check of the system user's intentions before the object is glued. If the system user wants to continue to glue the object, he clicks Yes in the warning box; if not, the system user clicks No. Once an object is glued, it cannot be selected again; it completely replaces the part of the picture underneath it. The glued object can no longer be manipulated with other tools, although the gluing process will not remove the item from the database.

Rearranging the Layering of Stacked Objects

The Send to Back function rearranges the ordering of objects lying on top of each other on the composite image. The object on the top goes to the bottom of the stack of objects, but it is still on top of the fixed background image. To activate the Send to Back function, the system user first clicks on the object he wants to Send to Back. The system user then right-clicks and chooses Send to Back.

The Send to Previous Location function sends an object to the place it was before the system user clicked Send to Back or before the object was modified. This function allows a user who has mistakenly sent an object to the back to place that object back at the layer it was originally. When a system user clicks on an object, that object comes to the front layer of the stack. When a system user is done editing that object, he can click Send to Previous Location to send it back to the layer where it was originally. To activate the Send to Previous Location function, the system user clicks on the object he wants to Send to Previous Location. The system user then right-clicks and chooses to Send to Previous Location.

Object List

The Object List function allows a system user to bring up a list of all objects that have been placed on the fixed background image. Objects from the CD-ROM and user databases will be listed under their names in those databases, while objects created by the user will be called User Created. The Object List allows the system user to edit an object that is setting in a stack of layered objects. When a system user highlights an object and clicks OK, the object is brought to the top of the stack for editing and then the Send to Previous Location function can be used to return the object to the layer where it originally was. To activate the Object List function, the system user right-clicks on the object on the top of the stack and chooses Object List with the left mouse key. An edit box appears listing the objects in the stack. The system user clicks on the object to be edited. The name of the object to be edited is highlighted on the list and it comes to the top of the stack. The system user then clicks OK to exit the Objects List and edits the object that it now on the top of the stack. The system user can also click Cancel to exit and make the objects return to their original places in the stack. When the system user is done editing the object, the object should be selected if it isn't already. The system user then right-clicks and selects Return to Previous Location with the left mouse button.

The system user can change the name of any object in the Object List. To change the name of an object, the system user clicks the curser in the box at the top of the edit box and types the new name of the object. The name is changed whether the system hits OK or Cancel. If the name of an object from the CD-ROM or user database is changed, its name only changes in the Object List, not in the CD-ROM or User Database.

Intensity Stretch Function

The Intensity Stretch Function increases the contrast in an image. Unlike the contrast tool, the Intensity Stretch tool always retains the original number of different intensity values. When used, the colors change somewhat. The Intensity Stretch Function can be useful to make scenes look more wintery. The Intensity Stretch Function can also bring out more details and tends to work best when the system user's system is set to 24-bit color.

To use the Intensity Stretch Function, the systems first selects an object or part of the image with the free-form object tool or rectangle tool. The system user then selects the Image menu, chooses Effects and then chooses Intensity Stretch. The object is then changed. If the system user does not like the change to the object, he can select Undo under the Edit menu.

Backdrop Function

The Backdrop Function allows a system user to change the scenery around the main object in a project, whether that object is a house, a pool, a landscaped backyard, etc. To place a Backdrop behind the main object, the system user clicks the CD icon on the icon toolbar to open the CD-ROM database. The system user next selects the category Objects, then selects a desired sub-category (such as mountains). The system user may scroll through the choices and pick the desired backdrop by clicking on the image and then clicking the Open Project button. The image selected is now an image on the display. The system user then clicks the rectangular tool on the icon toolbar and outlines the entire background picture chosen. The system user then clicks the Pattern icon on the toolbar, which causes part of the object in the pattern box located in the lower left corner of the display to be visible. The background has now been selected as the pattern. The system user closes the background picture and when asked to save changes, clicks No. The system user now returns to the original project and, using the free-form object tool, outlines the entire area on the project that is to be filled with the newly selected pattern. When the system user is ready to make the last click of the outlined area, the right mouse button is used and Complete Fill with Current Pattern is selected.

4.6 EXAMPLES

FIGS. 18–45 are Examples, in the form of screen "dumps" of projects created by, and features various functionalities associated with, the invention.

Figure 18:
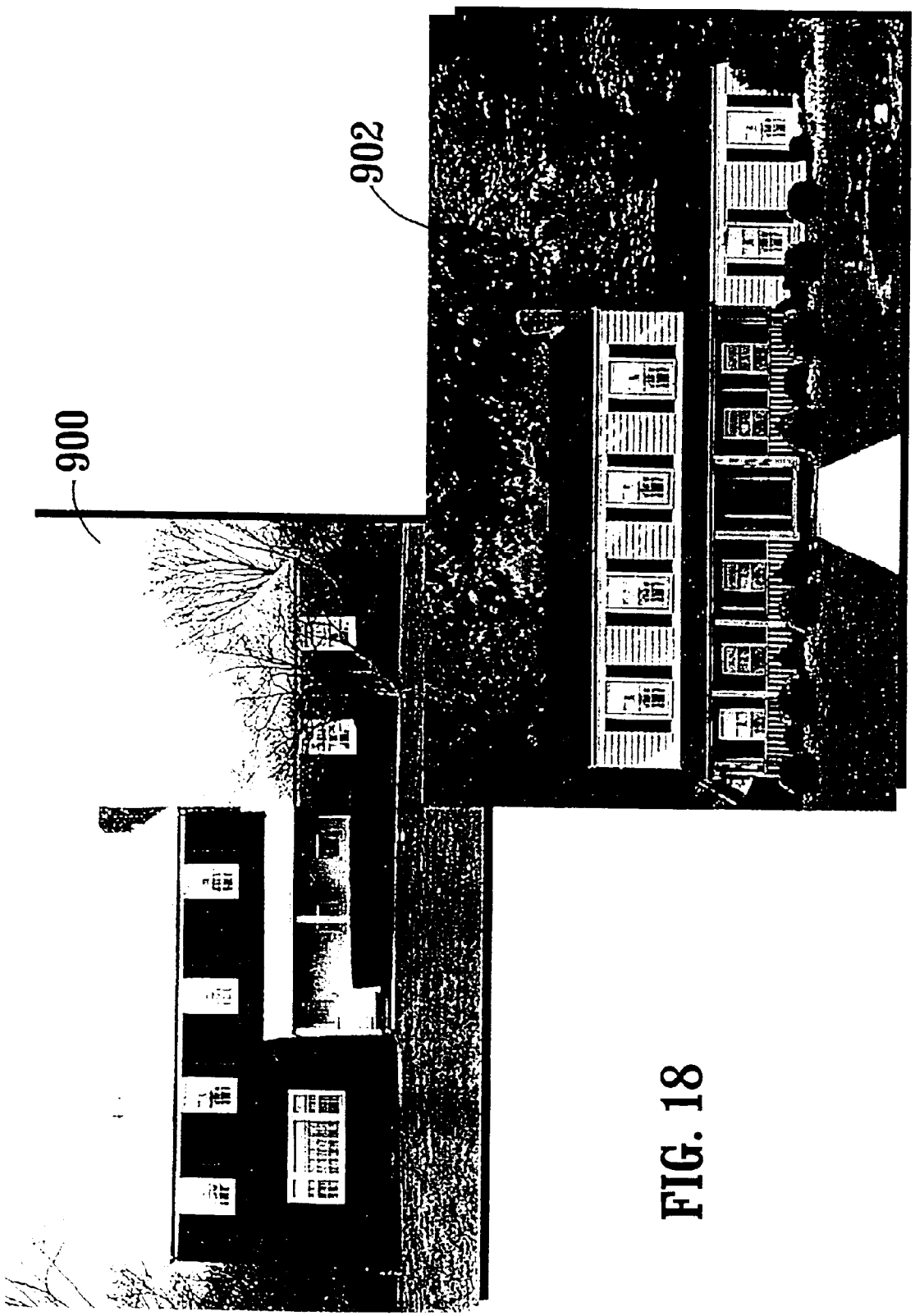

FIG. 18 shows a "before-and-after" display of the same house. In screen 900, the house shown is the "before" view. In screen 902, the house is shown in the "after" view with objects that have been merged into the background.

Figure 19:
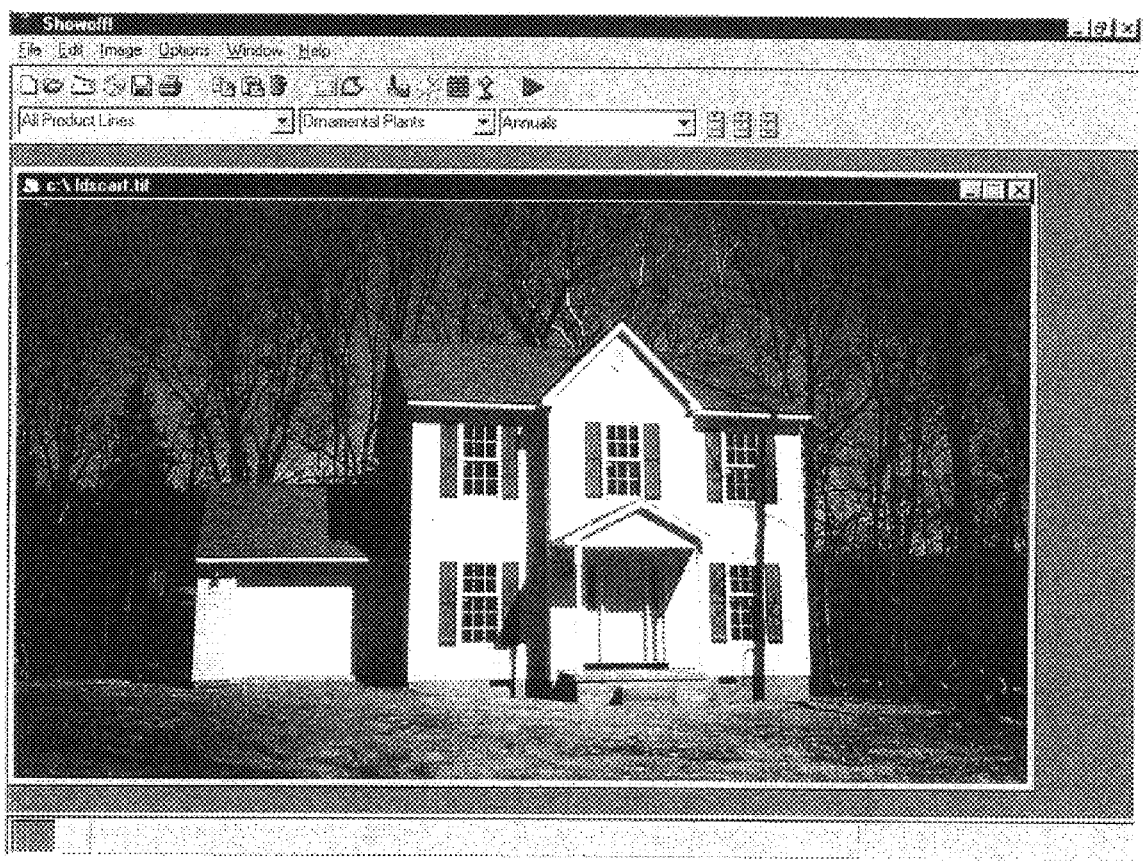
Figure 20:
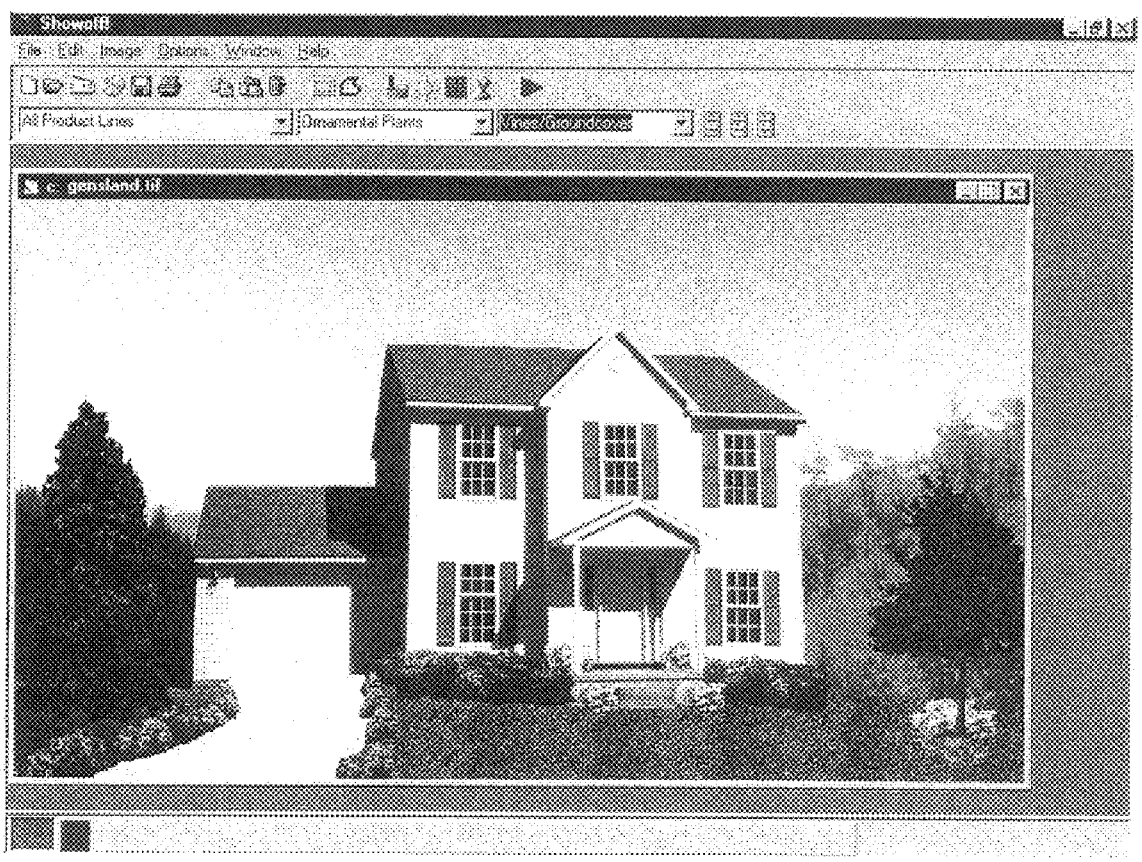
Figure 21:
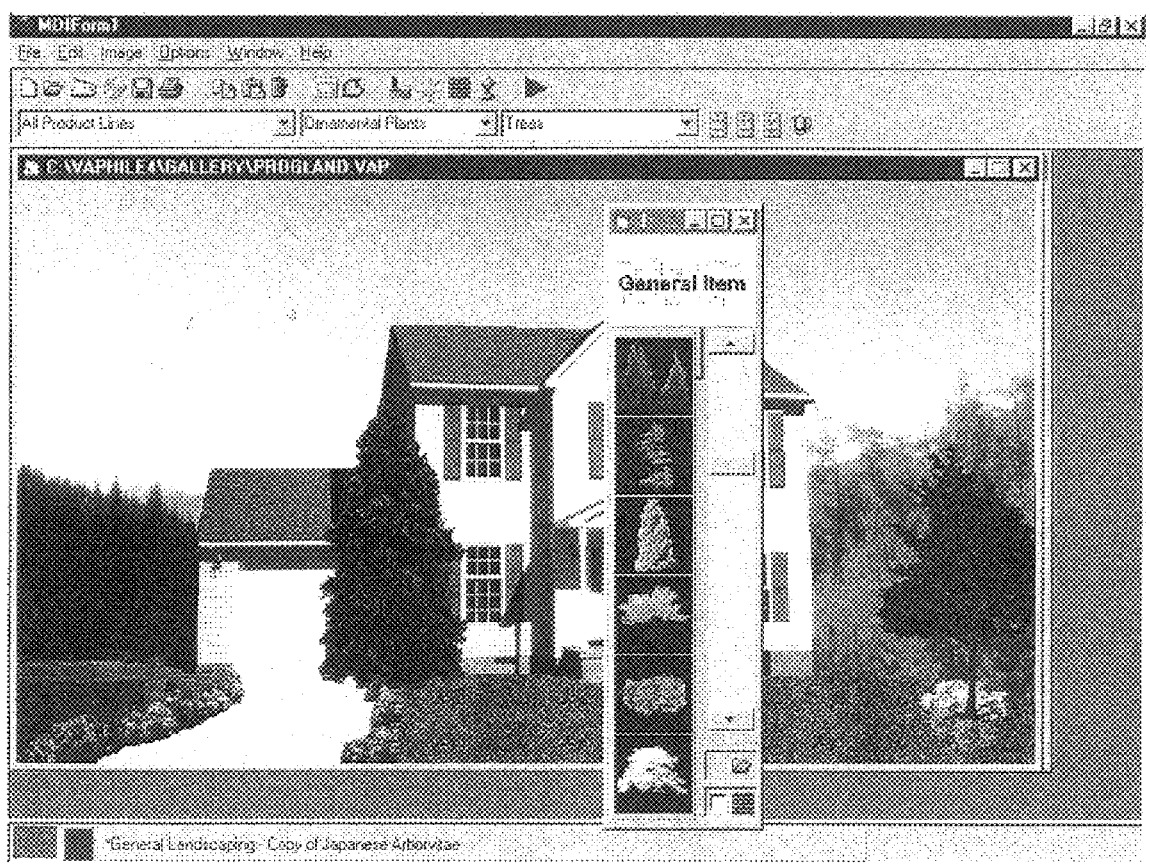

FIGS. 19–21 are also "before-and-after" displays of the original house, shown in FIG. 19 as modified with the invention in the display of FIG. 20. FIG. 21 includes a database strip form 910 illustrating various bushes and shrubbery from which landscaping objects are chosen.

FIG. 22 is a display that shows the placement of a tree 920 into a background 922, that has been selected from a strip bar 924, before merging the tree 920 into the background 922.

Figure 23:
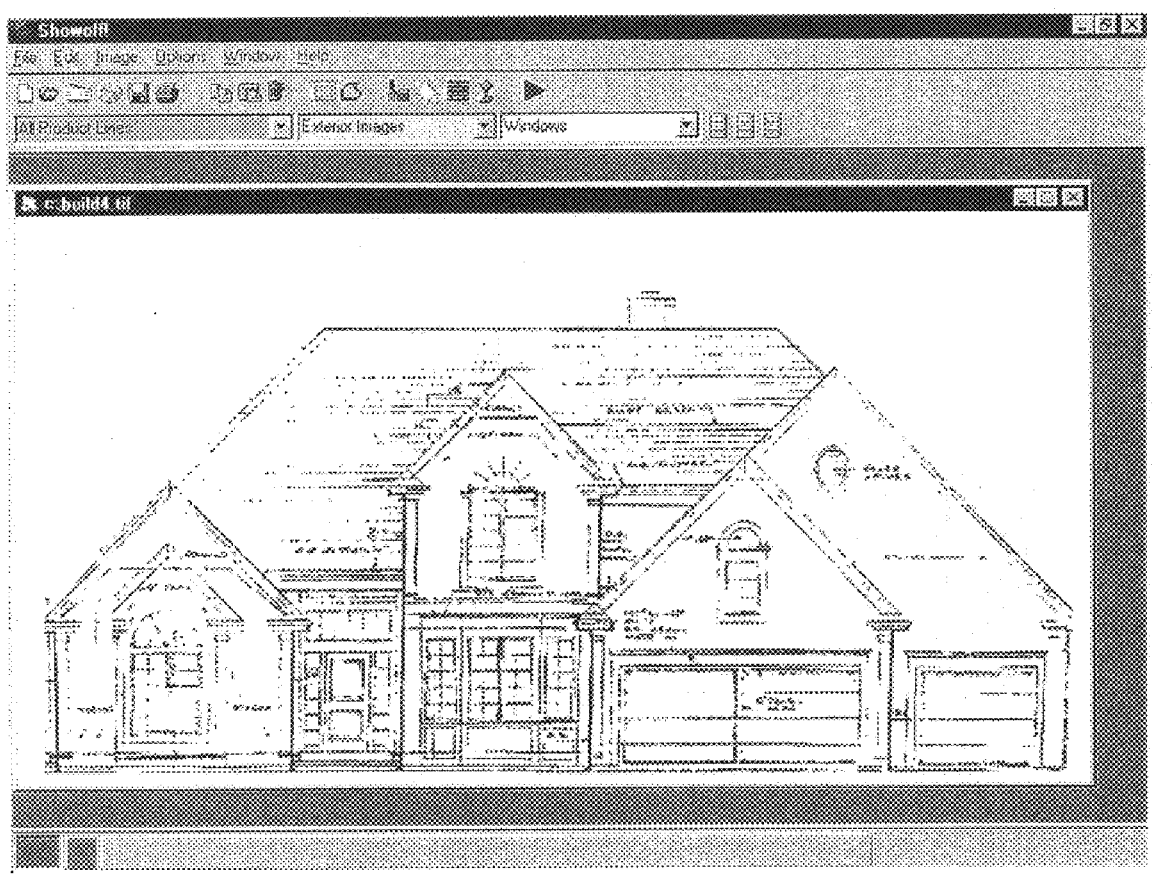
Figure 24:
Figure 25:

FIGS. 23–25 are screens that show how the invention can be employed with architect designs drawn from a database. FIG. 23 shows background 250 comprising an architectual design of a house face. FIG. 24 shows a window object 260 placed over background 250 that has been dragged from strip bar 910. FIG. 25 shows a screen of a completed project that began with the line drawing appearing in FIG. 23.

FIG. 26 is a screen display of a garage door object 260 placed over background 250 which has been dragged from a strip bar 910.

Figure 27:
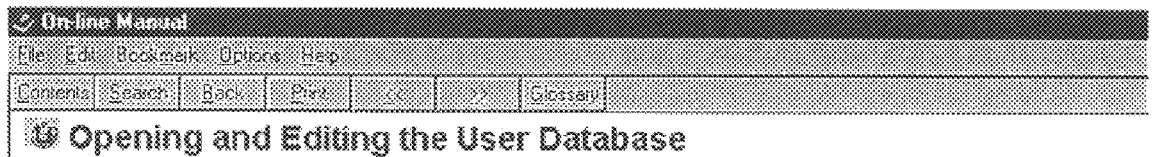

FIG. 27 is a screen display which the user will see in the preferred embodiment, when opening and editing a database.

Figure 39:
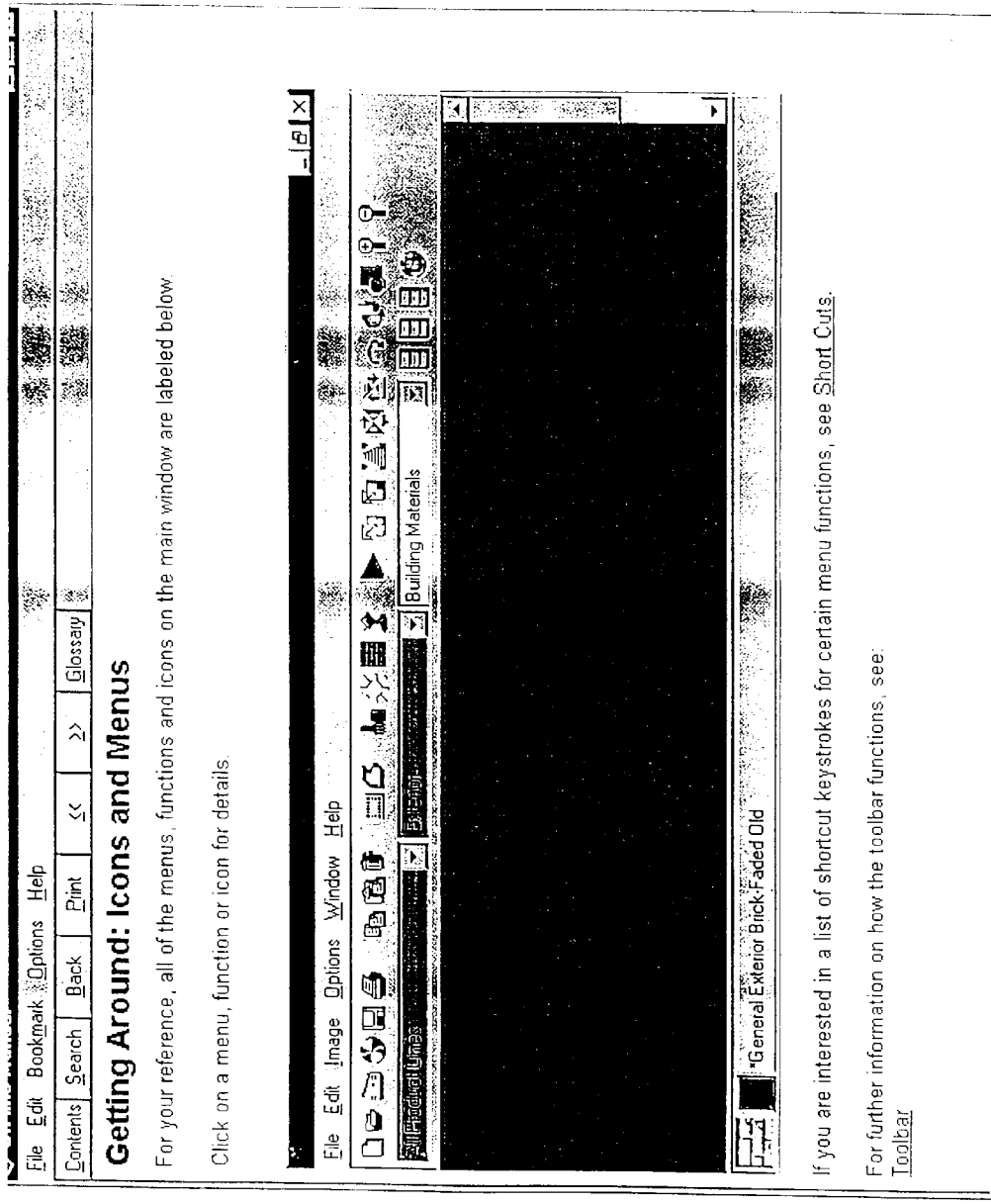

FIG. 39 is a screen display that, in a preferred embodiment, appears to the user who wishes to uses icons and menus.

Figure 40:
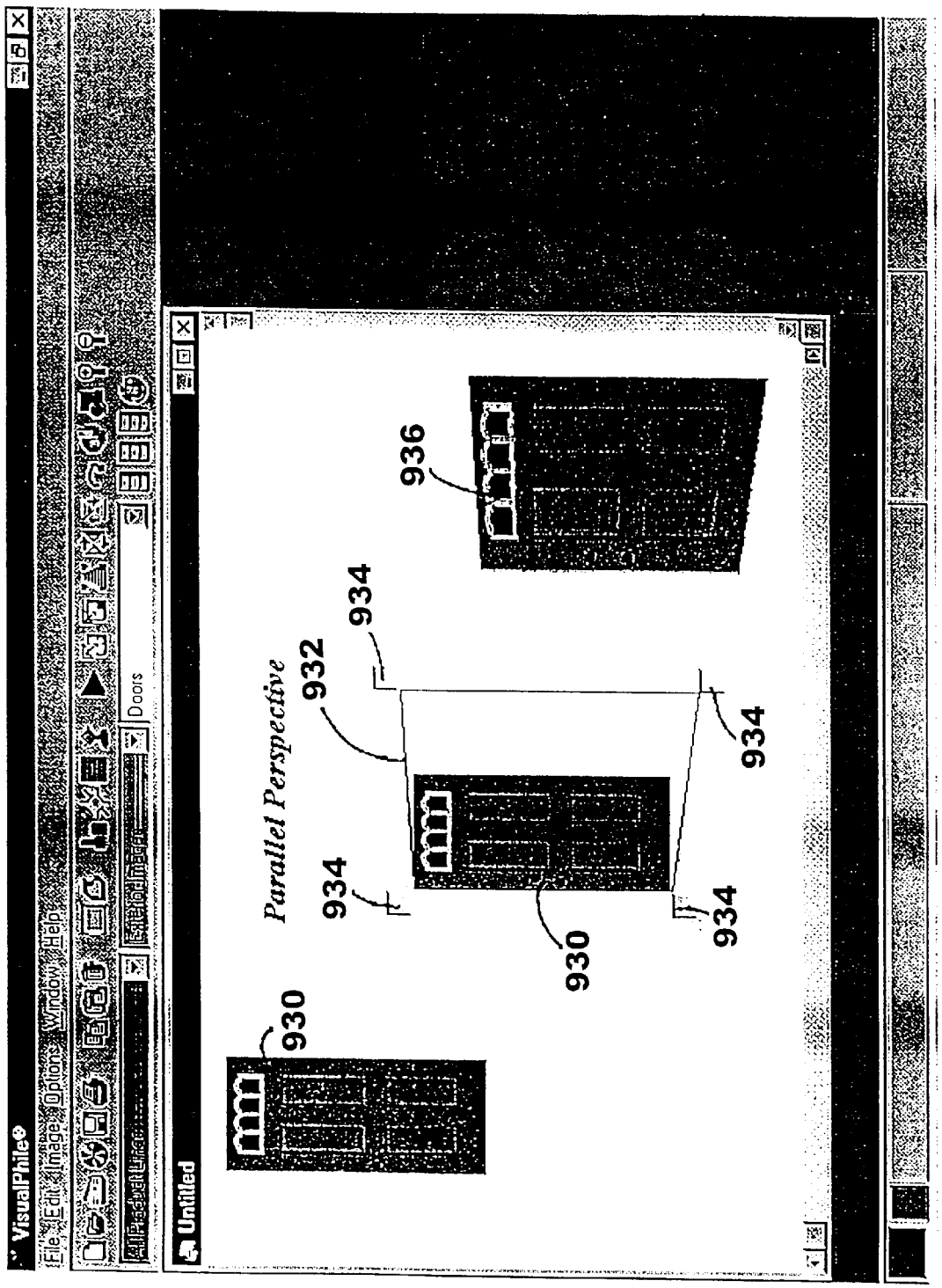

FIG. 40 is a screen display showing the use of a "parallel perspective" feature which shows a door 930, the door 930 placed within a control 932. The boundary of control 932 is established by means of ears 934 placed on the screen at various locations with the mouse control. Door 936 has undergone the parallel prespective change.

Figure 45:
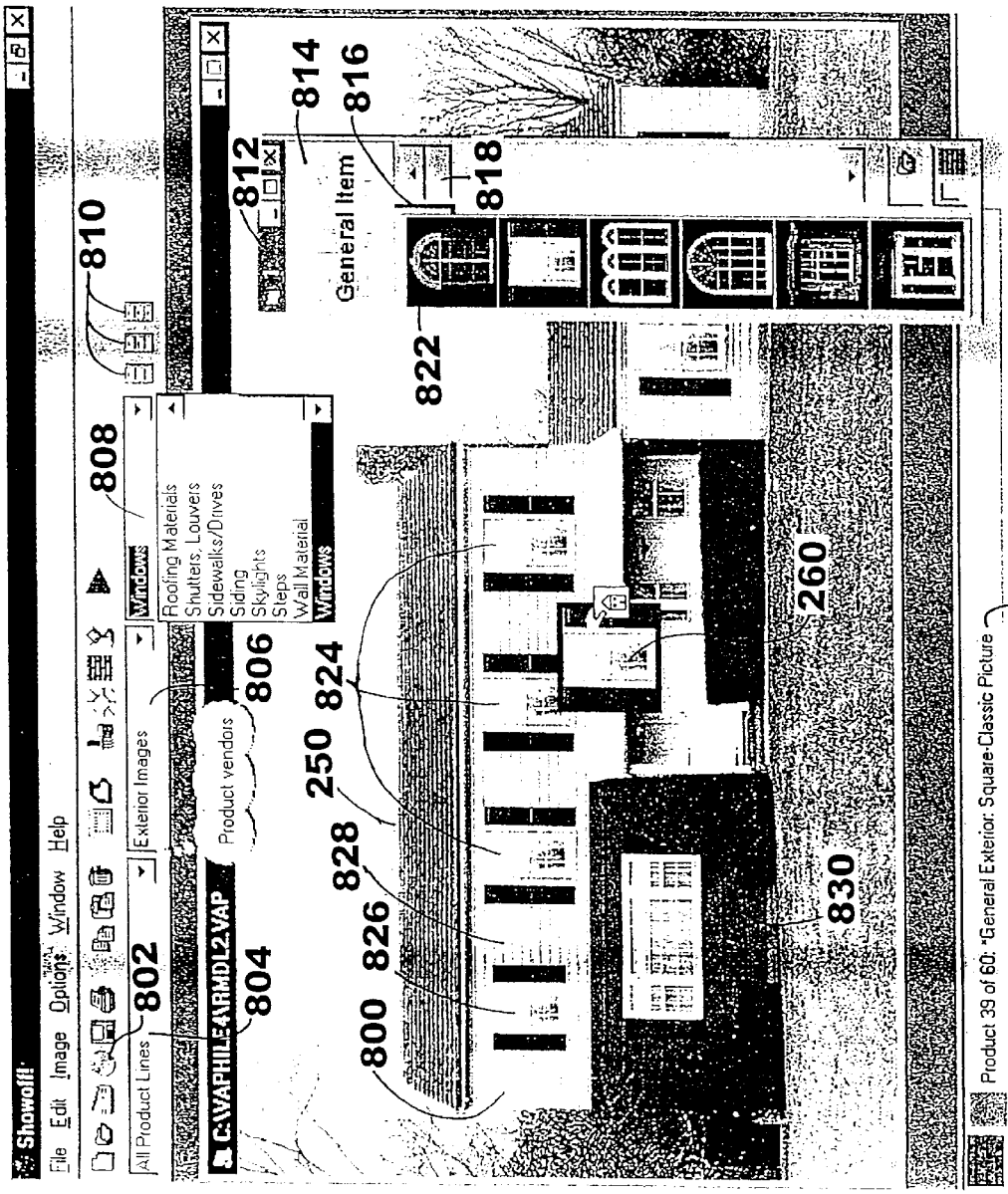
Figure 46:
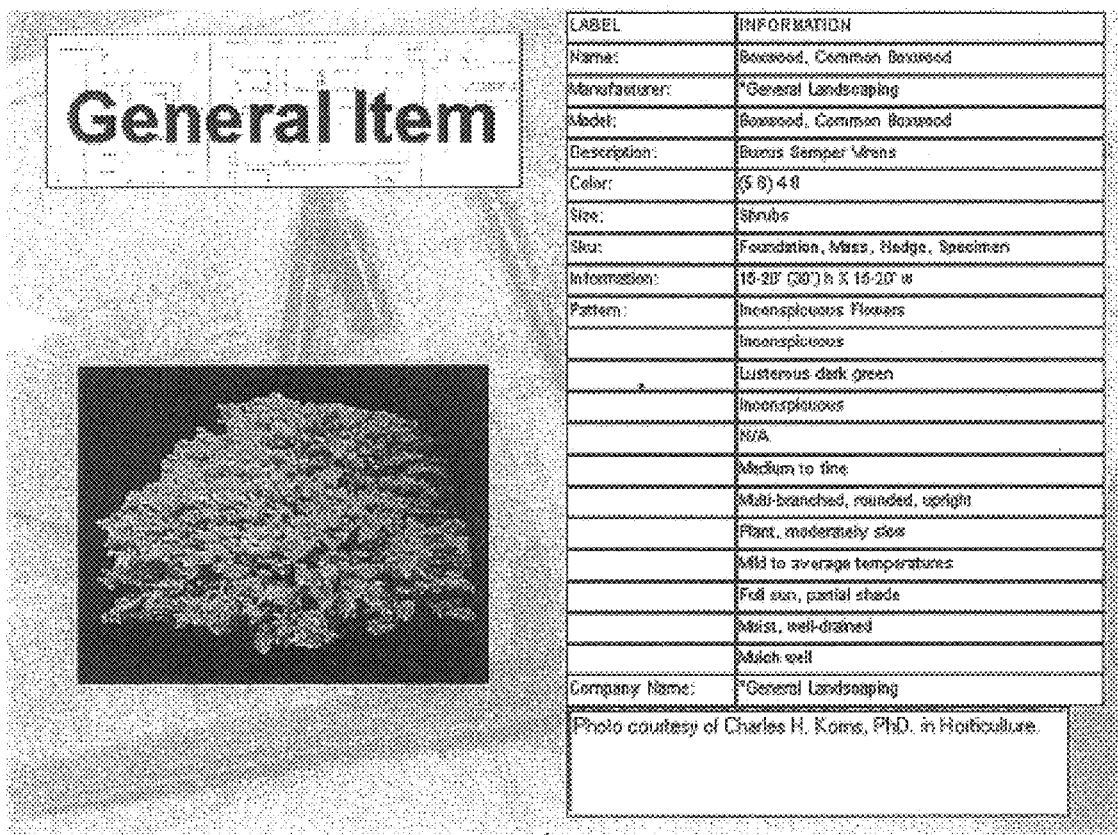
Figure 47:
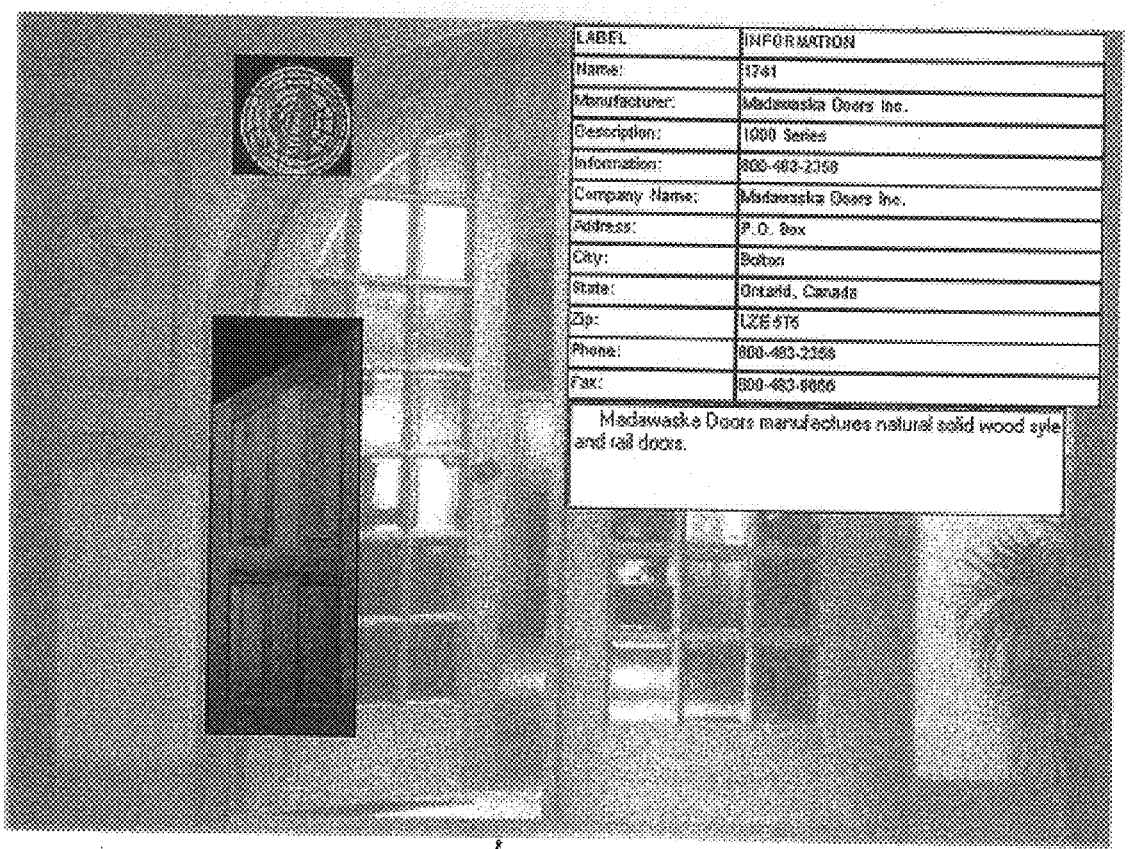
Figure 48:
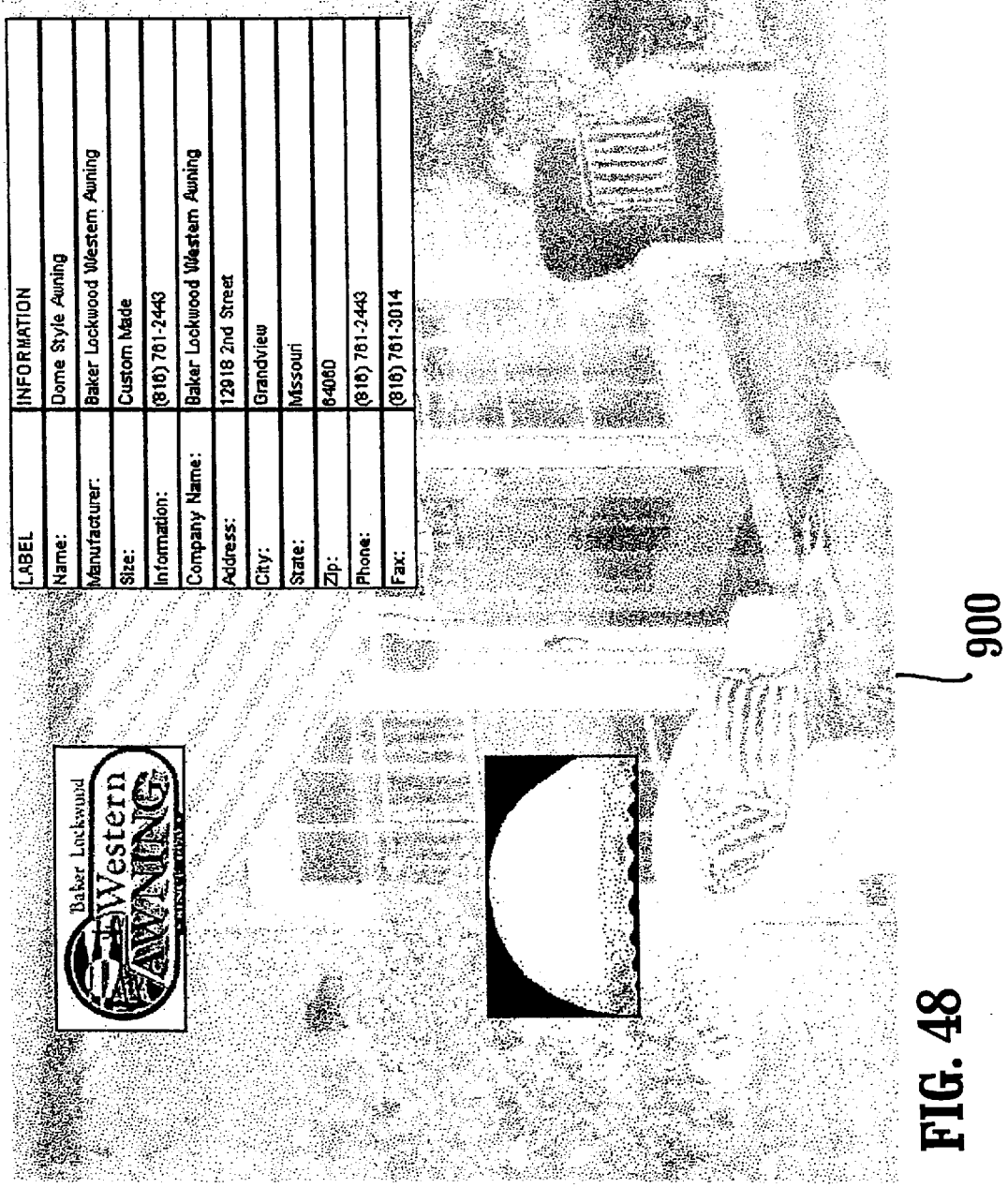

In FIGS. 46–48, examples of screen displays are presented of the product information screens 900 for various products available in the database. The information appearing in screens 900 is obtainable by means of the "link" relationship previously discussed. Screens 900 contain the object information that also appears in in the form of object 260 as shown in FIG. 45.

That which is claimed:

1. A computer system for producing a computer generated display that permits visualization of changes to the interior or exterior of a building in its actual environment, comprising:

(a) a computer generated display, including a background digital image appearing on a screen of the computer system;

(b) means to record and store digital images of objects and object information comprising a plurality of fields of information related to each of the objects, in an object information database to form an object catalog;

(c) object data access means including a display interface; and (d) means for copying and moving a digital image of an object selected from the object catalog, the copying and moving means operable to removably place the digital image of the selected object on the background digital image to permit visualization of the object on the background; and (e) wherein the object data access means is operably connected to the object information database and to the copying and moving means so that after the digital image of the selected object is placed on the background digital image, the object data access means is operable by the system users through the display interface, to retrieve and display on the screen object information from selected ones or all of the plurality of fields of information corresponding to the digital images placed on the background digital image.

2. The system according to claim 1, further including the means to record and store digital images of objects being operable to record and store the images in more than one standard image file format.

3. The system according to claim 1, further including the means to record and store digital images of objects being operable by a system user to create and store an individualized object catalog.

4. The system according to claim 3, further including the means to record and store object information being operable by the system user to record and store information relative to objects in the individualized object catalog in a database thereof.

5. The system according to claim 1, further including the means for copying and moving a digital image of an object having an icon tool bar associated with the display for operably selecting an object image from the object catalog.

6. The system according to claim 5, further including the icon tool bar being operable for defining a specific area in the display.

7. The system according to claim 5, further including the icon tool bar being operable for defining an area of specific size in the display.

8. The system according to claim 5, further including the icon tool bar being operable for defining an area of specific shape in the display.

9. The system according to claim 5, further including the icon tool bar being operable for defining an area identified by the system user by freehand tracing on the display.

10. The system according to claim 6, further including the icon tool bar comprising a plurality of tools operable by commands of the system user, wherein the commands cause an associated action limited to the specific area in the display.

11. The system according to claim 1, further including the means for copying and moving a digital image of an object being operable to resize an object image so that the object image fits into an area in the display specified by the system user.

12. The system according to claim 11, further including the means for copying and moving a digital image of an object being operable to enlarge an object image in the display.

13. The system according to claim 11, further including the means for copying and moving a digital image of an object being operable to reduce the size of an object image in the display.

14. The system according to claim 1, wherein the object data access means is configured such that the object information retrievable from the plurality of fields of information includes product name, product description, source, product vendor, product category, and product sub-category of the object.

15. The system according to claim 1, further including the object data access means being operable to retrieve object information from the plurality of fields of information to generate a bill of materials of the objects of the digital images in the display.

16. The system according to claim 15, further including the object data access means being operable to export the generated bill of materials to estimator software applications.

17. The system according to claim 1, further including means for changing the background digital image.

18. The system according to claim 17, further including the means for changing the background including means for merging any object images superimposed on the background image with the background image to form a composite image in the display.

19. The system according to claim 18, further including means for editing an object image before the object image is merged into the background image.

20. The system according to claim 18, further including the object data access means being operable from the display interface to retrieve object information related to any object images merged into the composite image.

21. The system according to claim 18, further including means for editing the composite image.

22. The system according to claim 17, further including editing means for reversing changes previously made to the background image.

23. The system according to claim 1, further including means for editing the background image.

24. The system as set forth in claim 1, further including image capture means for capturing object images for including in the object catalog comprising the group consisting of a scanner, digital camera and video camera.

25. The system according to claim 1, further including the display interface being configured to operably establish a link between each of the object images displayed on the screen and the object information database.

26. The system according to claim 1, further including the means for copying and moving a digital image of an object being operable to force-fit an object image into a designated area of the background image by resizing the object image to fit into the designated area.

27. The system according to claim 1, further including the means for copying and moving a digital image of an object being operable to select a digital image of an object having a contoured border, wherein the selected object image has a highlighted outline that follows the contoured border of the object image, and to place the object image on the background image.

28. A computer system for producing a computer generated display that permits visualization of objects added to or deleted from the interior or exterior of a building in its actual environment, comprising:

(a) image capture means for receiving and storing a captured image of an actual environment in digital form, the captured image forming a background in a window display of the system;

(b) an object catalog comprising a plurality of fields for storing digital object images of the objects and object information related to the objects;

(c) means to record and store the digital images of the objects in the object catalog;

(d) means to record and store the object information related to the objects in the plurality of fields of the object catalog;

(e) object data access means, including a window interface, for operably retrieving the object information related to any object of the digital images in the object catalog; and (f) means for copying and moving a digital image of an object selected from the catalog for operably removably placing the digital image of the object on the background to permit realistic visualization of the object on the background; and (g) wherein the object data access means is operably connected with the object catalog and the copying and moving means so that after an object image is placed on the background, the object data access means is operable by the system user through the window interface to retrieve object information from selected fields of the plurality of fields of the object catalog related to the object image.

29. A computer system for producing a computer-generated display that permits visualization of changes to an environment, comprising:

(a) a background presented in the form of a digital image in the computer generated display;

(b) an object catalog including a database of images of objects, the database further including a plurality of fields comprising object information related to the objects of the images;

(c) object information access means including a display interface operable for retrieving and displaying the object information relating to any object in the object catalog; and (d) means for copying and moving a digital image of an object, selected from the object catalog, operable to removably place the image of the object on the background; and (e) wherein the object data access means is operably connected with the object catalog and the object copying and moving means so that after an image of an object is placed on the background, the object data access means is operable by a system user by use of the display interface to retrieve and display the object information from selected ones of the plurality of fields related to the object of the image placed on the background.

30. A method for producing a computer-generated display that permits visualization of changes in an environment, comprising:

(a) creating a background digital image on a screen display of the environment;

(b) providing an object catalog in the form of a database of images of objects, the database further including a plurality of fields comprising information related to the objects in the images;

(c) copying and moving an image of an object from the database and placing the image of the object over the background digital image; and (d) accessing the database and displaying information from selected ones of the plurality of fields related to the object of the image placed over the background digital image in the computer generated display by means of a display interface.

* * * * *

UNITED STATES PATENT AND TRADEMARK OFFICE
CERTIFICATE OF CORRECTION

PATENT NO : 5,986,670
DATED : November 16, 1999
INVENTOR(S): Roberta L. Dreis and Ricardo Salas It is certified that error appears in the above-identified patent and that said Letters Patent is hereby corrected as shown below:

In column 6, line 28, after "Appendix" insert --B--.

In column 13, line 55, delete "an".

In column 14, line 57 replace "property, upon" with --property. Upon--

In column 19, line 30, delete "it".

In column 19, line 41, replace "an" with --a--.

In column 22, line 27, replace "a" with --an--.

In column 23, line 8, replace "in" with --is--.

In column 23, line 39, delete "be".

In column 41, line 19, replace "it" with --is--.

In column 42, line 39, replace "uses" with --used--.

UNITED STATES PATENT AND TRADEMARK OFFICE
CERTIFICATE OF CORRECTION

PATENT NO : 5,986,670
DATED : November 16, 1999
INVENTOR(S) : Roberta L. Dreis and Ricardo Salas It is certified that error appears in the above-identified patent and that said Letters Patent is hereby corrected as shown below:

In column 44, line 16, cancel beginning with "19. The system according to claim 18" to and including "editing the background image." in column 44, line 29 and insert therefore the following claims:

--19. The system according to claim 18, further including the object data access means being operable from the display interface to retrieve object information related to any object images merged into the composite image.

20. The system according to claim 17, further including editing menas for reversing changes previously made to the background image.

21. The system according to claim 18, further including means for editing the composite image.

UNITED STATES PATENT AND TRADEMARK OFFICE
CERTIFICATE OF CORRECTION

PATENT NO : 5,986,670
DATED : November 16, 1999
INVENTOR(S) : Roberta L. Dreis and Ricardo Salas It is certified that error appears in the above-identified patent and that said Letters Patent is hereby corrected as shown below:

22. The system according to claim 1, further including means for editing the background image.

23. The system according to claim 18, further including means for editing an object image before the object image is merged into the background image.--

Signed and Sealed this

Twentieth Day of February, 2001

*Attest:*

NICHOLAS P. GODICI

*Attesting Officer*     Acting Director of the United States Patent and Trademark Office